(12) United States Patent
Sakamoto

(10) Patent No.: US 12,522,578 B2
(45) Date of Patent: Jan. 13, 2026

(54) LIGHT EMITTING DEVICE AND AMINE COMPOUND FOR THE SAME

(71) Applicant: Samsung Display Co., Ltd., Yongin-si (KR)

(72) Inventor: Naoya Sakamoto, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 1167 days.

(21) Appl. No.: 17/370,553

(22) Filed: Jul. 8, 2021

(65) Prior Publication Data

US 2022/0131079 A1   Apr. 28, 2022

(30) Foreign Application Priority Data

Oct. 28, 2020   (KR) .................. 10-2020-0141201

(51) Int. Cl.
*C07D 333/76* (2006.01)
*C07D 307/91* (2006.01)
(Continued)

(52) U.S. Cl.
CPC ......... *C07D 333/76* (2013.01); *C07D 307/91* (2013.01); *C09K 11/06* (2013.01);
(Continued)

(58) Field of Classification Search
CPC ............. H01L 51/0061; H01L 51/0072; H01L 51/0073; H01L 51/0067; H01L 51/0054;
(Continued)

(56) References Cited

U.S. PATENT DOCUMENTS 9,278,926 B2   3/2016   Kato
9,947,875 B2   4/2018   Fuchiwaki et al.
(Continued)

FOREIGN PATENT DOCUMENTS

KR   10-2012-0066076   6/2012
KR   10-2018-0063707   6/2018
(Continued)

*Primary Examiner* — Vu A Nguyen
(74) *Attorney, Agent, or Firm* — Lerner David LLP

(57) ABSTRACT

A light emitting device includes a first electrode, a second electrode disposed on the first electrode, and at least one functional layer disposed between the first electrode and the
(Continued)

second electrode. The at least one functional layer may include an amine compound represented by Formula 1. Thus, the light emitting device may exhibit an improved luminous efficiency and a prolonged device service life.

[Formula 1]

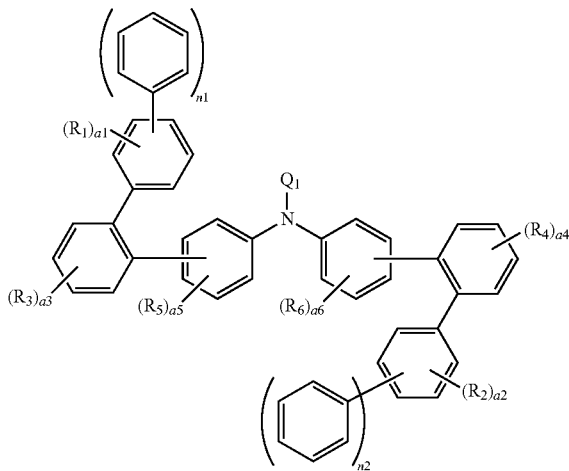

14 Claims, 6 Drawing Sheets

(51) Int. Cl.
C09K 11/06 (2006.01)
H10K 50/11 (2023.01)
H10K 50/15 (2023.01)
H10K 50/17 (2023.01)
H10K 50/18 (2023.01)
H10K 85/60 (2023.01)
H10K 101/10 (2023.01)

(52) U.S. Cl.
CPC .... H10K 85/636 (2023.02); *C09K 2211/1018* (2013.01); *H10K 50/11* (2023.02); *H10K 50/15* (2023.02); *H10K 50/17* (2023.02); *H10K 50/181* (2023.02); *H10K 85/6574* (2023.02); *H10K 85/6576* (2023.02); *H10K 2101/10* (2023.02)

(58) Field of Classification Search
CPC ............. H01L 51/0094; H01L 51/0074; H01L 51/5016; C07D 307/91; C07D 333/76; C09K 11/06
See application file for complete search history.

(56) References Cited

U.S. PATENT DOCUMENTS

| | | | |
|---|---|---|---|
| 2016/0126467 A1* | 5/2016 | Fuchiwaki | H10K 85/636 257/40 |
| 2019/0039996 A1 | 2/2019 | Takada et al. | |
| 2020/0048273 A1 | 2/2020 | Park et al. | |
| 2020/0203619 A1* | 6/2020 | Park | H10K 85/636 |
| 2020/0235297 A1 | 7/2020 | Miyake et al. | |

FOREIGN PATENT DOCUMENTS

| | | | | |
|---|---|---|---|---|
| KR | 20180063707 A | * | 6/2018 | ............. C09K 11/06 |
| KR | 10-2018-0093354 | | 8/2018 | |
| KR | 10-2018-0112962 | | 10/2018 | |
| KR | 10-2019-0014299 | | 2/2019 | |
| KR | 10-1976017 | | 5/2019 | |
| KR | 10-2019-0063368 | | 6/2019 | |
| WO | 2019-0014299 A | * | 2/2019 | |
| WO | 101935710 B1 | * | 4/2019 | |

* cited by examiner

LIGHT EMITTING DEVICE AND AMINE COMPOUND FOR THE SAME

CROSS-REFERENCE TO RELATED APPLICATION(S)

This application claims priority to and benefits of Korean Patent Application No. 10-2020-0141201 under 35 U.S.C. § 119, filed on Oct. 28, 2020 in the Korean Intellectual Property Office, the entire contents of which are incorporated herein by reference.

BACKGROUND

1. Technical Field

The disclosure relates to an amine compound used as a hole transport material and a light emitting device including the same.

2. Description of the Related Art

Active development continues for an organic electroluminescence display as an image display apparatus. The organic electroluminescence display includes a so-called self-luminescent light emitting device in which holes and electrons respectively injected from a first electrode and a second electrode recombine in an emission layer, and so that a luminescent material in the emission layer emits light to achieve display.

In the application of a light emitting device to a display apparatus, there is a demand for a light emitting device having low driving voltage, high luminous efficiency, and a long service life, and continuous development is required on materials for a light emitting device that are capable of stably attaining such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting device exhibiting excellent luminous efficiency and long service life characteristics.

The disclosure also provides an amine compound which is a material for a light emitting device having high efficiency and long service life characteristics.

An embodiment provides a light emitting device that may include a first electrode, a second electrode disposed on the first electrode, and at least one functional layer disposed between the first electrode and the second electrode and including an amine compound represented by Formula 1 below:

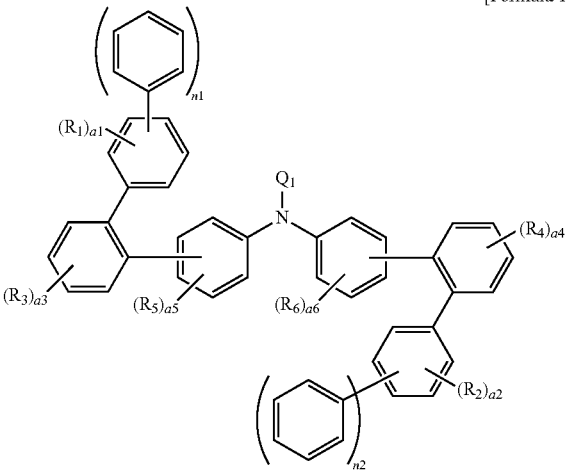

[Formula 1]

In Formula 1 above, n1 and n2 may each independently be 0 or 1, a1 and a2 may each independently be an integer from 0 to 5, a3 to a6 may each independently be an integer from 0 to 4, $R_1$ to $R_6$ may each independently be a hydrogen atom, a deuterium atom, a halogen atom, a substituted or unsubstituted alkyl group having 1 to 15 carbon atoms, or a substituted or unsubstituted heteroaryl group having 2 to 20 ring-forming carbon atoms, and $Q_1$ may be a group represented by Formula 2 below:

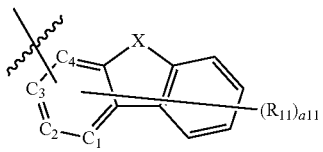

[Formula 2]

In Formula 2 above, $C_1$ to $C_4$ may each represent a position of a carbon atom, X may be O or S, when X is O, N in Formula 1 may be bonded to any one of $C_1$, $C_2$, or $C_4$, a11 may be an integer from 0 to 7, $R_{11}$ may be a hydrogen atom, a deuterium atom, or a substituted or unsubstituted aryl group having 6 to 12 ring-forming carbon atoms, and

represents a binding site to a neighboring atom.

In an embodiment, Formula 1 above may be represented by Formula 1-1 or Formula 1-2 below:

[Formula 1-1]

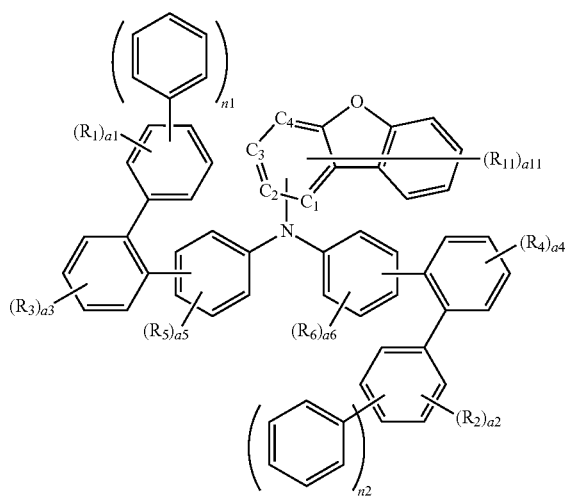

[Formula 1-2]

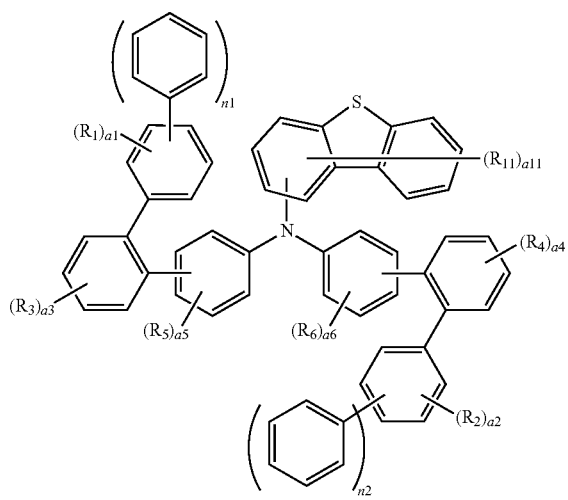

In Formula 1-1 and Formula 1-2 above, a1 to a6, a11, $R_1$ to $R_6$, $R_{11}$, n1, n2, and $C_1$ to $C_4$ may be the same as defined in connection with Formula 1 and Formula 2 above.

In an embodiment, Formula 2 above may be represented by any one among Formula 2-1 to Formula 2-4 below:

[Formula 2-1]

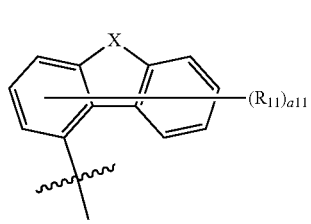

[Formula 2-2]

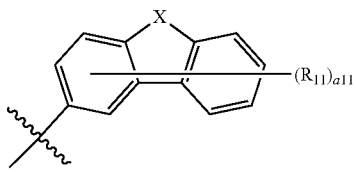

[Formula 2-3]

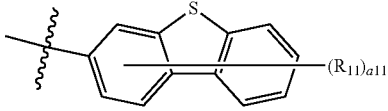

[Formula 2-4]

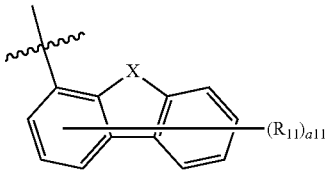

In Formula 2-1 to Formula 2-4 above, a11, $R_{11}$, and X may be the same as defined in connection with Formula 2 above, and represents a binding site to a neighboring atom.

In an embodiment, Formula 1 above may be represented by any one among Formula 1-A to Formula 1-C below:

[Formula 1-A]

[Formula 1-B]

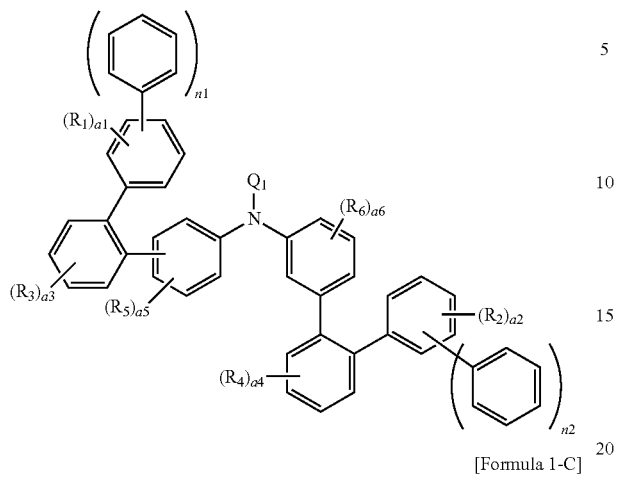

[Formula 1-C]

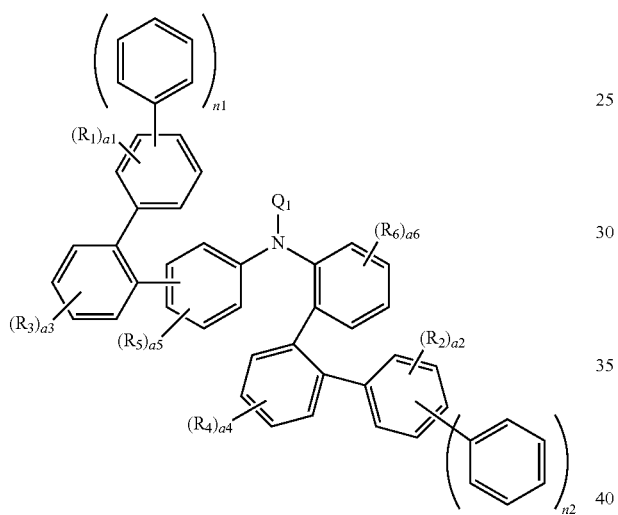

In Formula 1-A to Formula 1-C above, a1 to a6, $R_1$ to $R_6$, n1, n2, and $Q_1$ may be the same as defined in connection with Formula 1 above.

In an embodiment, Formula 1-A above may be represented by any one among Formula 1-A1 to Formula 1-A3 below:

[Formula 1-A1]

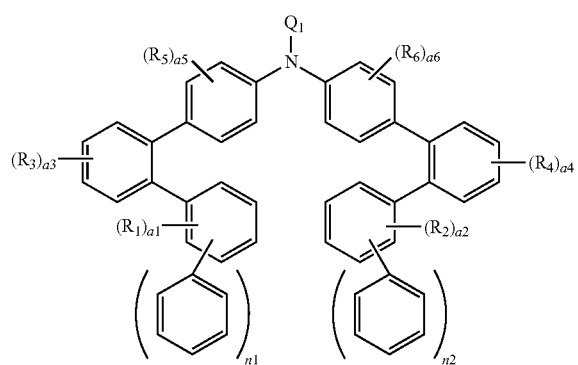

[Formula 1-A2]

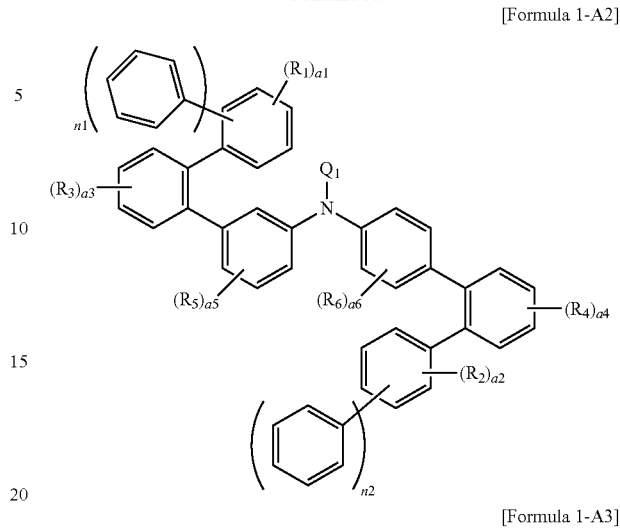

[Formula 1-A3]

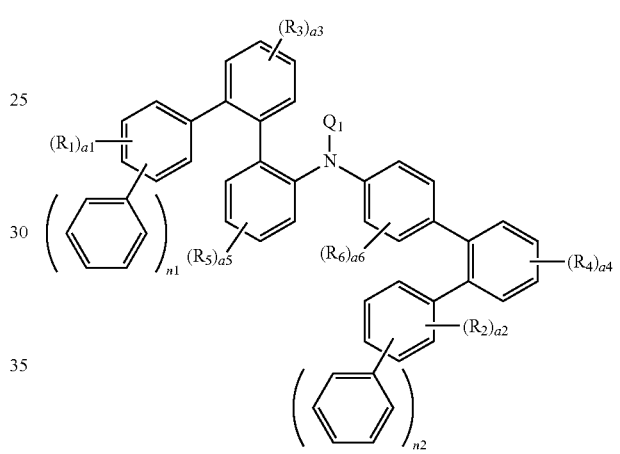

In Formula 1-A1 to Formula 1-A3 above, a1 to a6, $R_1$ to $R_6$, n1, n2, and $Q_1$ may be the same as defined in connection with Formula 1-A above.

In an embodiment, $R_1$ and $R_5$ may each independently be a fluorine atom or a methyl group.

In an embodiment, a11 may be 0 or 1, and $R_{11}$ may be a substituted or unsubstituted phenyl group.

In an embodiment, at least one among $R_1$ to $R_3$ may be a deuterium atom.

In an embodiment, the at least one functional layer may include an emission layer, a hole transport region disposed between the first electrode and the emission layer, and an electron transport region disposed between the emission layer and the second electrode, and the hole transport region may include the amine compound.

In an embodiment, the hole transport region may include a hole injection layer disposed on the first electrode, a hole transport layer disposed on the hole injection layer, and an electron blocking layer disposed on the hole transport layer, and at least one of the injection layer, the hole transport layer, and the electron blocking layer may include the amine compound.

In an embodiment, an amine compound may be represented by Formula 1 above.

BRIEF DESCRIPTION OF THE DRAWINGS

The accompanying drawings are included to provide a further understanding of the embodiments and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
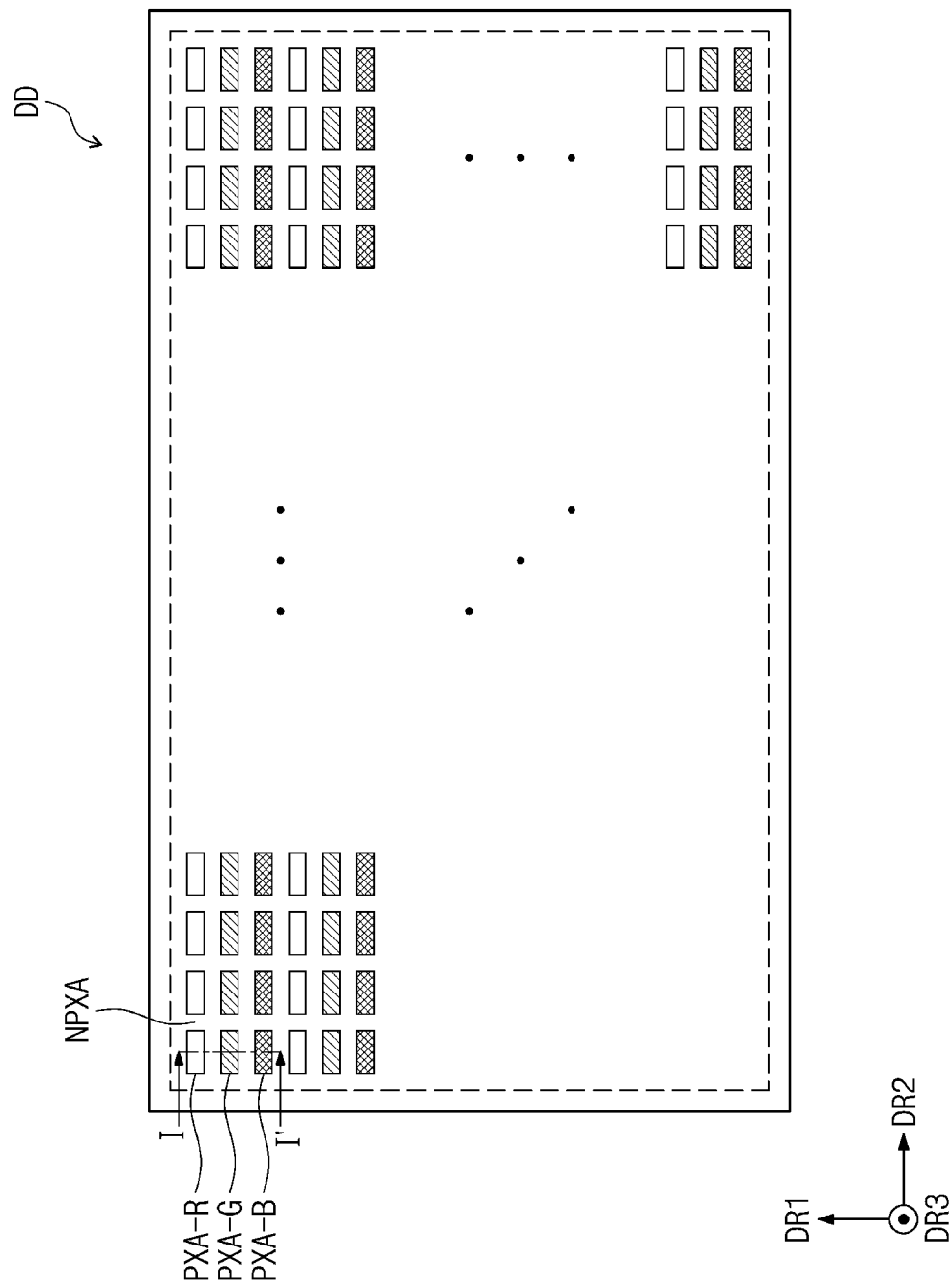
FIG. 1 is a plan view illustrating a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the accompanying drawings.

Figure 2:
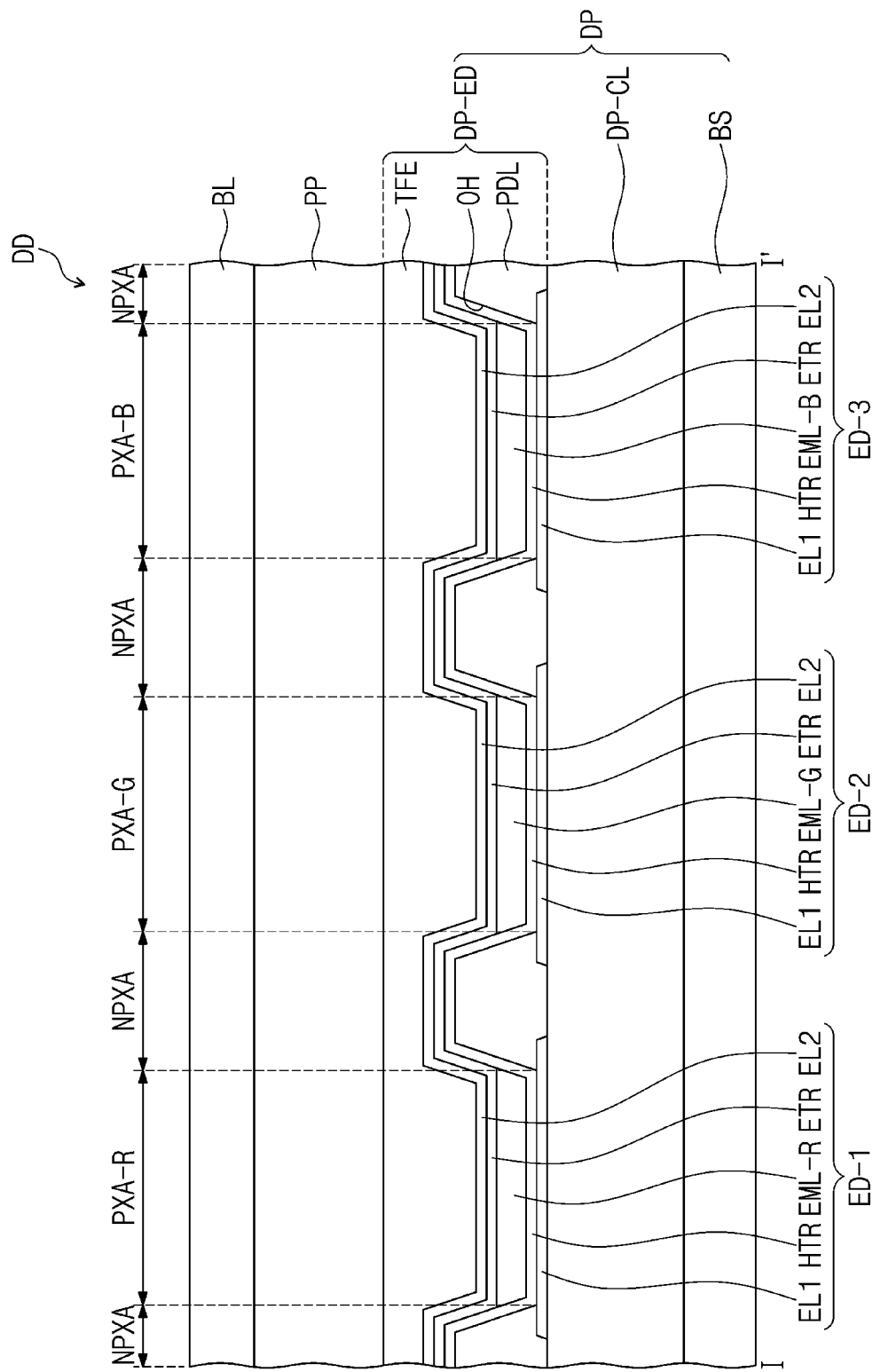
FIG. 2 is a schematic cross-sectional view illustrating a display apparatus according to an embodiment.

FIG. 1 is a plan view illustrating an embodiment of a display apparatus DD. FIG. 2 is a schematic cross-sectional view of the display apparatus DD of the embodiment. FIG. 2 is a schematic cross-sectional view illustrating a part taken along line I-F of FIG. 1.

The display apparatus DD may include a display panel DP and an optical layer PP disposed on the display panel DP. The display panel DP includes light emitting devices ED-1, ED-2, and ED-3. The display apparatus DD may include light emitting devices ED-1, ED-2, and ED-3. The optical layer PP may be disposed on the display panel DP and may control light reflected from an external light at the display panel DP. The optical layer PP may include, for example, a polarization layer or a color filter layer. Although not shown in the drawing, in an embodiment, the optical layer PP may be omitted from the display apparatus DD.

A base substrate BL may be disposed on the optical layer PP. The base substrate BL may provide a base surface on which the optical layer PP is disposed. The base substrate BL may be a glass substrate, a metal substrate, a plastic substrate, etc. However, embodiments are not limited thereto, and the base substrate BL may be an inorganic layer, an organic layer, or a composite material layer. Although not shown in the drawings, in an embodiment, the base substrate BL may be omitted.

The display apparatus DD according to an embodiment may further include a filling layer (not shown). The filling layer (not shown) may be disposed between a display device layer DP-ED and the base substrate BL. The filling layer (not shown) may include an organic material layer. The filling layer (not shown) may include at least one of an acrylic-based resin, a silicone-based resin, and an epoxy-based resin.

The display panel DP may include a base layer BS, a circuit layer DP-CL provided on the base layer BS, and a display device layer DP-ED. The display device layer DP-ED may include a pixel defining film PDL, the light emitting devices ED-1, ED-2, and ED-3 disposed between portions of the pixel defining film PDL, and an encapsulation layer TFE disposed on the light emitting devices ED-1, ED-2, and ED-3.

The base layer BS may provide a base surface on which the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include a switching transistor and a driving transistor in order to drive the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be described later. Each of the light emitting devices ED-1, ED-2, and ED-3 may include a first electrode EL1, a hole transport region HTR, emission layers EML-R, EML-G, and EML-B, an electron transport region ETR, and a second electrode EL2.

FIG. 2 illustrates an embodiment in which the emission layers EML-R, EML-G, and EML-B of the light emitting devices ED-1, ED-2, and ED-3 in the openings OH defined in the pixel defining film PDL, and the hole transport region HTR, the electron transport region ETR, and the second electrode EL2 are provided as a common layer for the light emitting devices ED-1, ED-2, and ED-3. However, embodiments are not limited thereto, and although not illustrated in FIG. 2, the hole transport region HTR and the electron transport region ETR in an embodiment may be provided by being patterned inside the openings OH defined in the pixel defining film PDL. For example, the hole transport region HTR, the emission layers EML-R, EML-G, and EML-B, and the electron transport region ETR in an embodiment may be provided by being patterned in an inkjet printing method.

The encapsulation layer TFE may cover the light emitting devices ED-1, ED-2, and ED-3. The encapsulation layer TFE may seal the display device layer DP-ED. The encapsulation layer TFE may be a thin film encapsulation layer. The encapsulation layer TFE may be formed by laminating one layer or multiple layers. The encapsulation layer TFE may include at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film may protect the display device layer DP-ED from moisture and/or oxygen and the encapsulation-organic film may protect the display device layer DP-ED from foreign substances such as dust particles. The encapsulation-inorganic film may include silicon nitride, silicon oxynitride, silicon oxide, titanium oxide, aluminum oxide, or the like, but the embodiments are not limited thereto. The encapsulation-organic film may include an acrylic-based compound, an epoxy-based compound, or the like. The encapsulation-organic film may include a photopolymerizable organic material, but embodiments are not limited thereto.

The encapsulation layer TFE may be disposed on the second electrode EL2. In an embodiment, the encapsulation layer TFE may be disposed to fill the openings OH.

Referring to FIGS. 1 and 2, the display apparatus DD may include a non-light emitting region NPXA and light emitting regions PXA-R, PXA-G, and PXA-B. The light emitting regions PXA-R, PXA-G, and PXA-B may each be a region which emits light generated from the light emitting devices ED-1, ED-2, and ED-3, respectively. The light emitting regions PXA-R, PXA-G, and PXA-B may be spaced apart from each other in a plane.

Each of the light emitting regions PXA-R, PXA-G, and PXA-B may be a region divided by pixel defining film PDL. The non-light emitting regions NPXA may be regions between the adjacent light emitting regions PXA-R, PXA-G, and PXA-B, which correspond to portions of the pixel defining film PDL. In the specification, each of the light emitting regions PXA-R, PXA-G, and PXA-B may correspond to a pixel. The pixel defining film PDL may separate the light emitting devices ED-1, ED-2, and ED-3. The emission layers EML-R, EML-G, and EML-B of the light emitting devices ED-1, ED-2 and ED-3 may be disposed in openings OH defined by the pixel defining film PDL and separated from each other.

The light emitting regions PXA-R, PXA-G, and PXA-B may be divided into groups according to the color of light generated from the light emitting devices ED-1, ED-2, and ED-3. In the display apparatus DD of an embodiment shown in FIGS. 1 and 2, three light emitting regions PXA-R, PXA-G, and PXA-B which emit red light, green light, and blue light, respectively are illustrated. For example, the display apparatus DD of an embodiment may include the red light emitting region PXA-R, the green light emitting region PXA-G, and the blue light emitting region PXA-B which are different.

In the display apparatus DD according to an embodiment, the light emitting devices ED-1, ED-2, and ED-3 may each emit light in different wavelength regions. For example, in an embodiment, the display apparatus DD may include the first light emitting device ED-1 that emits red light, the second light emitting device ED-2 that emits green light, and the third light emitting device ED-3 that emits blue light. For example. the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, embodiments are not limited thereto, and the first to the third light emitting devices ED-1, ED-2, and ED-3 may emit light in a same wavelength range or at least one light emitting device may emit light in a wavelength range different from the others. For example, the first to third light emitting devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the red light emitting regions PXA-R, the green light emitting regions PXA-G, and the blue light emitting regions PXA-B may be arranged along a second directional axis DR2. The red light emitting region PXA-R, the green light emitting region PXA-G, and the blue light emitting region PXA-B may be alternately arranged in this order along a first directional axis DR1.

FIGS. 1 and 2 illustrate that all the light emitting regions PXA-R, PXA-G, and PXA-B have similar area, but embodiments are not limited thereto, and the light emitting regions PXA-R, PXA-G, and PXA-B may have different areas from each other according to a wavelength range of the emitted light. The areas of the light emitting regions PXA-R, PXA-G, and PXA-B may be areas in a plan view that are defined by the first directional axis DR1 and the second directional axis DR2.

The arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to characteristics of a display quality required in the display apparatus DD. For example, the arrangement form of the light emitting regions PXA-R, PXA-G, and PXA-B may be a PenTile® arrangement form or a diamond arrangement form.

The areas of the light emitting regions PXA-R, PXA-G, and PXA-B may be different from each other. For example, in an embodiment, the area of the green light emitting region PXA-G may be smaller than that of the blue light emitting region PXA-B, but embodiments are not limited thereto.

Hereinafter, FIGS. 3 to 6 are schematic cross-sectional views each illustrating light emitting devices according to embodiments. Each of the light emitting devices ED according to embodiments may include a first electrode EL1, a hole transport region HTR, an emission layer EML, an electron transport region ETR, and a second electrode EL2 that are sequentially stacked.

Figure 3:
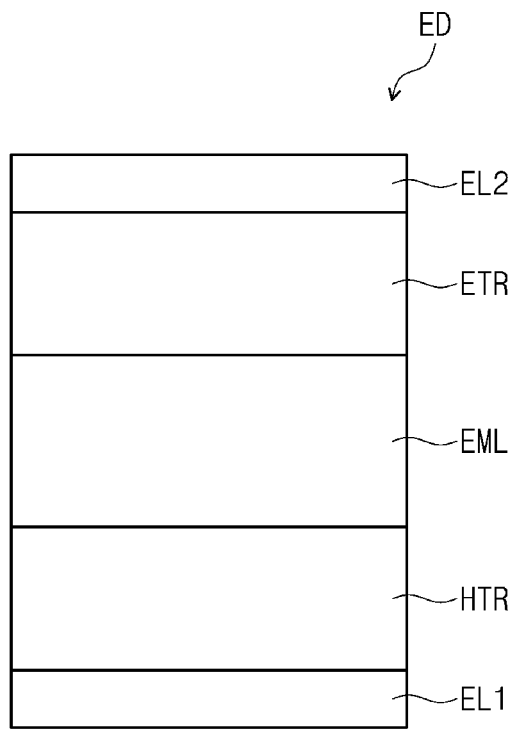
FIG. 3 is a schematic cross-sectional view illustrating a light emitting device to an embodiment.
Figure 4:
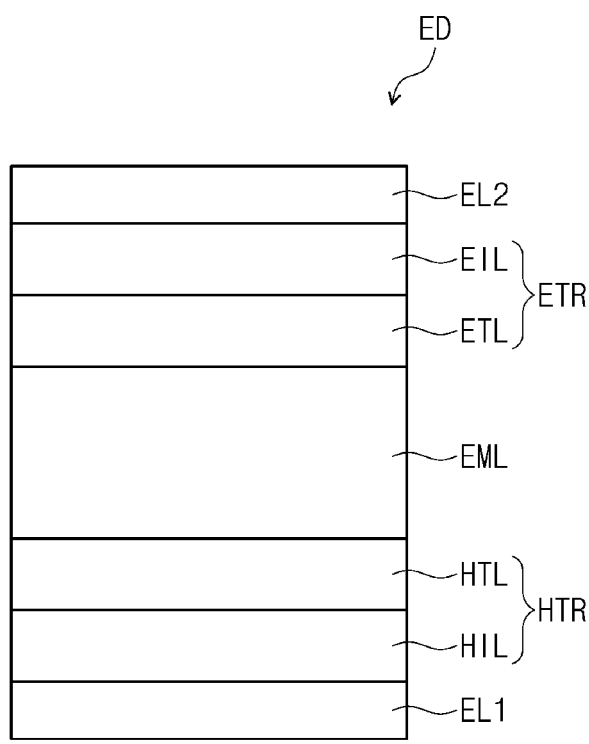
FIG. 4 is a schematic cross-sectional view illustrating a light emitting device to an embodiment.
Figure 5:
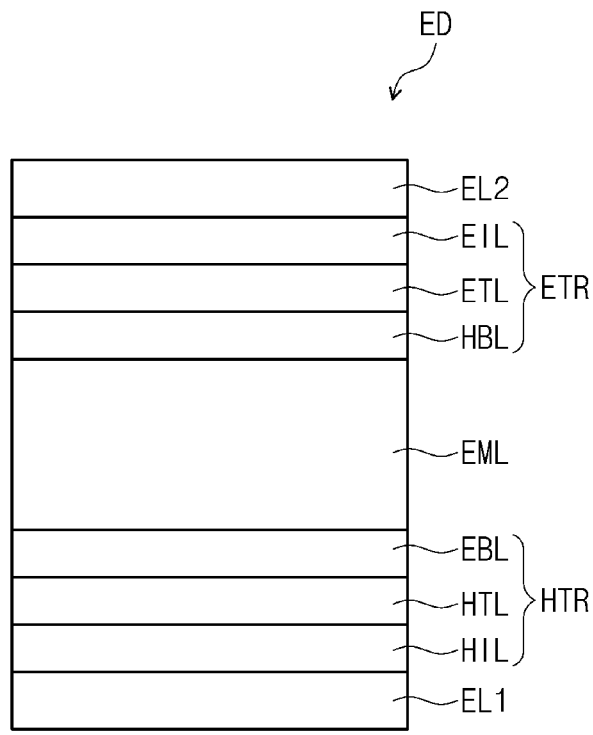
FIG. 5 is a schematic cross-sectional view illustrating a light emitting device to an embodiment.
Figure 6:
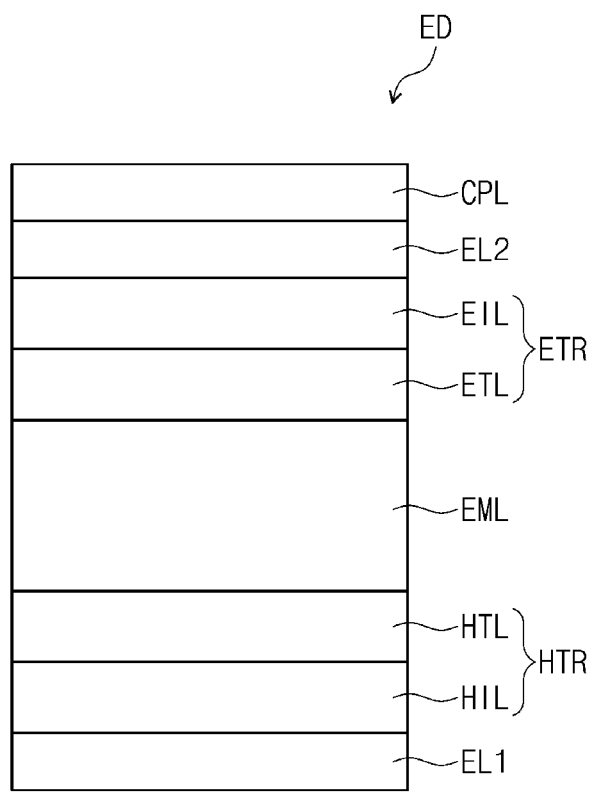
FIG. 6 is a schematic cross-sectional view illustrating a light emitting device to an embodiment.

In comparison to FIG. 3, FIG. 4 illustrates a schematic cross-sectional view of a light emitting device ED of an embodiment, in which a hole transport region HTR includes a hole injection layer HIL and a hole transport layer HTL, and an electron transport region ETR includes an electron injection layer EIL and an electron transport layer ETL. In comparison to FIG. 3, FIG. 5 illustrates a schematic cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 illustrates a schematic cross-sectional view of a light emitting device ED of an embodiment including a capping layer CPL disposed on a second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. In an embodiment, the first electrode EL1 may be a pixel electrode. The first electrode EL1 may be a transmissive electrode, a transflective electrode, or a reflective electrode. If the first electrode EL1 is a transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In another embodiment, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments are not limited thereto. In an embodiment, the first electrode EL1 may include the above-described metal materials, combinations of at least two metal materials of the above-described metal materials, oxides of the above-described metal materials, or the like. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR in the light emitting device ED of an embodiment may include an amine compound of an embodiment.

In the specification, the term "substituted or unsubstituted" may mean substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents above may be substituted or unsubstituted. For example, a biphenyl group may be interpreted as an aryl group or a phenyl group substituted with a phenyl group.

In the specification, examples of the halogen atom may include a fluorine atom, a chlorine atom, a bromine atom, and an iodine atom.

In the specification, the alkyl group may be a linear, a branched, or a cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments are not limited thereto.

In the specification, the aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments are not limited thereto.

In the specification, the heteroaryl group may include at least one of B, O, N, P, Si, and S as a heteroatom. When the heteroaryl group contains two or more hetero atoms, the two or more hetero atoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments are not limited thereto.

In the specification, a direct linkage may be a single bond.

In the specification,

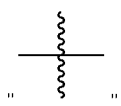

and "—*" each represent a binding site to a neighboring atom.

The hole transport region HTR in the light emitting device ED of an embodiment may include an amine compound represented by Formula 1 below:

[Formula 1]

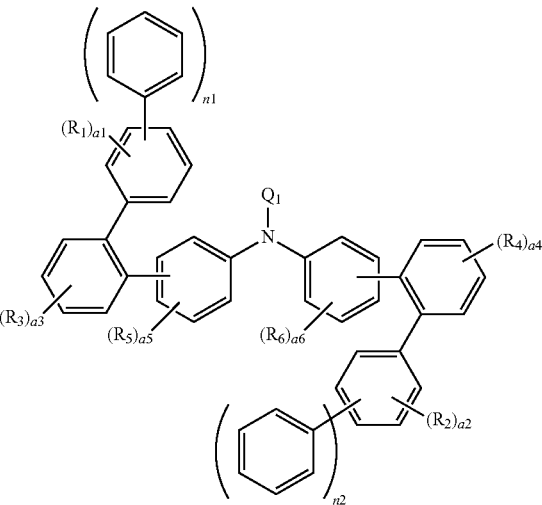

In Formula 1, n1 and n2 may each independently be 0 or 1. For example, when n1 is 1, the benzene ring including $R_1$ may include a phenyl group as a substituent. When n2 is 1, the benzene ring including $R_2$ may include a phenyl group as a substituent.

In Formula 1, a1 and a2 may each independently be an integer from 0 to 5. In Formula 1, a3 to a6 may each independently be an integer from 0 to 4. When a1 is an integer of 2 or more, multiple $R_1$ groups may all be the same, or at least one of the $R_1$ groups may be different from the others. When a2 is an integer of 2 or more, multiple $R_2$ groups may be the same, or at least one of the $R_2$ groups may be different. When a3 is an integer of 2 or more, multiple $R_3$ groups may all be the same, or at least one of the $R_3$ groups may be different from the others. When a4 is an integer of 2 or more, multiple $R_4$ may all be the same, or at least one of the $R_4$ groups may be different from the others. When a5 is an integer of 2 or more, multiple $R_5$ groups may all be the same, or at least one of the $R_5$ groups may be different from the others. When a6 is an integer of 2 or more, multiple $R_6$ groups may all be the same, or at least one of the $R_6$ groups may be different from the others.

In Formula 1, $R_1$ to $R_6$ may each independently be a hydrogen atom, a deuterium atom, a halogen atom, a substituted or unsubstituted alkyl group having 1 to 15 carbon atoms, a substituted or unsubstituted group having 2 to 20 ring-forming carbon atoms. In an embodiment, $R_1$ and $R_5$ may each independently be a fluorine atom or a methyl group. For example, a1 may be 0 or 1. In an embodiment, when a1 is 1, $R_1$ may be a methyl group. For example, a5 may be 0 or 1. In an embodiment, when a5 is 1, $R_5$ may be a methyl group or a fluorine atom.

According to an embodiment, at least one of $R_1$ to $R_3$ may be a deuterium atom. In an embodiment, when a1 is 5, multiple $R_1$ groups may be deuterium atoms. In an embodiment, when a1 and a2 are each 5, multiple $R_1$ groups and multiple $R_2$ groups may be deuterium atoms. In an embodiment, when a1 and a3 are each 5, multiple $R_1$ groups and multiple $R_3$ groups may be deuterium atoms.

In Formula 1, $Q_1$ may be a group represented by Formula 2 below. In Formula 2, $C_1$ to $C_4$ each represent a position of a carbon atom and may be bonded to N in Formula 1.

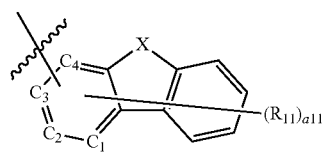

[Formula 2]

In Formula 2, X may be O or S. In Formula 2, when X is O, N in Formula 1 may not be bonded to $C_3$. In Formula 2, when X is O, N in Formula 1 may be bonded to any one of $C_1$, $C_2$, or $C_4$.

In an embodiment, $Q_1$ may be a substituted or unsubstituted dibenzofuran group, or a substituted or unsubstituted dibenzothiophene group. When $Q_1$ is a substituted or unsubstituted dibenzofuran group, N in Formula 1 may not be bonded to $C_3$ that is 3-position carbon of the ring-forming atoms of the substituted or unsubstituted dibenzofuran group.

In Formula 2, a11 may be an integer from 0 to 7. When a11 is an integer of 2 or more, multiple $R_1$ groups may all be the same, or at least one of the $R_1$ groups may be different from the others. In Formula 2, $R_{11}$ may be a hydrogen atom, a deuterium atom, or a substituted or unsubstituted aryl group having 6 to 12 ring-forming carbon atoms. For example, a11 may be 0 or 1. In an embodiment, when a11 is 1, $R_{11}$ may be a substituted or unsubstituted phenyl group. For example, $R_{11}$ may be an unsubstituted phenyl group. For example, RH may be a phenyl group substituted with a phenyl group.

For example, when a11 is 1, $R_{11}$ in Formula 2 and N in Formula 1 may each independently be bonded to the $C_4$ position or the $C_1$ position in Formula 2. However, these are only examples, and embodiments are not limited thereto.

According to an embodiment, Formula 2 may be represented by any one among Formula 2-1 to Formula 2-4 below. Formula 2-1 represents the case where the carbon that is bonded to N in Formula 1 is $C_1$. Formula 2-2 represents the case where the carbon that is bonded to N in Formula 1 is $C_2$. Formula 2-3 represents the case where X is S and the carbon that is bonded to N in Formula 1 is $C_3$. Formula 2-4 represents the case where the carbon that is bonded to N in Formula 1 is $C_4$.

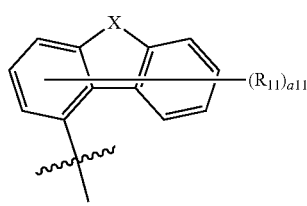

[Formula 2-1]

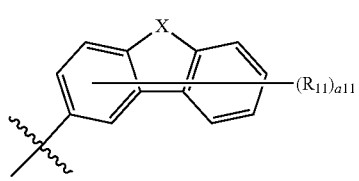

[Formula 2-2]

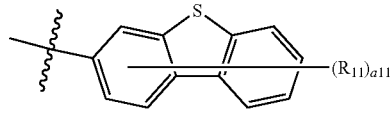

[Formula 2-3]

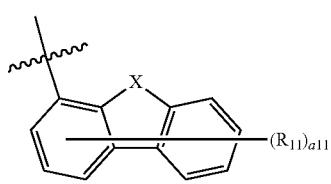

[Formula 2-4]

Formula 2-1, Formula 2-2, and Formula 2-4 may each independently be a substituted or unsubstituted dibenzofuran group, or a substituted or unsubstituted dibenzothiophene group. In Formula 2-1 to Formula 2-4, a11, $R_{11}$, and X may be the same as defined in connection with Formula 2.

In an embodiment, Formula 1 may be represented by Formula 1-1 or Formula 1-2 below. Formula 1-1 represents the case where $Q_1$ is represented by Formula 2 and X in Formula 2 is O. Formula 1-2 represents the case where $Q_1$ is represented by Formula 2 and X in Formula 2 is S. Formula 1-1 represents the case where $Q_1$ is a substituted or unsubstituted dibenzofuran group, and Formula 1-2 represents the case where $Q_1$ is a substituted or unsubstituted dibenzothiophene group.

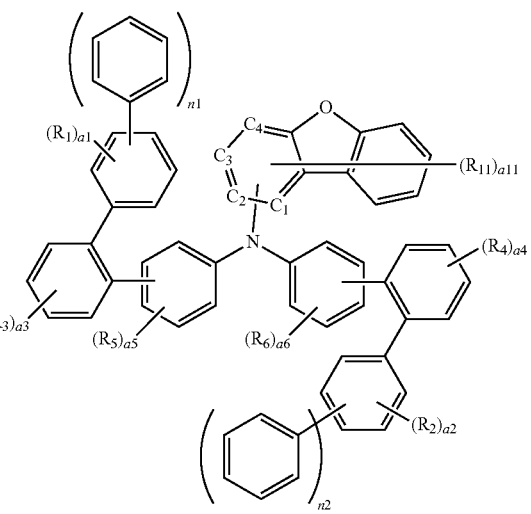

[Formula 1-1]

[Formula 1-2]

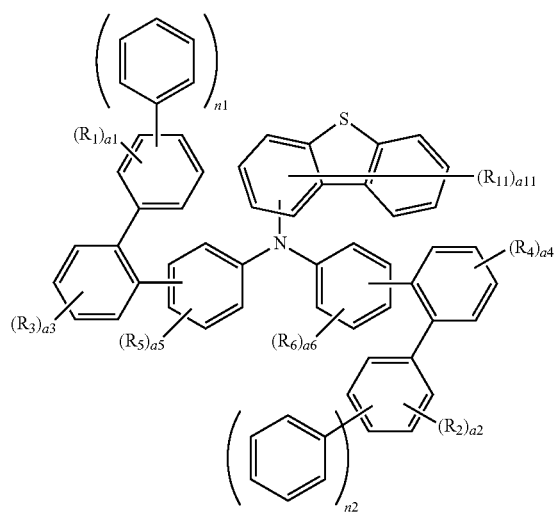

In Formula 1-1 and Formula 1-2, a1 to a6, a11, $R_1$ to $R_6$, $R_{11}$, n1, n2, and $C_1$ to $C_4$ may be the same as defined in connection with Formula 1 and Formula 2.

According to an embodiment, Formula 1 may be represented by any one among Formula 1-A to Formula 1-C below. Formula 1-A represents the case where the benzene ring including $R_4$ is bonded to the benzene ring including $R_6$ at a para-position to the N. Formula 1-B represents the case where the benzene ring including $R_4$ is bonded to the benzene ring including $R_6$ at a meta-position to the N. Formula 1-C represents the case where the benzene ring including $R_4$ is bonded to the benzene ring including $R_6$ at an ortho-position to the N.

[Formula 1-A]

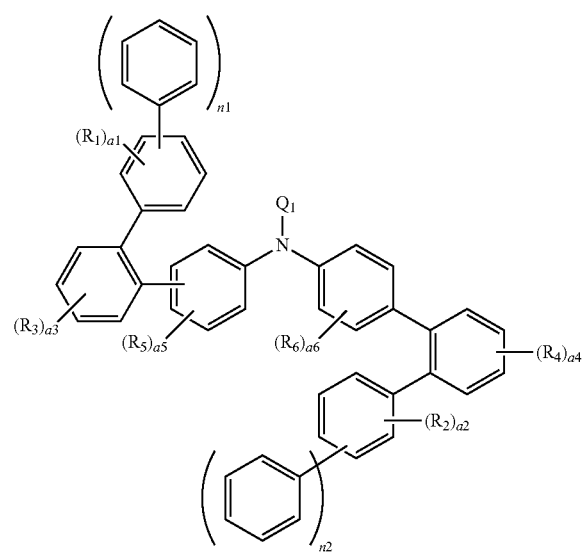

[Formula 1-B]

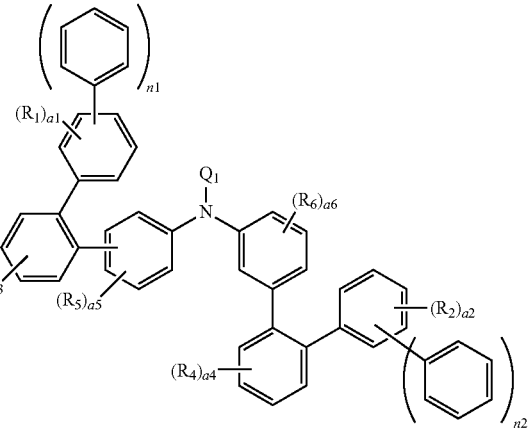

[Formula 1-C]

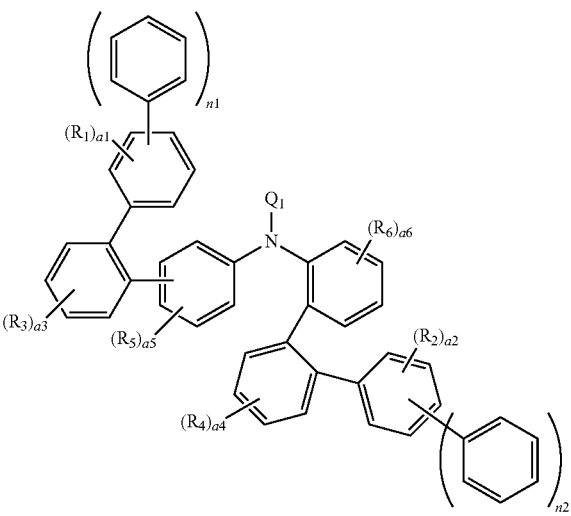

In Formula 1-A to Formula 1-C, a1 to a6, $R_1$ to $R_6$, n1, n2, and $Q_1$ may be the same as defined in connection with Formula 1. For example, in Formula 1-B, the benzene ring including $R_3$ may be bonded to the benzene ring including $R_5$ at a meta-position to the N. In Formula 1-C, the benzene ring including $R_3$ may be bonded to the benzene ring including $R_5$ at an ortho-position to the N. In Formula 1-B and Formula 1-C, n1 and n2 may each be 0.

According to an embodiment, Formula 1-A may be represented by any one among Formula 1-A1 to Formula 1-A3 below. Formula 1-A1 represents the case where the benzene ring including $R_3$ is bonded to the benzene ring including $R_5$ at a para-position to the N in Formula 1-A. Formula 1-A2 represents the case where the benzene ring including $R_3$ is bonded to the benzene ring including $R_5$ at a meta-position to the N in Formula 1-A. Formula 1-A3 represents the case where the benzene ring including $R_3$ is bonded to the benzene ring including $R_5$ at an ortho-position to the N in Formula 1-A.

[Formula 1-A1]

[Formula 1-A2]

[Formula 1-A3]

In Formula 1-A1 to Formula 1-A3, a1 to a6, $R_1$ to $R_6$, n1, n2, and $Q_1$ may be the same as defined in connection with Formula 1-A.

The amine compound represented by Formula 1 of an embodiment may be selected from any one among the compounds of Compound Group 1 below. The hole transport region HTR of the light emitting device ED of an embodiment may include at least one among the amine compounds disclosed in Compound Group 1 below:

[Compound Group 1]

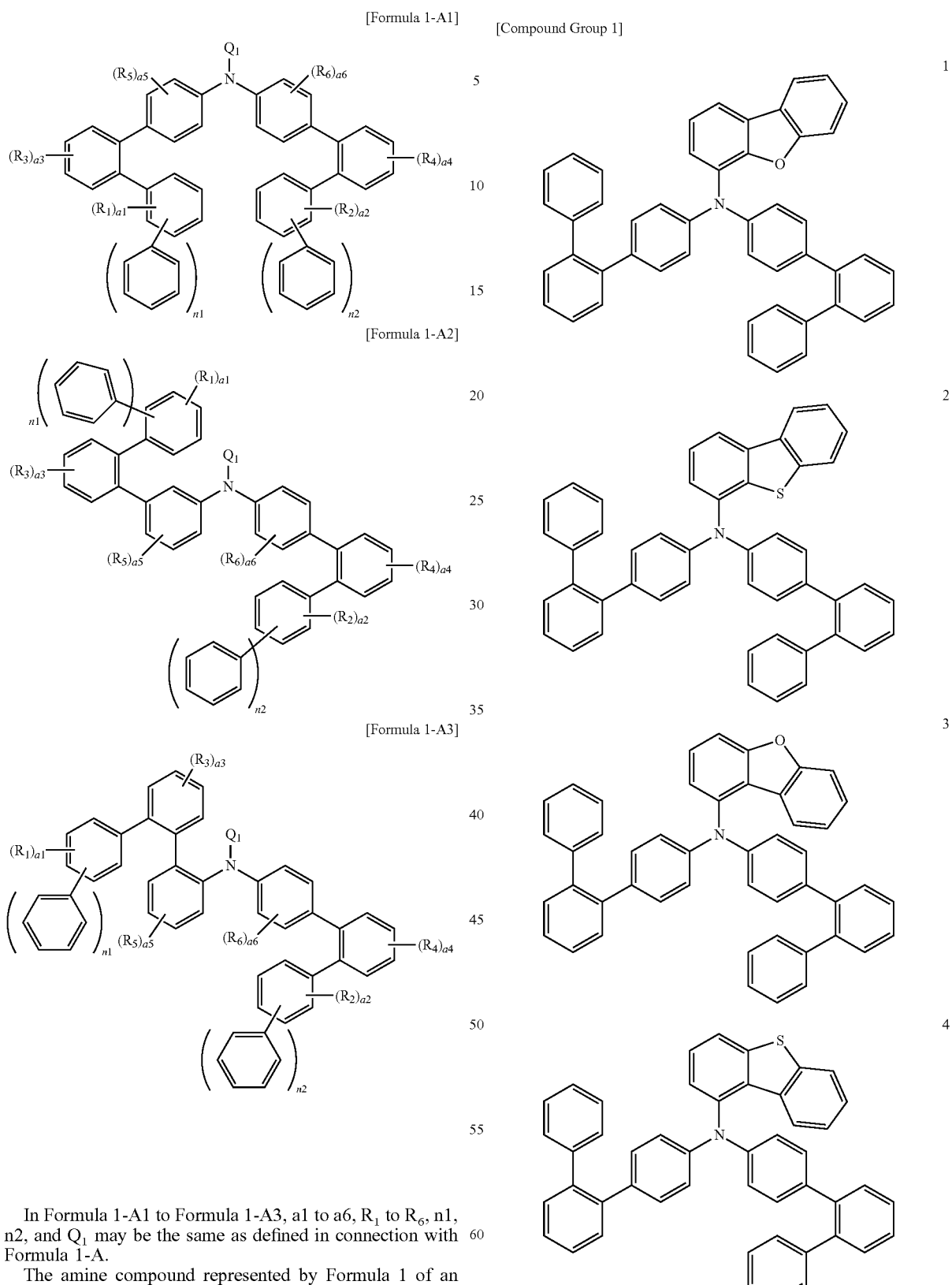

5
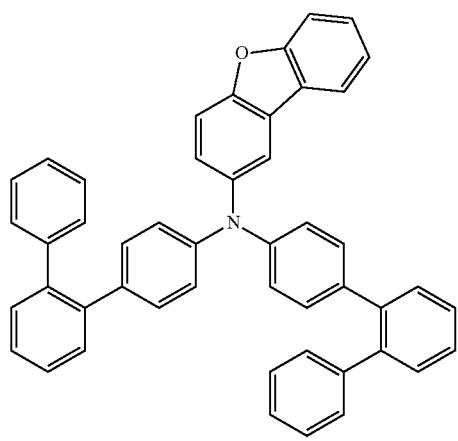
6
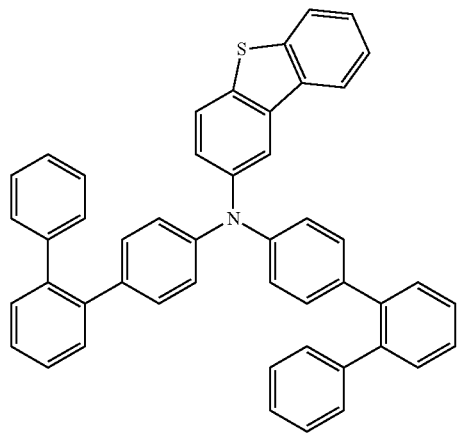
7
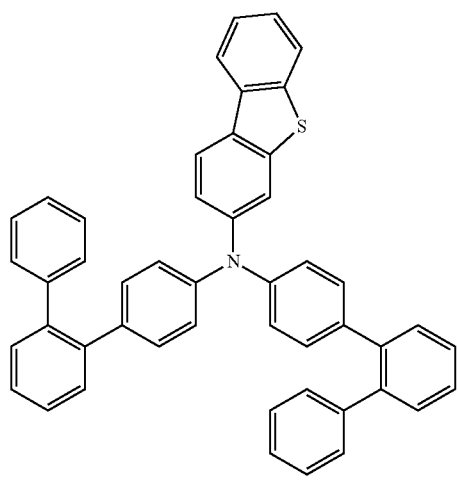
8
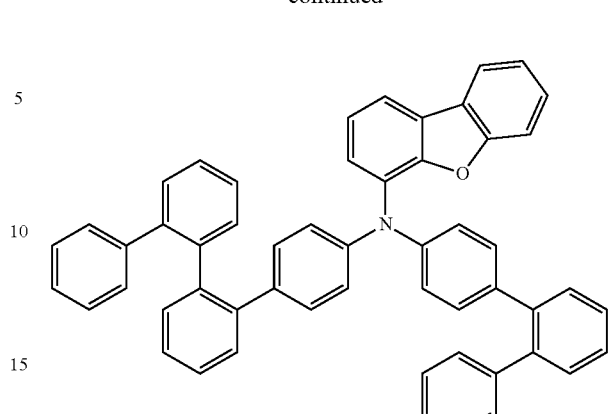
9
10
11

12
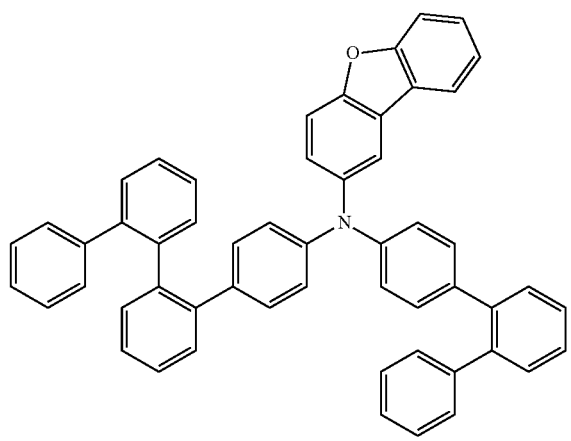
13
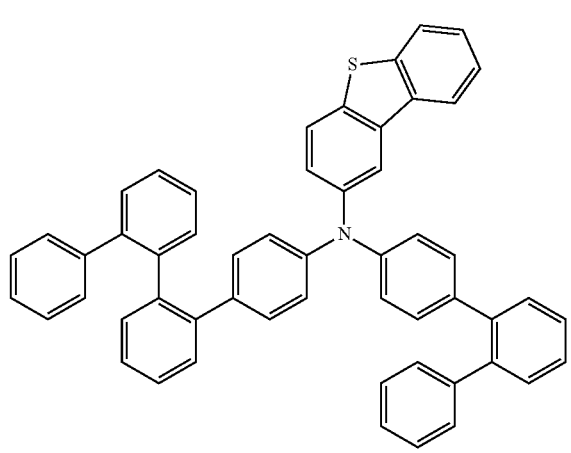
14
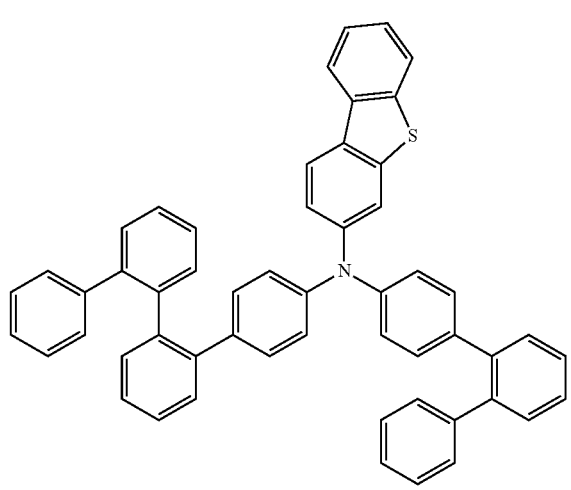
15
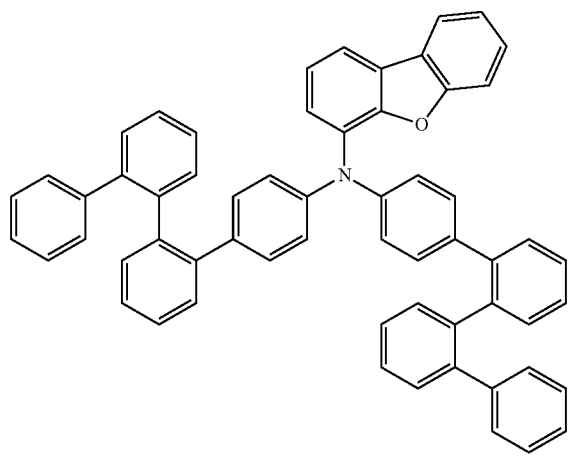
16
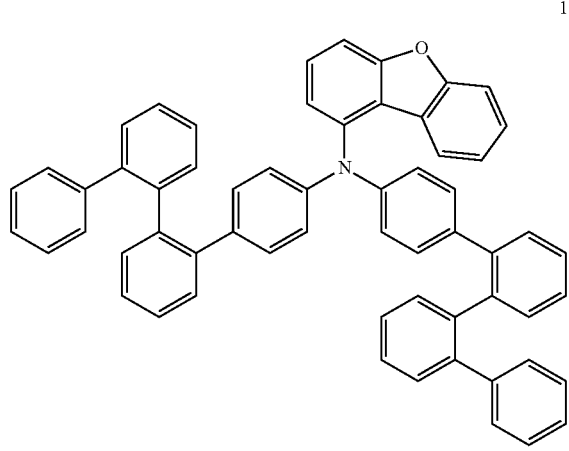
17

18
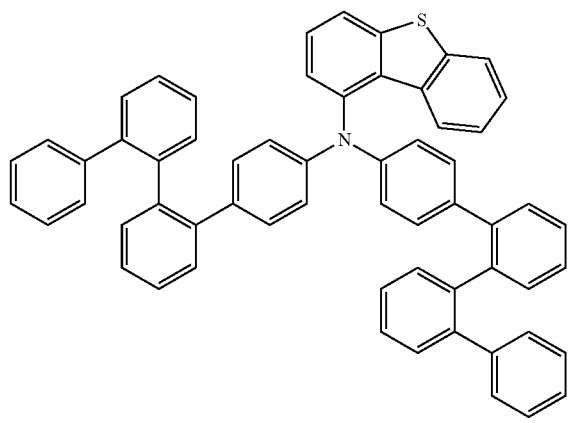
19
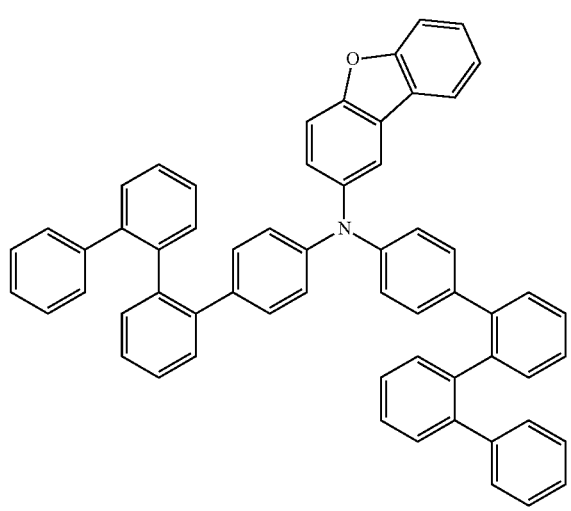
20
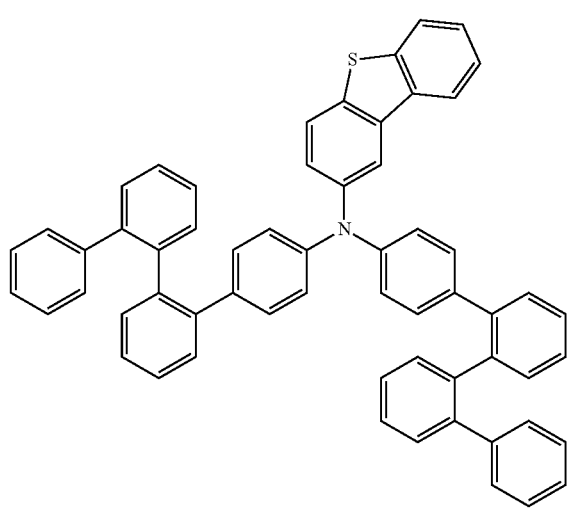
21
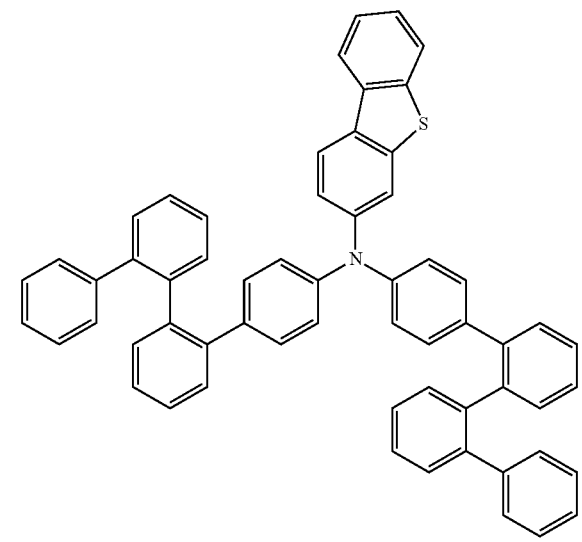
22
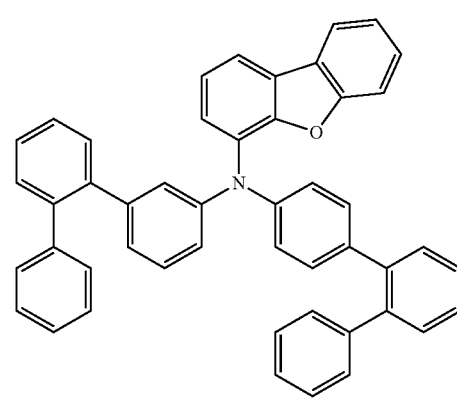
23
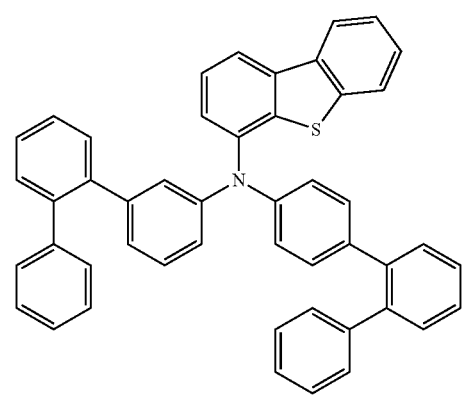

-continued
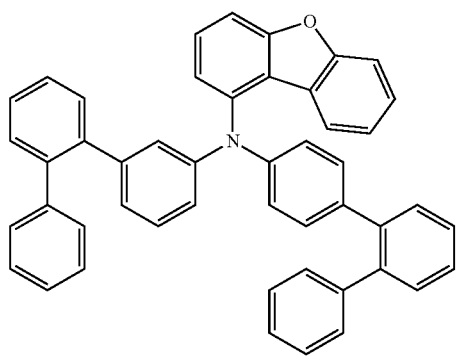
24
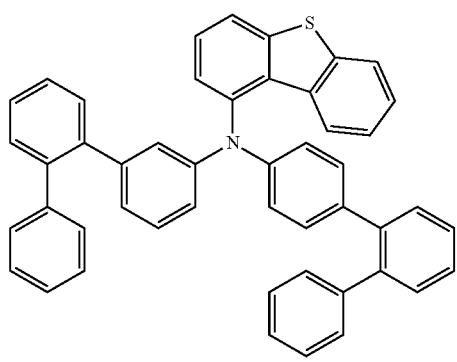
25
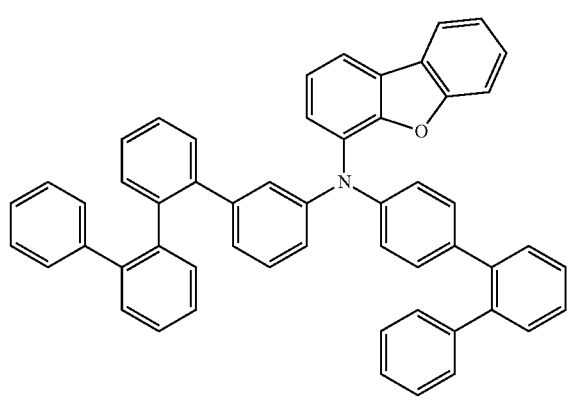
26
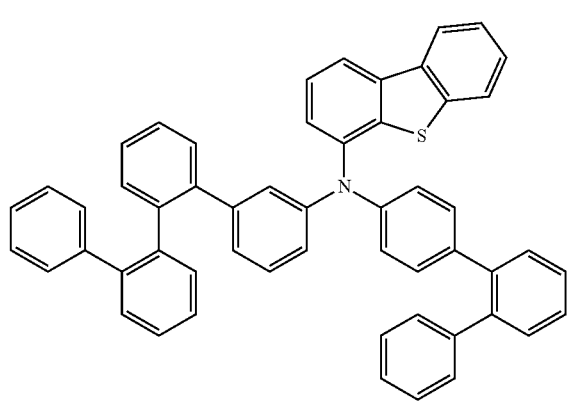
27
-continued
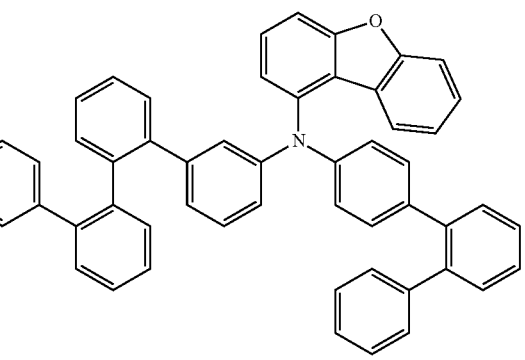
28
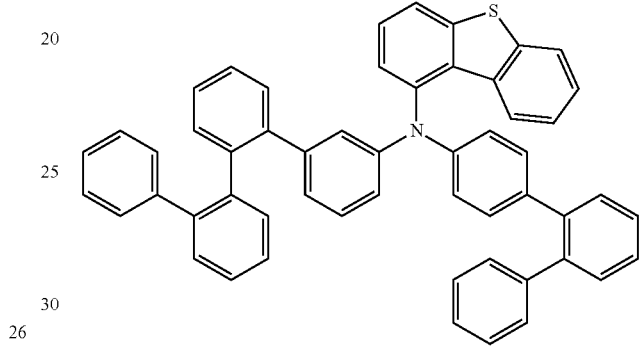
29
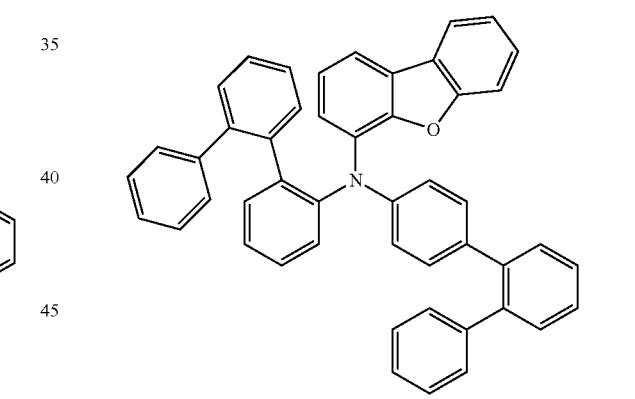
30
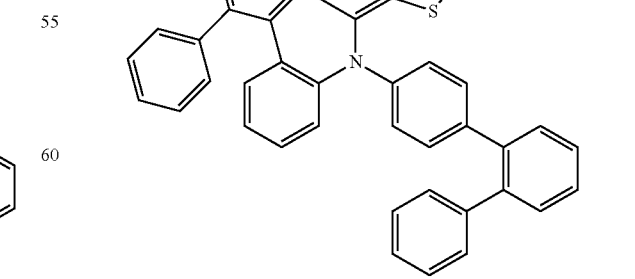
31

32
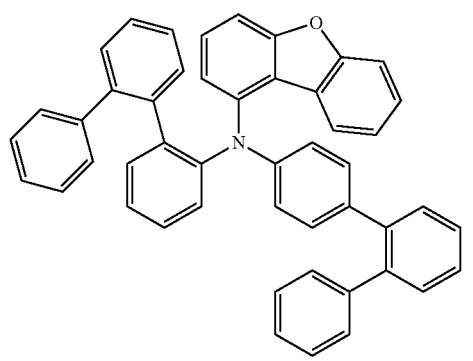
33
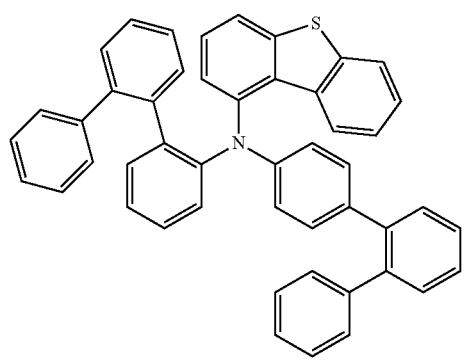
34
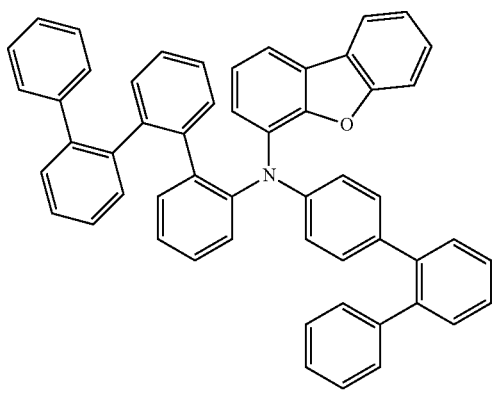
35
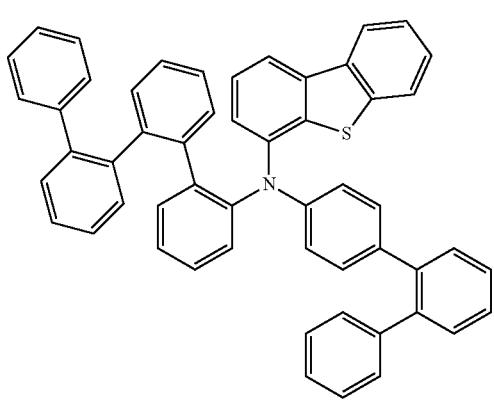
36
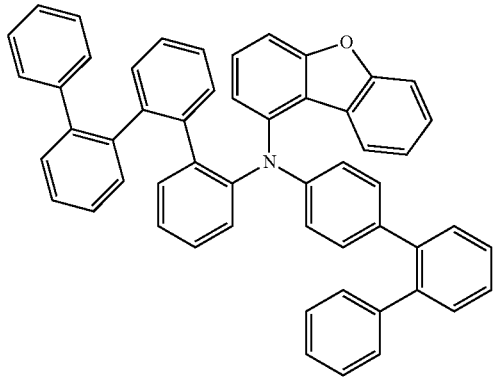
37
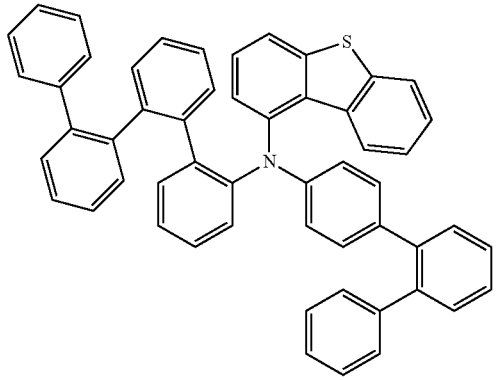
38
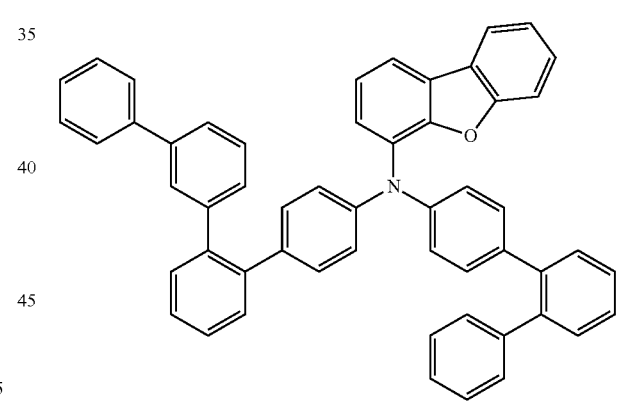
39
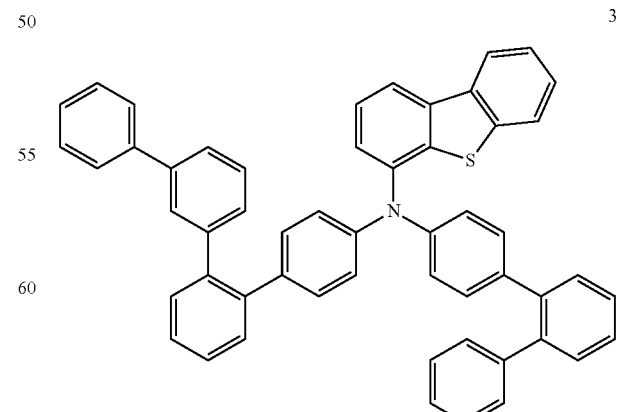

40
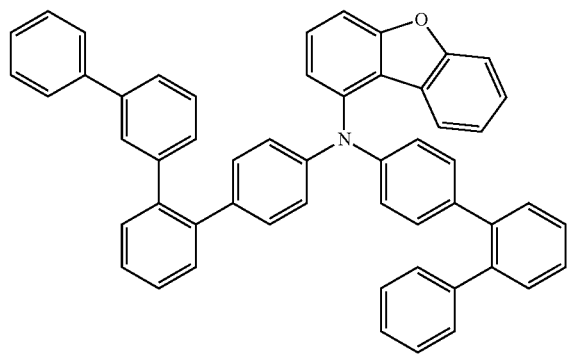
41
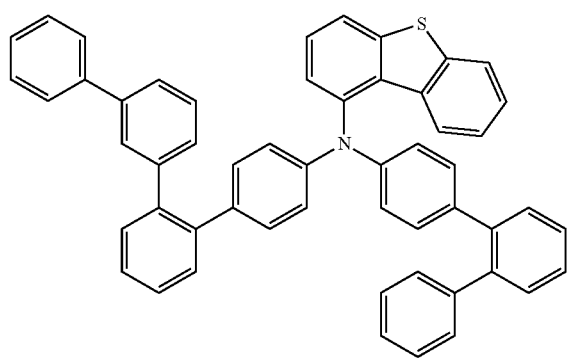
42
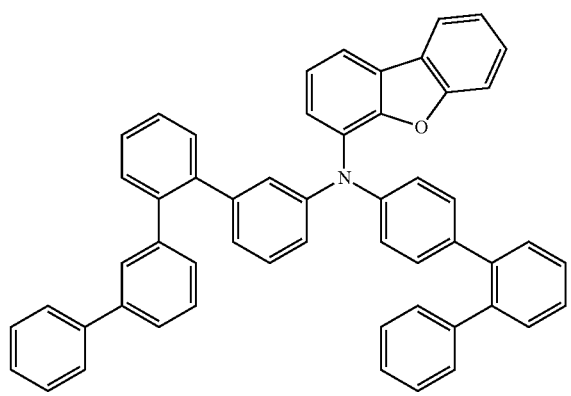
43
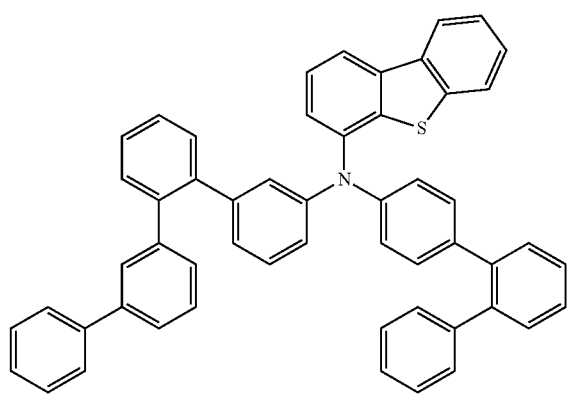
44
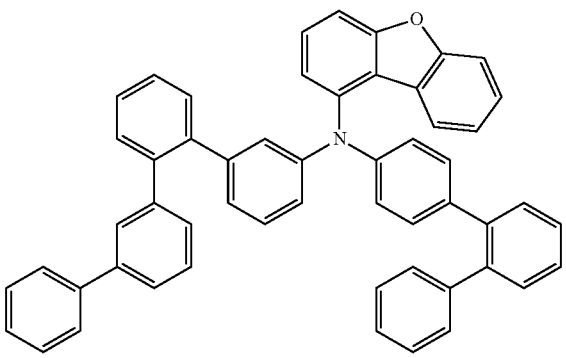
45
46
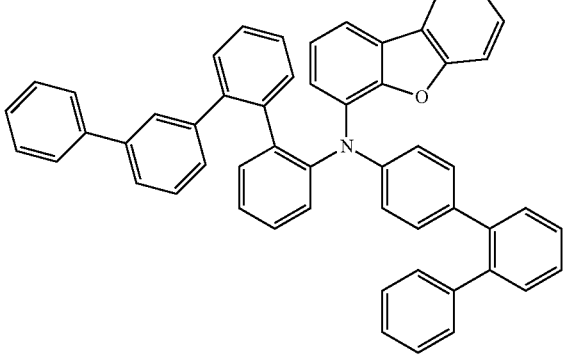
47
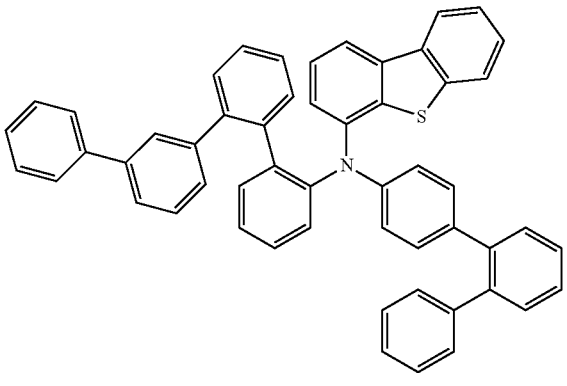

48
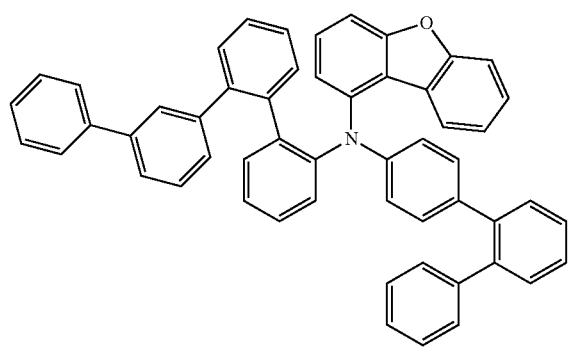
49
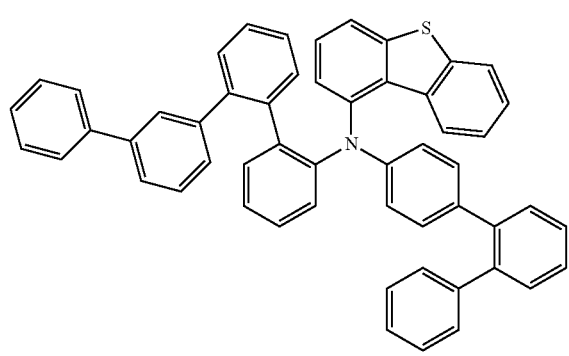
50
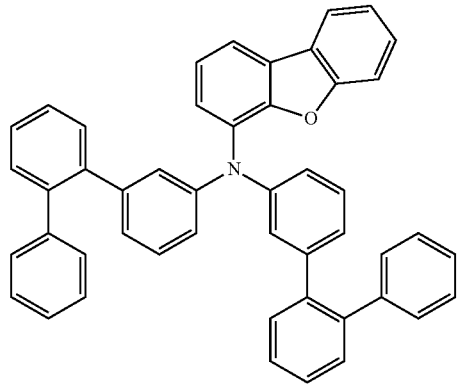
51
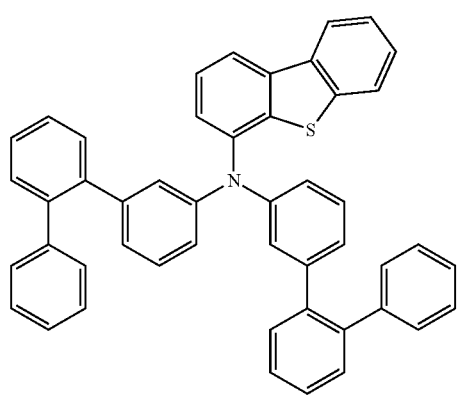
52
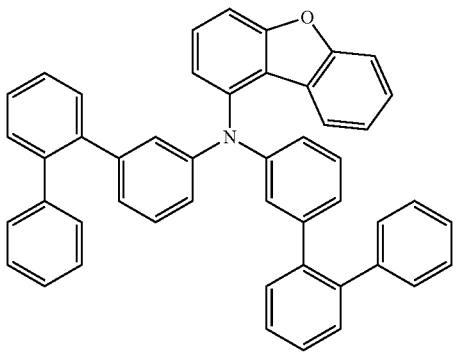
53
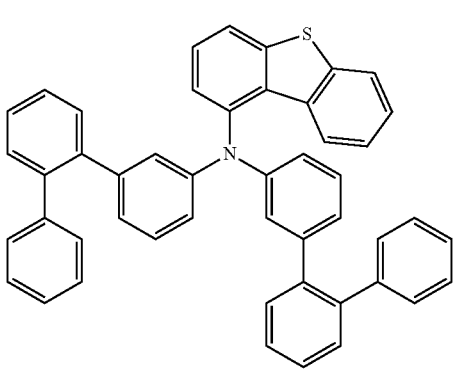
54
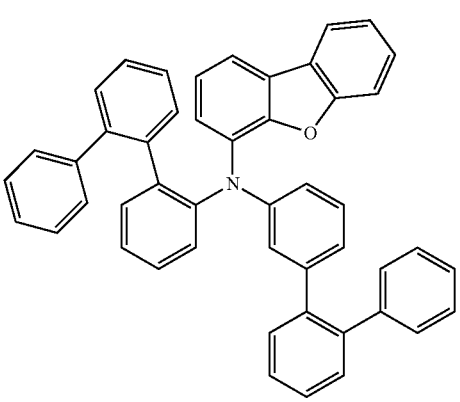
55
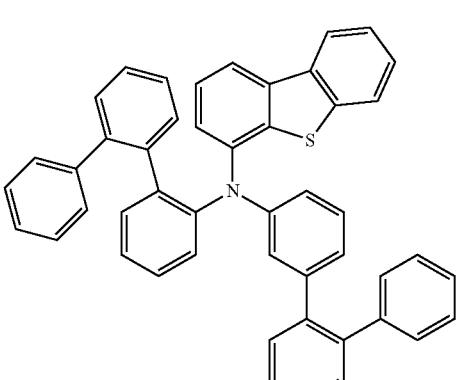

56
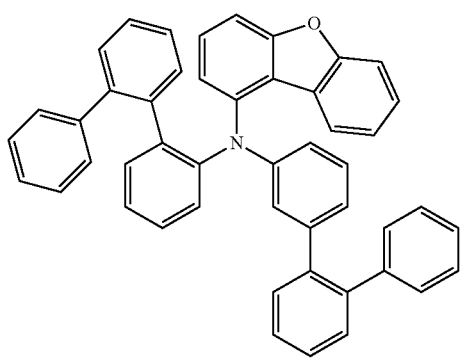
57
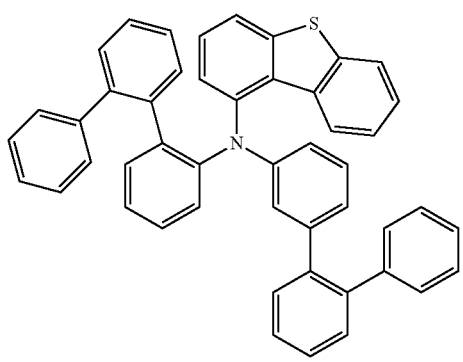
58
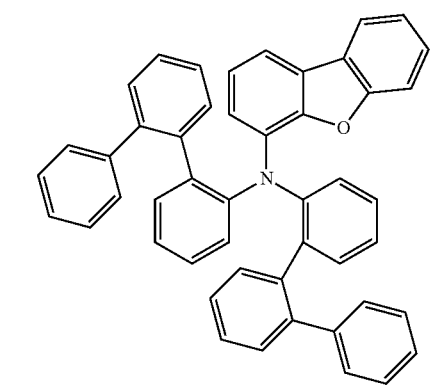
59
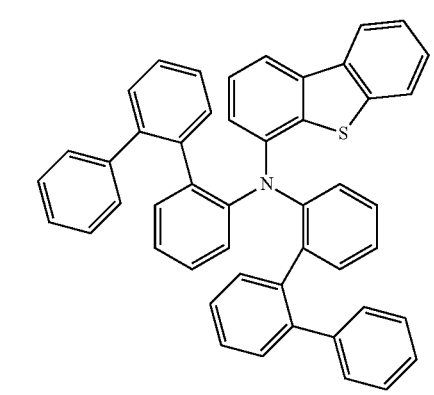
60
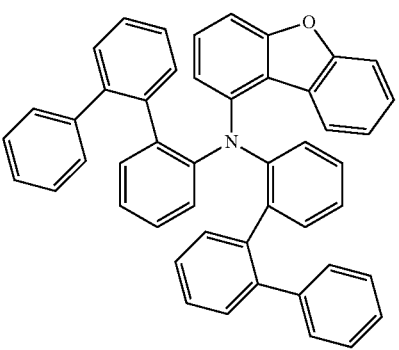
61
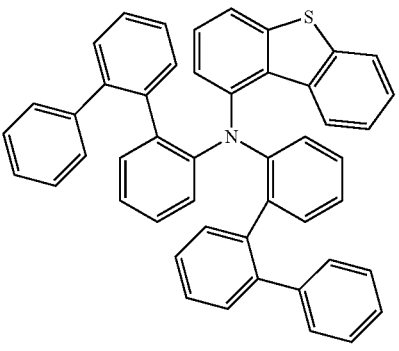
62
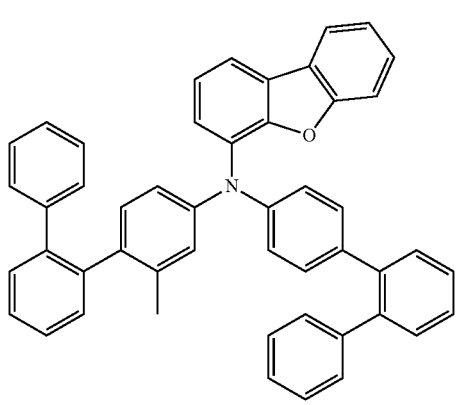
63
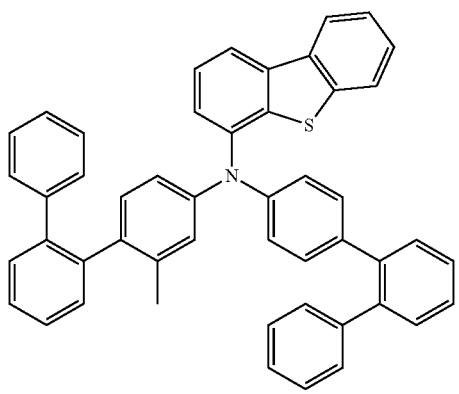

64
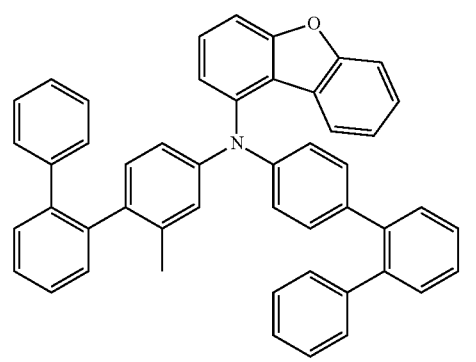
65
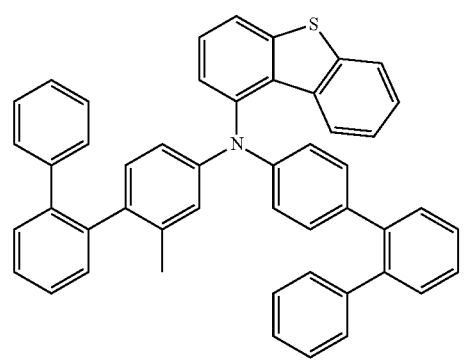
66
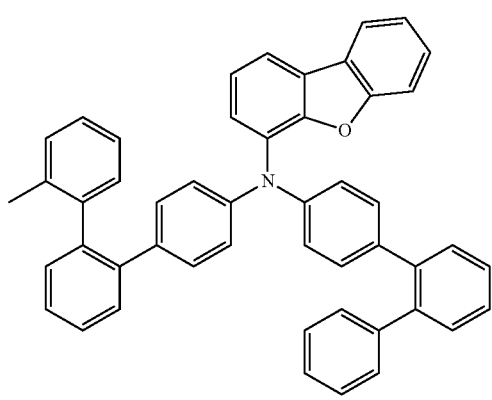
67
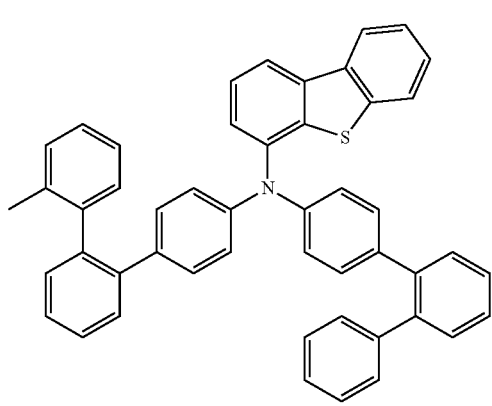
68
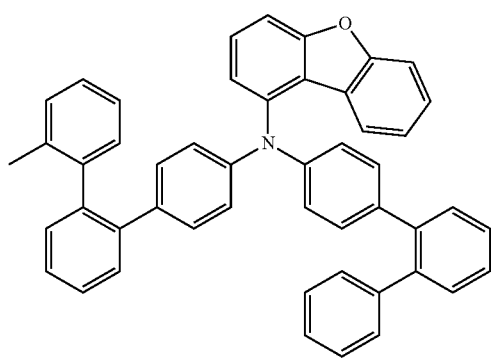
69
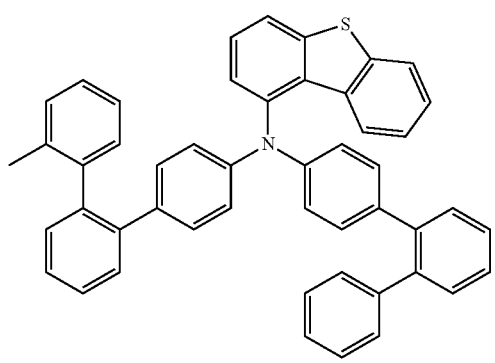
70
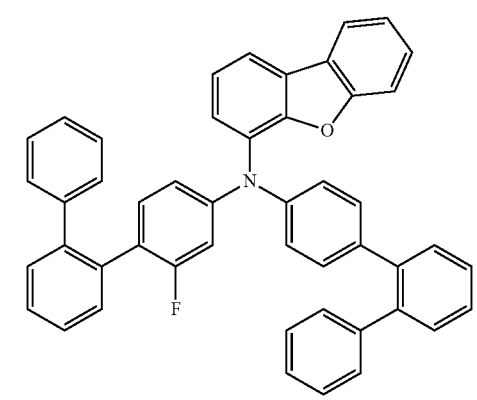
71
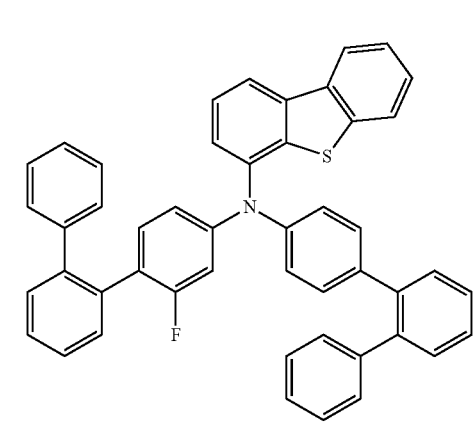

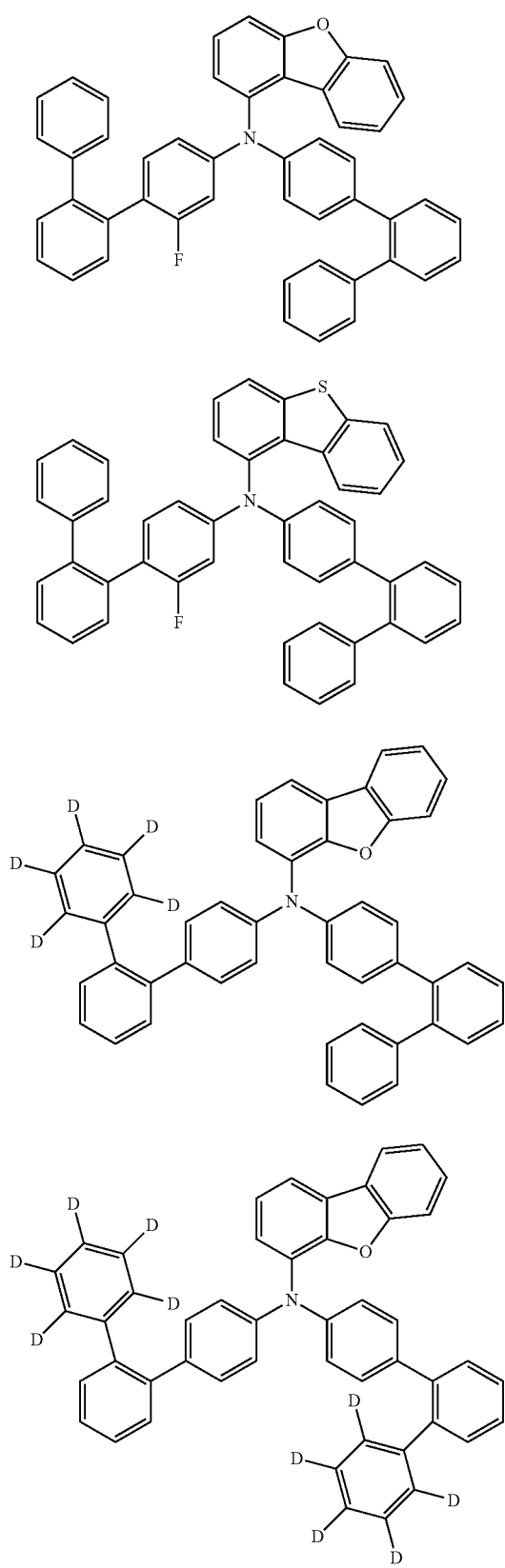
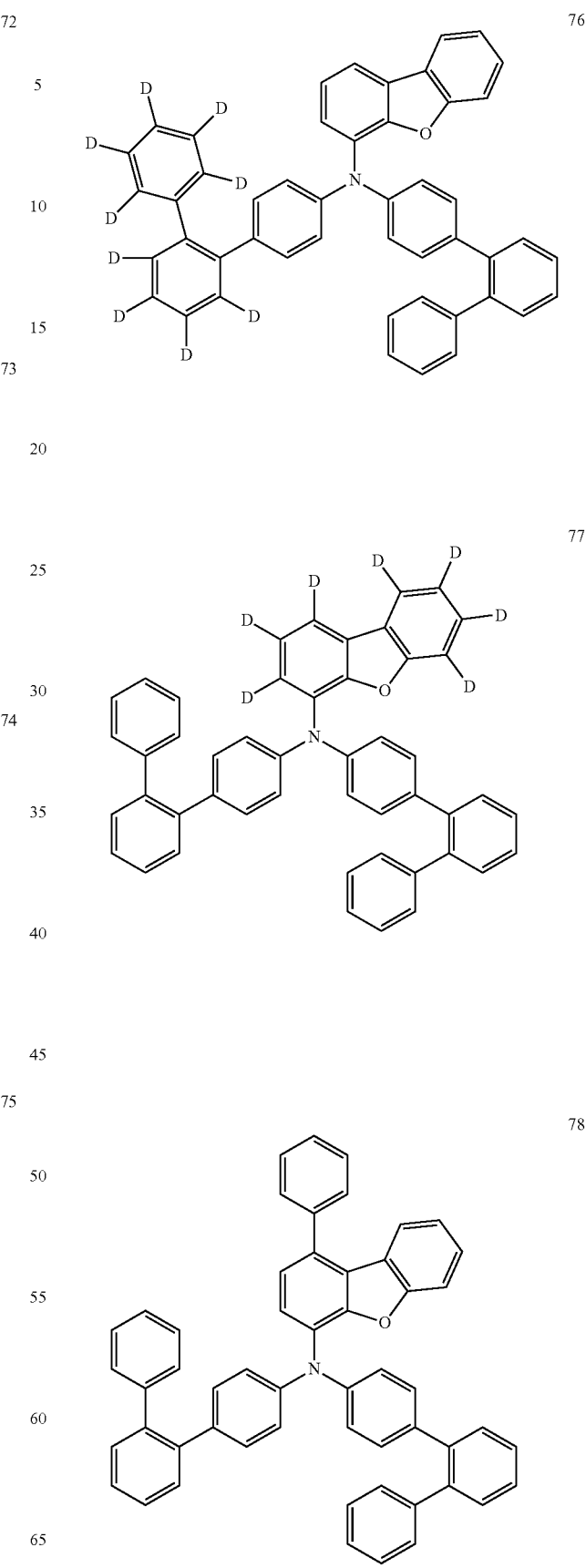

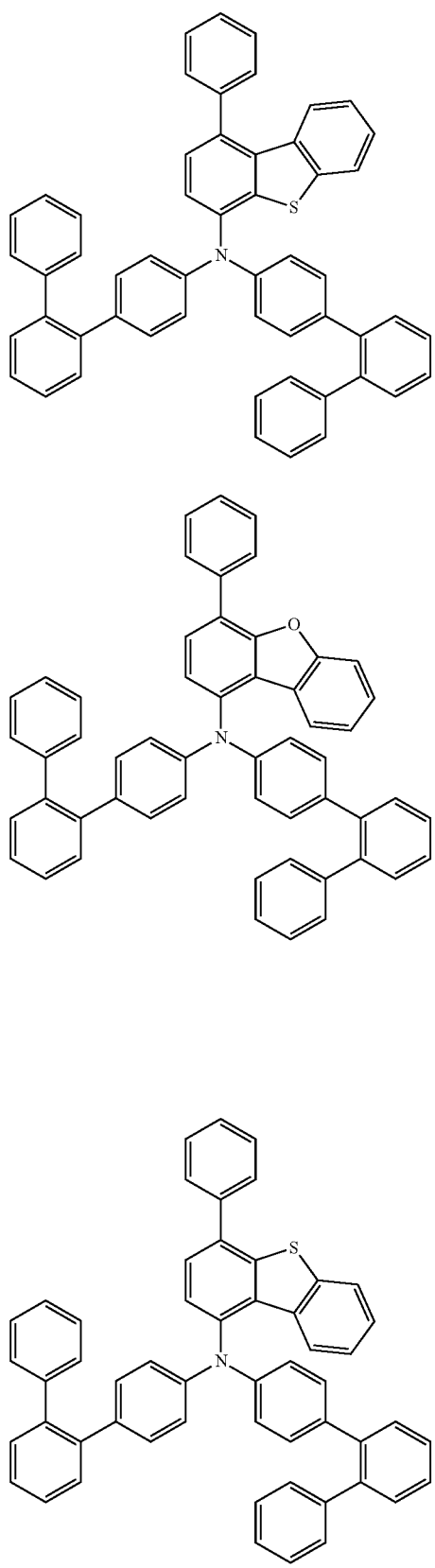
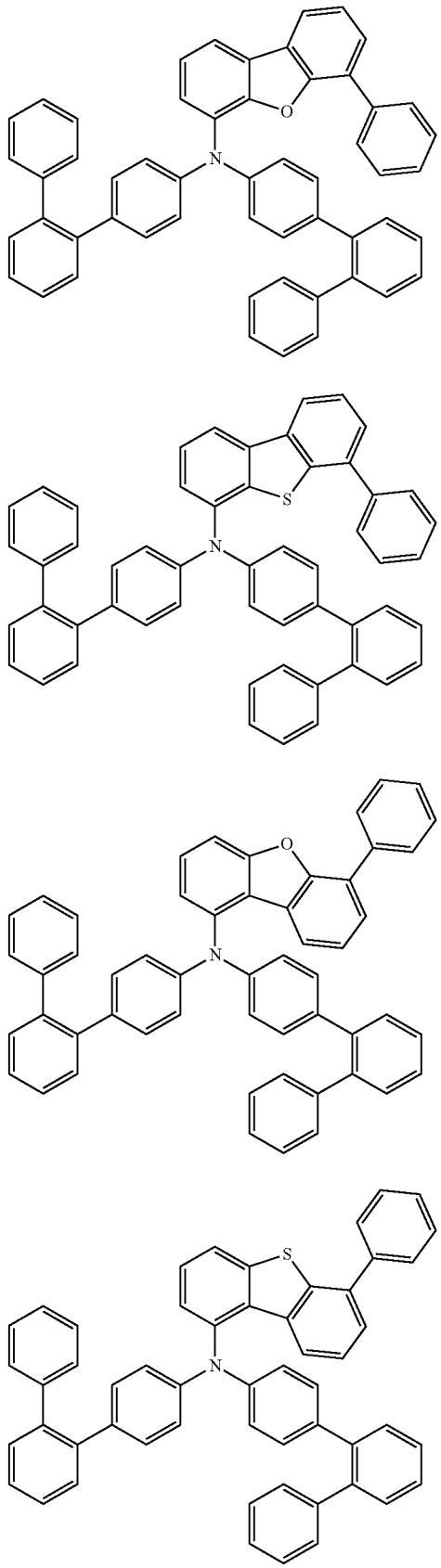

-continued
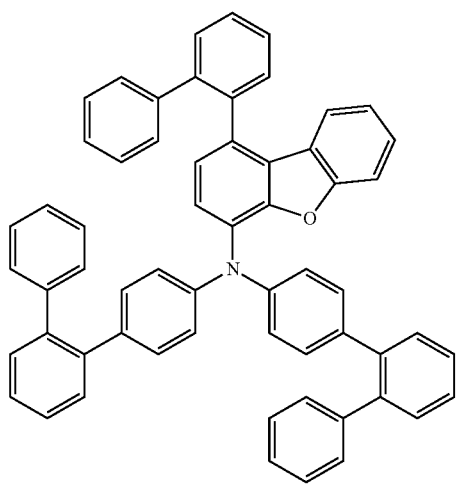
86
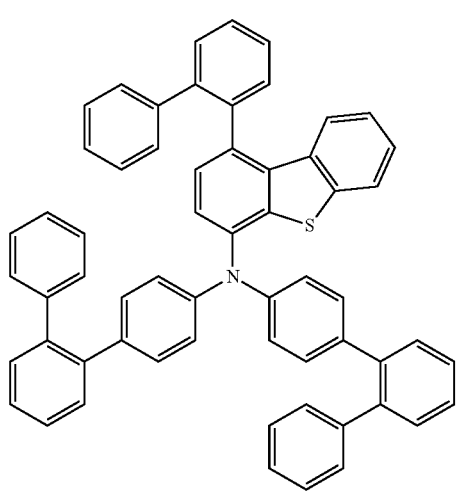
87
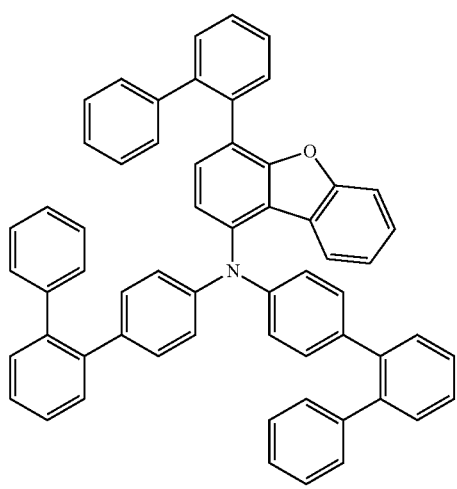
88
-continued
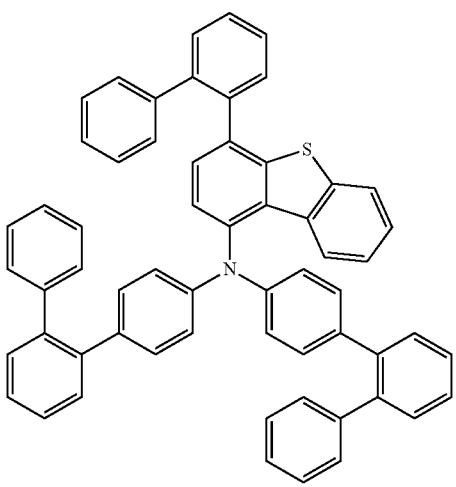
89
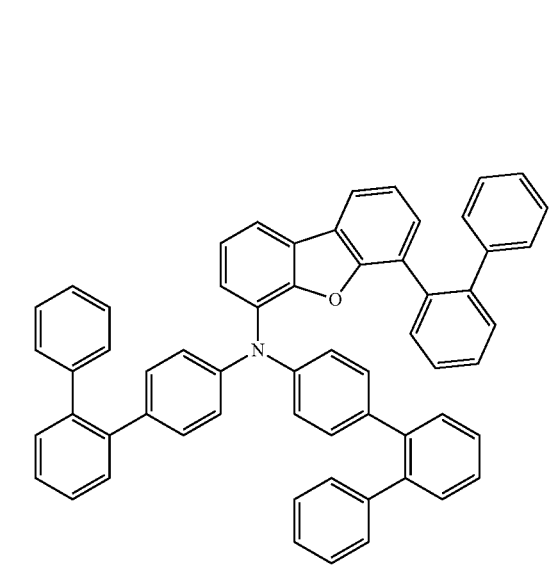
90
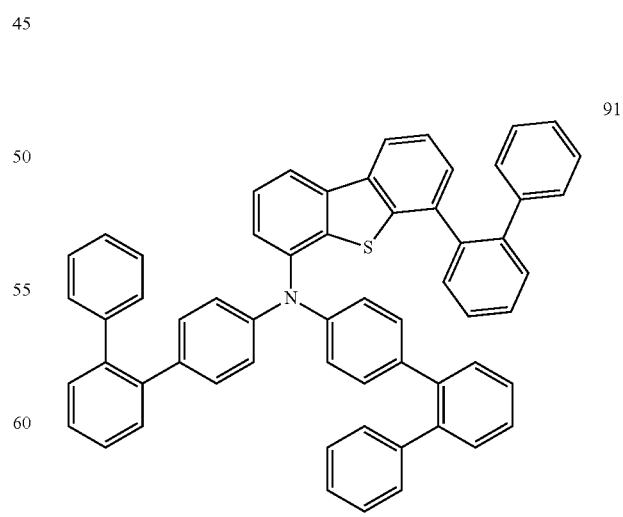
91

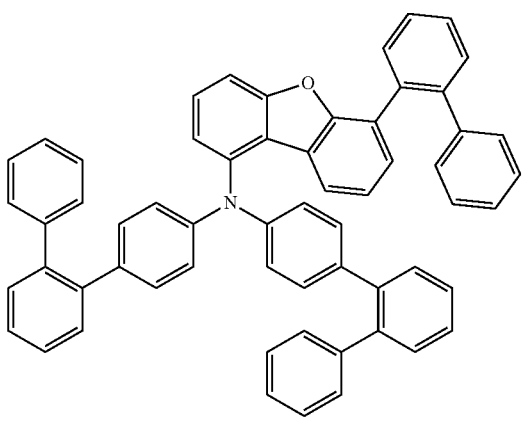

92

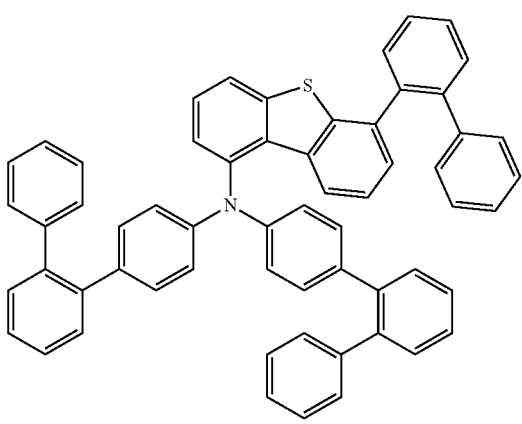

93

In Compound 74 to Compound 77 of Compound Group 1, D is a deuterium atom.

The amine compound represented by Formula 1 of an embodiment may include two terphenyl groups and one heteroaryl group which are bonded to the nitrogen atom. The heteroaryl group may be a substituted or unsubstituted dibenzofuran group, or a substituted or unsubstituted dibenzothiophene group. The amine compound of an embodiment may include a molecular structure in which the o-terphenyl group represented by Formula Z below is directly bonded to the nitrogen atom.

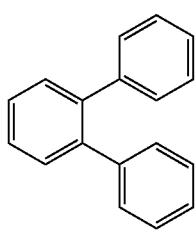

[Formula Z]

The amine compound of an embodiment may exhibit improved stability and hole transport characteristics of materials due to the steric properties of the molecular structure in which the o-terphenyl group is bonded to the nitrogen atom. When the amine compound of an embodiment is included in the hole transport region of the light emitting device, the hole transport characteristics may be improved, thereby increasing recombination probability of holes and electrons in the emission layer. Accordingly, luminous efficiency and a service life of the light emitting device may be improved.

The hole transport region HTR may include at least one of a hole injection layer HIL, a hole transport layer HTL, a buffer layer (not shown), an emission-auxiliary layer (not shown), and an electron blocking layer EBL. At least one of the hole injection layer HIL, the hole transport layer HTL, and the electron blocking layer EBL may include the amine compound of an embodiment. For example, the hole transport region HTR may include the hole injection layer HIL, the hole transport layer HTL, and the electron blocking layer EBL, and the hole transport layer HTL may include the amine compound of an embodiment.

A thickness of the hole transport region HTR may be, for example, in a range of about 50 Å to about 15,000 Å. The hole transport region HTR may have a single layer formed of a single material, a single layer formed of different materials, or a multilayer structure including multiple layers formed of different materials.

For example, the hole transport region HTR may have a single layer structure of the hole transport layer HTL, and may have a single layer structure formed of a hole injection material and a hole transport material. In an embodiment, the hole transport region HTR may have a single layer structure formed of different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL that are stacked in order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The light emitting device ED of an embodiment may further include a hole transport material, which will be described below, in addition to the above-described amine compound of an embodiment. The hole transport region HTR may include a compound represented by Formula H-1 below:

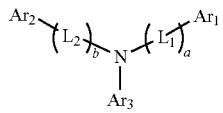

[Formula H-1]

In Formula H-1 above, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a or b is an integer of 2 or greater, multiple $L_1$ groups or multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

The compound represented by Formula H-1 above may be a monoamine compound. In another embodiment, the compound represented by Formula H-1 above may be a diamine compound in which at least one among $Ar_1$ to $Ar_3$ includes the amine group as a substituent. The compound represented by Formula H-1 above may be a carbazole-based compound including a substituted or unsubstituted carbazole group in at least one of $Ar_1$ and $Ar_2$, or a fluorene-based compound including a substituted or unsubstituted fluorene group in at least one of $Ar_1$ and $Ar_2$.

The compound represented by Formula H-1 may be represented by any one among the compounds of Compound Group H below. However, the compounds listed in Compound Group H below are examples, and the compounds represented by Formula H-1 are not limited to those represented by Compound Group H below:

[Compound Group H]

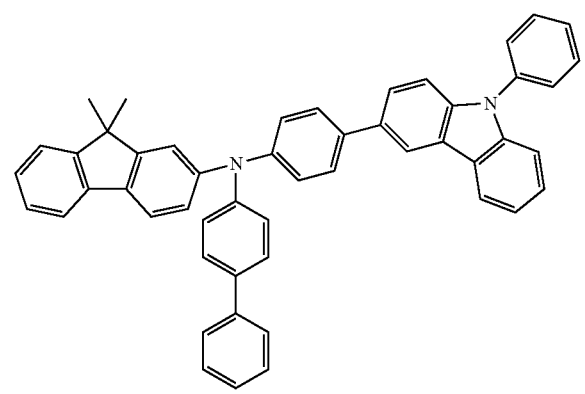

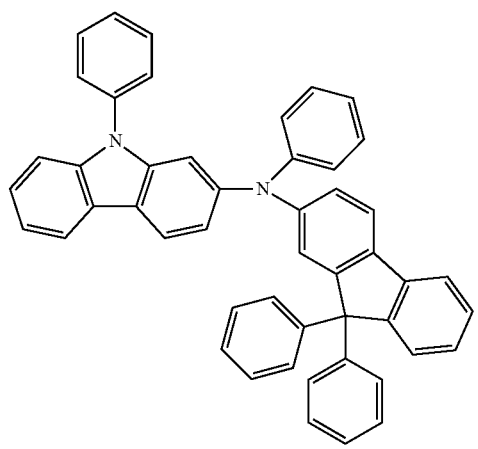

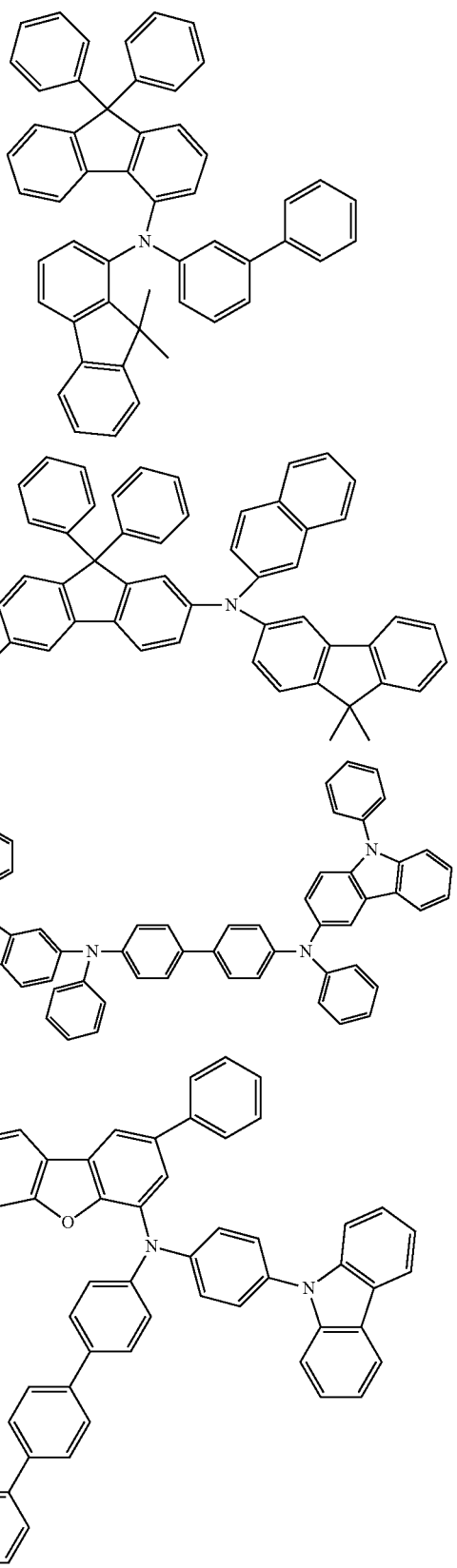

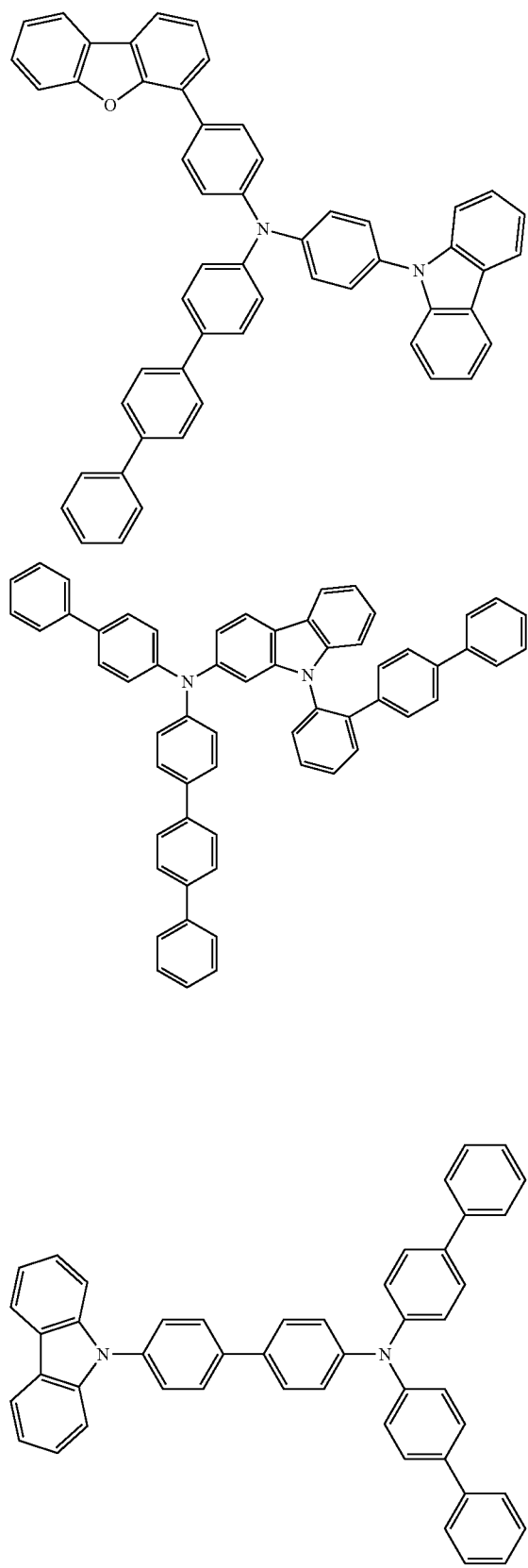
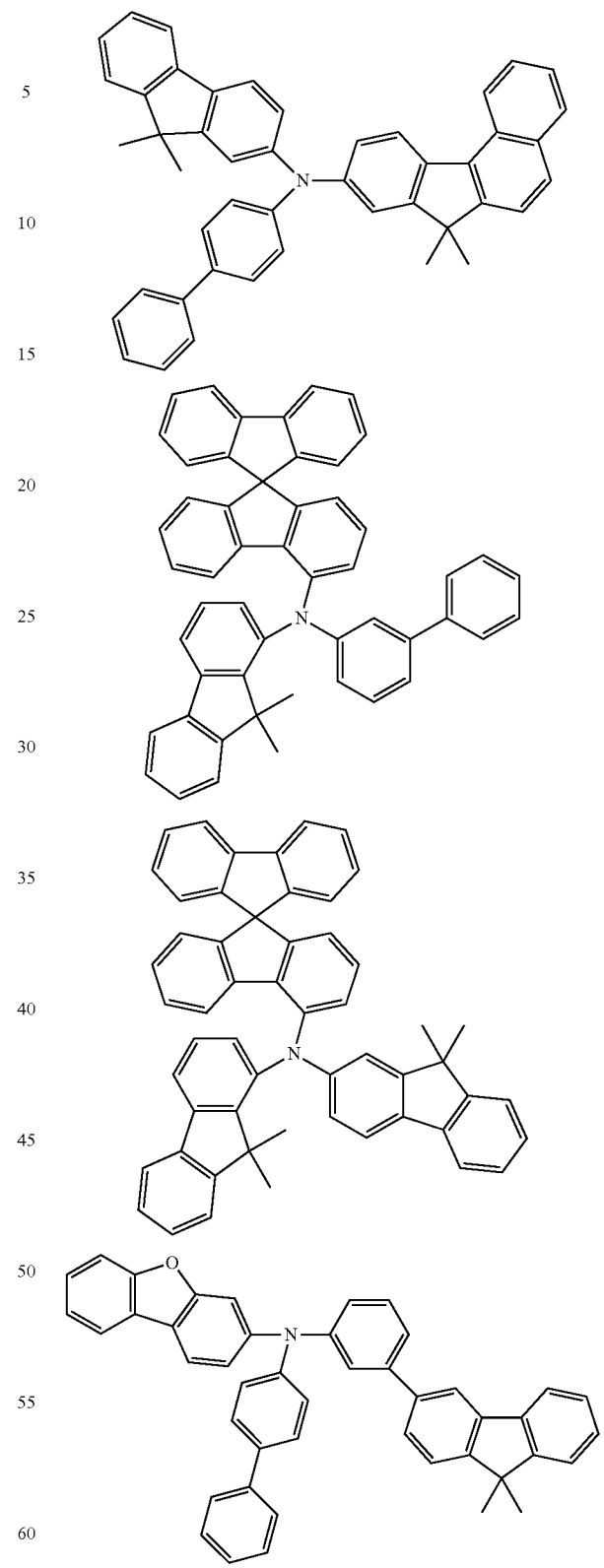

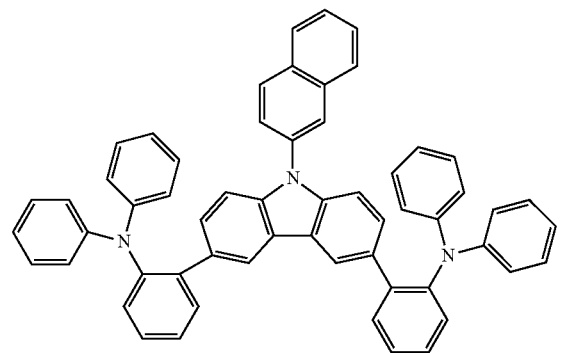

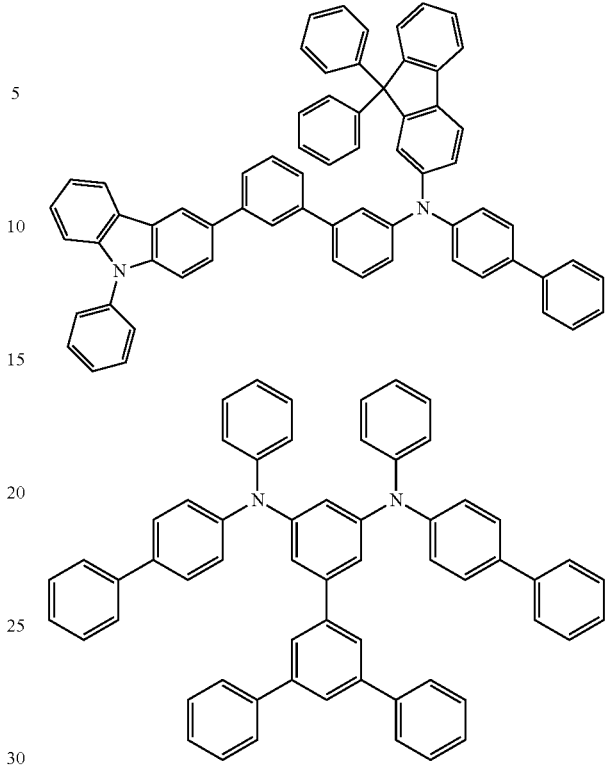

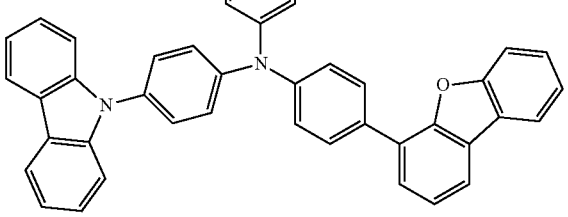

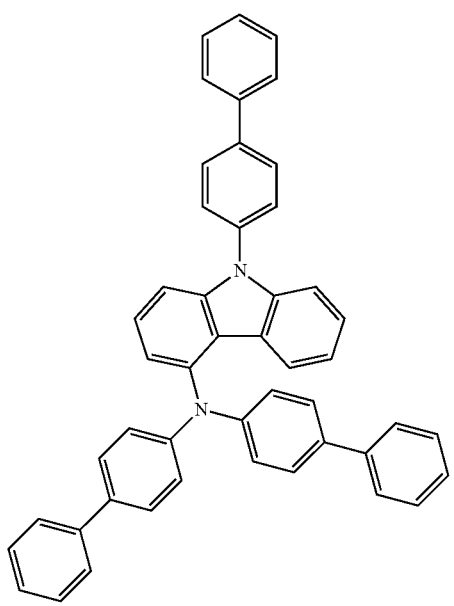

The hole transport region HTR may further include a phthalocyanine compound such as copper phthalocyanine; $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4''-[tris(3-methylphenyl)phenylamino]triphenylamine (m-MTDATA), 4,4'4''-tris(N,N-diphenylamino)triphenylamine (TDATA), 4,4',4''-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium[tetrakis(pentafluorophenyl)borate], dipyrazino[2,3-f: 2',3'-h]quinoxaline-2,3,6,7,10,11-hexacarbonitrile (HATCN), etc.

The hole transport region HTR may further include carbazole derivatives such as N-phenyl carbazole and polyvinyl carbazole, fluorene derivatives, N,N'-bis(3-methylphenyl)-N,N'-diphenyl-[1,1-biphenyl]-4,4'-diamine (TPD), triphenylamine derivatives such as 4,4',4''-tris(N-carbazolyl)triphenylamine (TCTA), N,N'-di(naphthalene-1-yl)-N,N'-diplienyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The hole transport region HTR may include the above-described compound of the hole transport region in at least one of a hole injection layer HIL, a hole transport layer HTL, and an electron blocking layer EBL.

A thickness of the hole transport region HTR may be in a range of about 100 Å to about 10,000 Å. For example, the thickness of the hole transport region HTR may be in a range of about 100 Å to about 5,000 Å. When the hole transport region HTR includes a hole injection layer HIL, the hole injection layer HIL may have, for example, a thickness in a range of about 30 Å to about 1,000 Å. When the hole transport region HTR includes a hole transport layer HTL, the hole transport layer HTL may have a thickness in a range of about 30 Å to about 1,000 Å. For example, when the hole transport region HTR includes an electron blocking layer EBL, the electron blocking layer EBL may have a thickness in a range of about 10 Å to about 1,000 Å. If the thicknesses of the hole transport region HTR, the hole injection layer HIL, the hole transport layer HTL and the electron blocking layer EBL satisfy the above-described ranges, satisfactory hole transport characteristic may be achieved without a substantial increase in a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, and a cyano group-containing compound, but embodiments are not limited thereto. For example, the p-dopant may include metal halides such as CuI and RbI, quinone derivatives such as tetracyanoquinodimethane (TCNQ) and 2,3,5,6-tetrafluoro-7,7',8,8'-tetracyanoquinodimethane (F4-TCNQ), metal oxides such as tungsten oxide and molybdenum oxide, dipyrazino[2,3-f: 2',3'-h]quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile, etc., but embodiments are not limited thereto.

As described above, the hole transport region HTR may further include at least one of a buffer layer (not shown) and an electron blocking layer EBL in addition to the hole injection layer HIL and the hole transport layer HTL. The buffer layer (not shown) may compensate a resonance distance according to the wavelength of light emitted from the emission layer EML and may thus increase light emission efficiency. Materials which may be included in the hole transport region HTR may be used as materials to be included in the buffer layer (not shown). The electron blocking layer EBL may be a layer that prevents electrons from being injected from the electron transport region ETR to the hole transport region HTR.

The emission layer EML is provided on the hole transport region HTR. In the light emitting device ED of an embodiment, the emission layer EML may include the above-described amine compound of an embodiment. The amine compound of an embodiment may be used as a dopant material or a host material.

In the light emitting device ED of an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In each light emitting device ED of embodiments illustrated in FIGS. 3 to 6, the emission layer EML may include a host and a dopant, and the emission layer EML may include a compound represented by Formula E-1 below. The compound represented by Formula E-1 below may be used as a fluorescence host material.

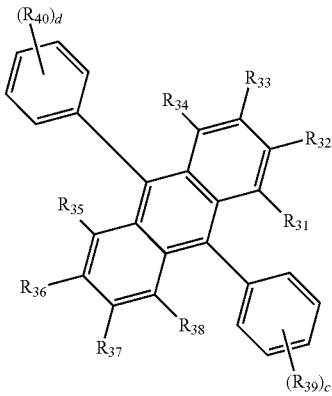

[Formula E-1]

In Formula E-1, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In an embodiment, in Formula E-1, $R_{31}$ to $R_{40}$ may be bonded to an adjacent group to form a saturated hydrocarbon ring or an unsaturated hydrocarbon ring.

In Formula E-1, c and d may each independently be an integer from 0 to 5. Formula E-1 may be represented by any one among Compound E1 to Compound E19 below:

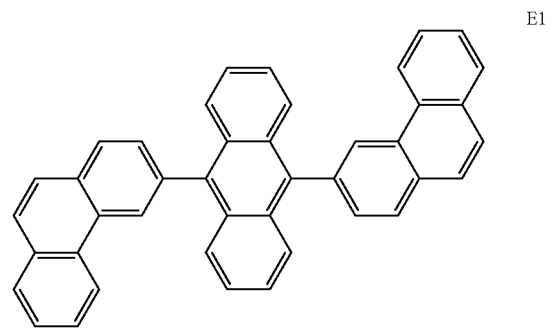

E1

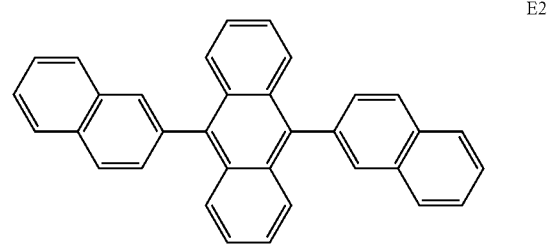

E2

E3
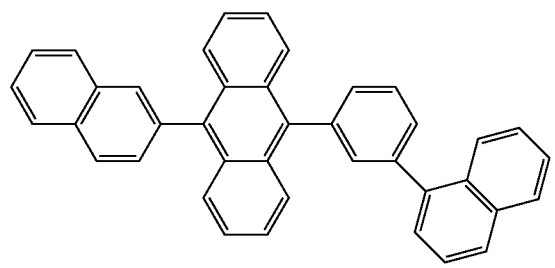
E4
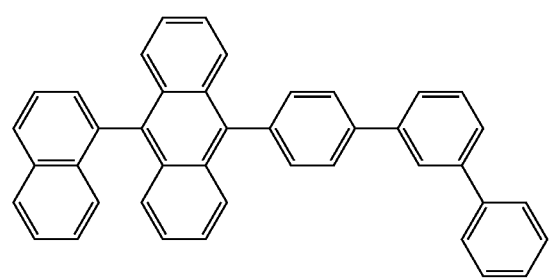
E5
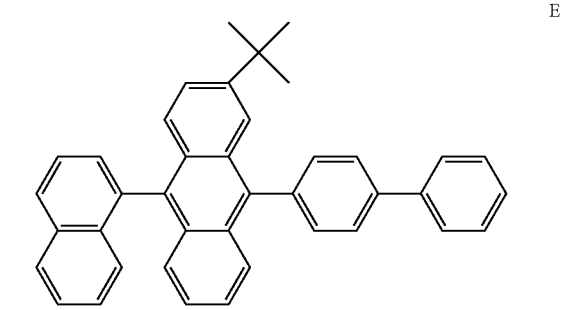
E6
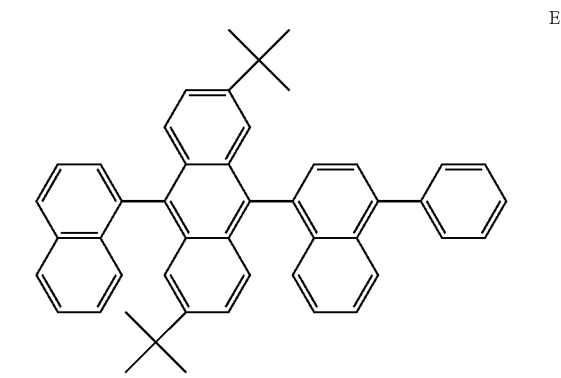
E7
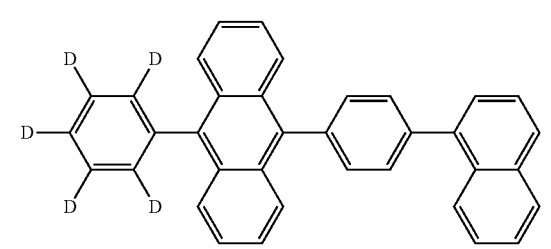
E8
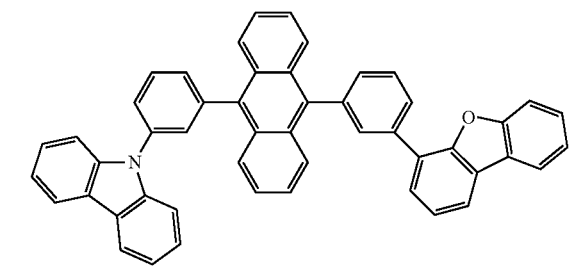
E9
E10
E11
E12

E13
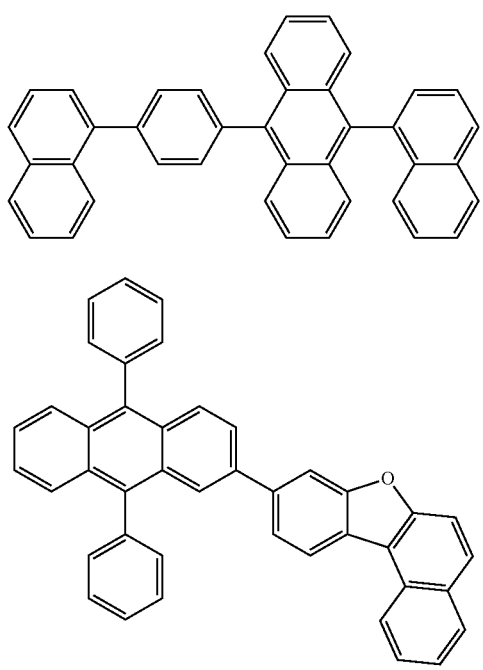
E14
E15
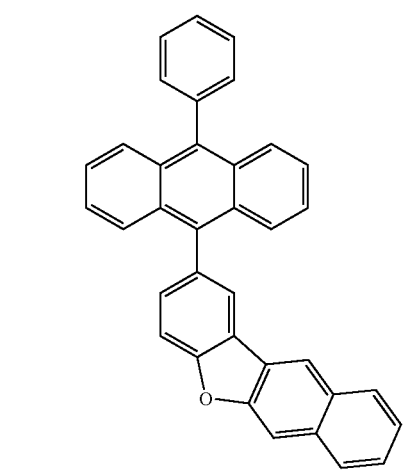
E16
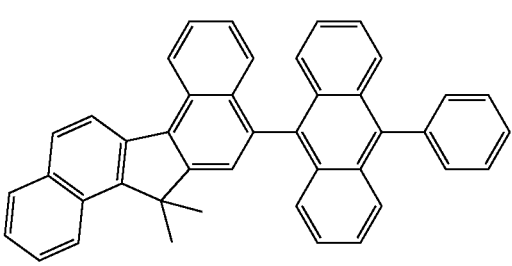
E17
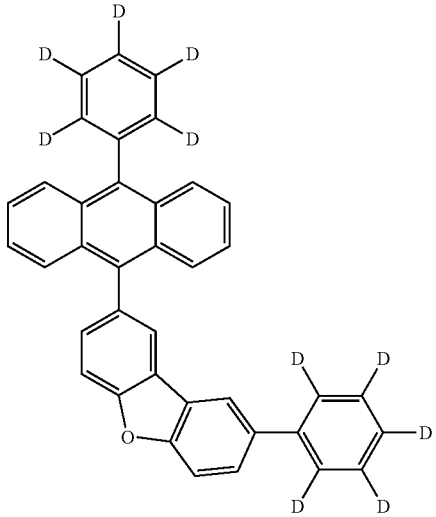
E18
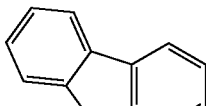
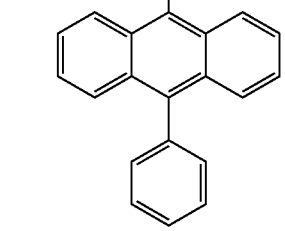
E19
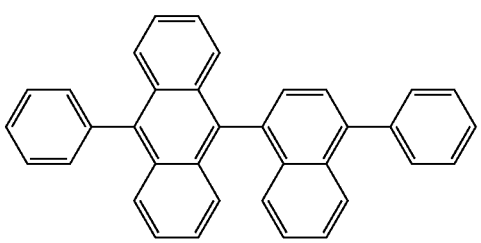
In an embodiment, the emission layer EML may include a compound represented by Formula E-2a or Formula E-2b below. The compound represented by Formula E-2a or Formula E-2b below may be used as a phosphorescence host material.

[Formula E-2a]

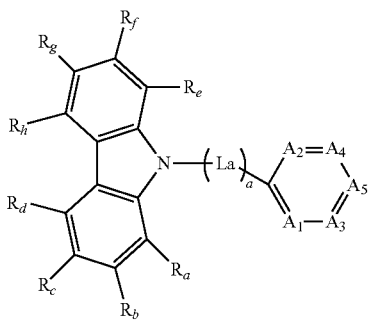

[Compound Group E-2]

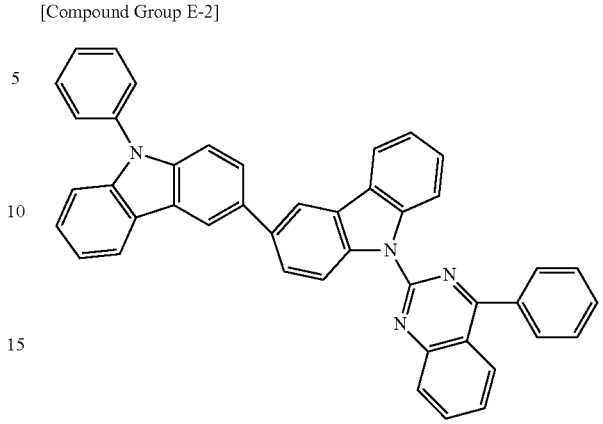

In Formula E-2a, a may be an integer from 0 to 10, $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is an integer of 2 or greater, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three selected from among $A_1$ to $A_5$ may be N, and the remainder of $A_1$ to $A_5$ may be $C(R_1)$.

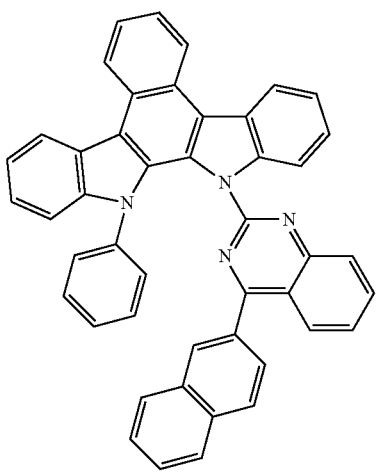

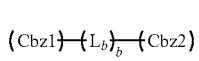

[Formula E-2b]

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is an integer of 2 or more, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one among the compounds of Compound Group E-2 below. However, the compounds listed in Compound Group E-2 below are examples, and the compound represented by Formula E-2a or Formula E-2b is not limited to those represented by Compound Group E-2 below.

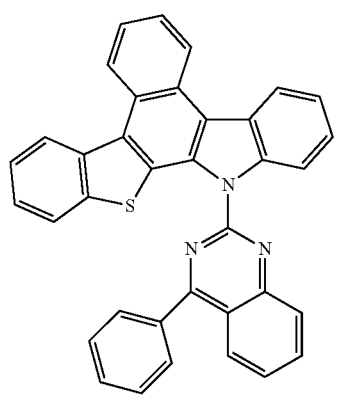

61
-continued
62
-continued
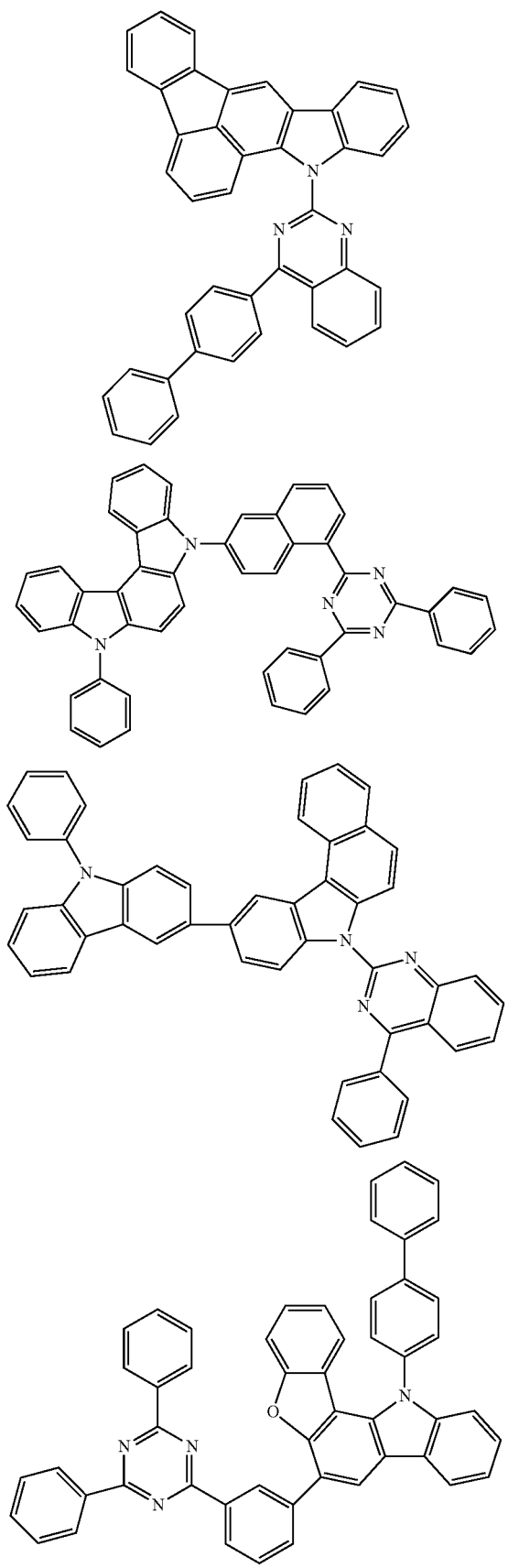
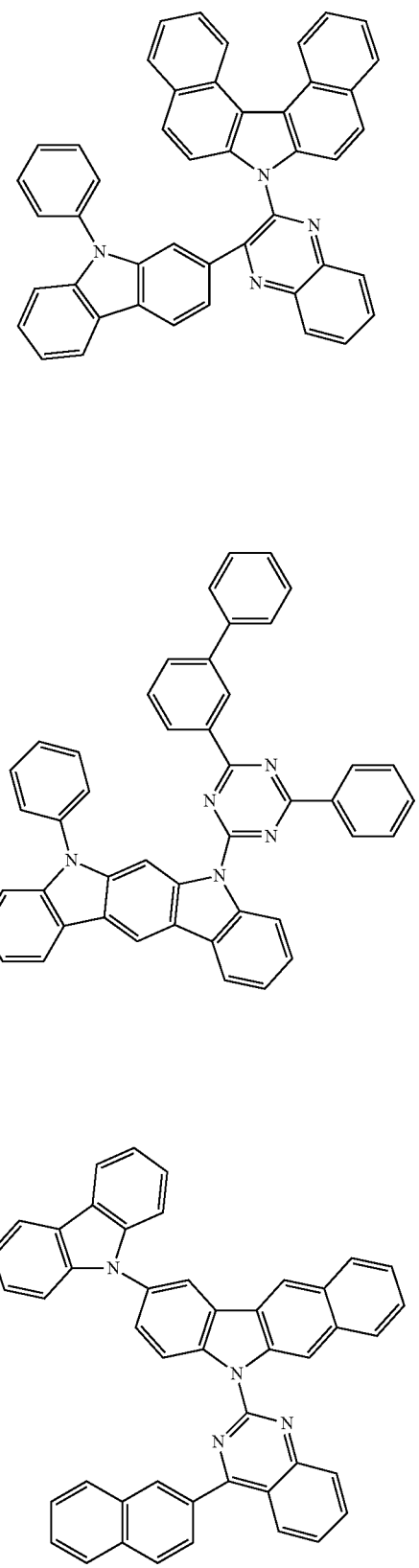

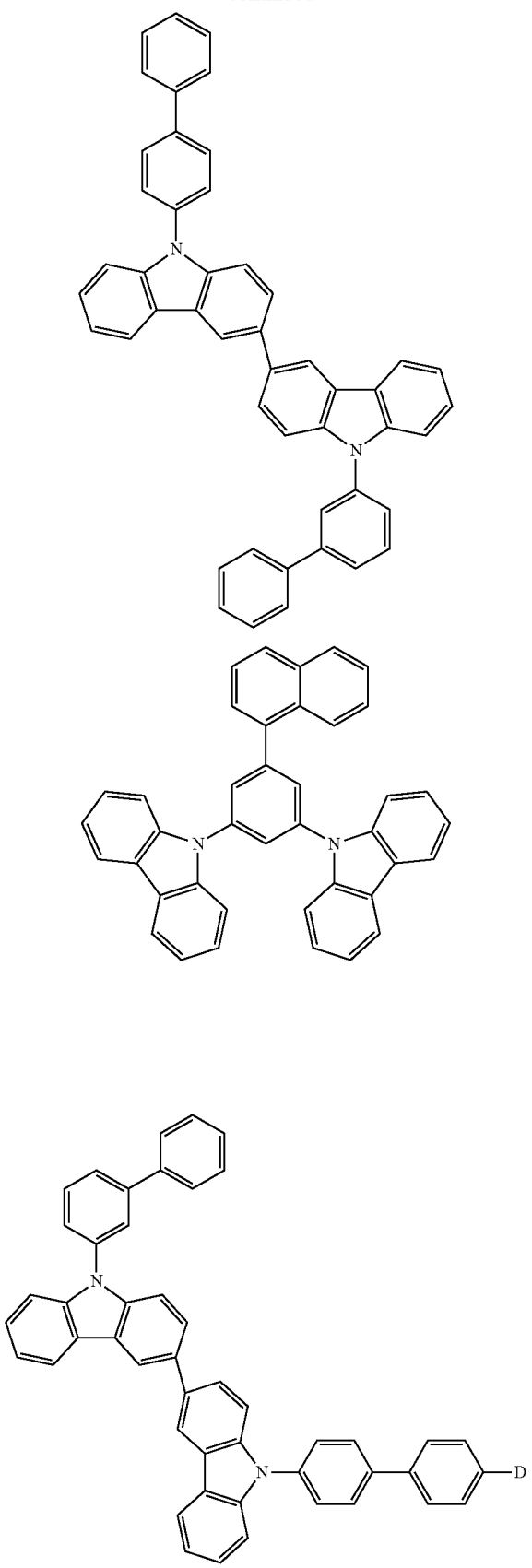
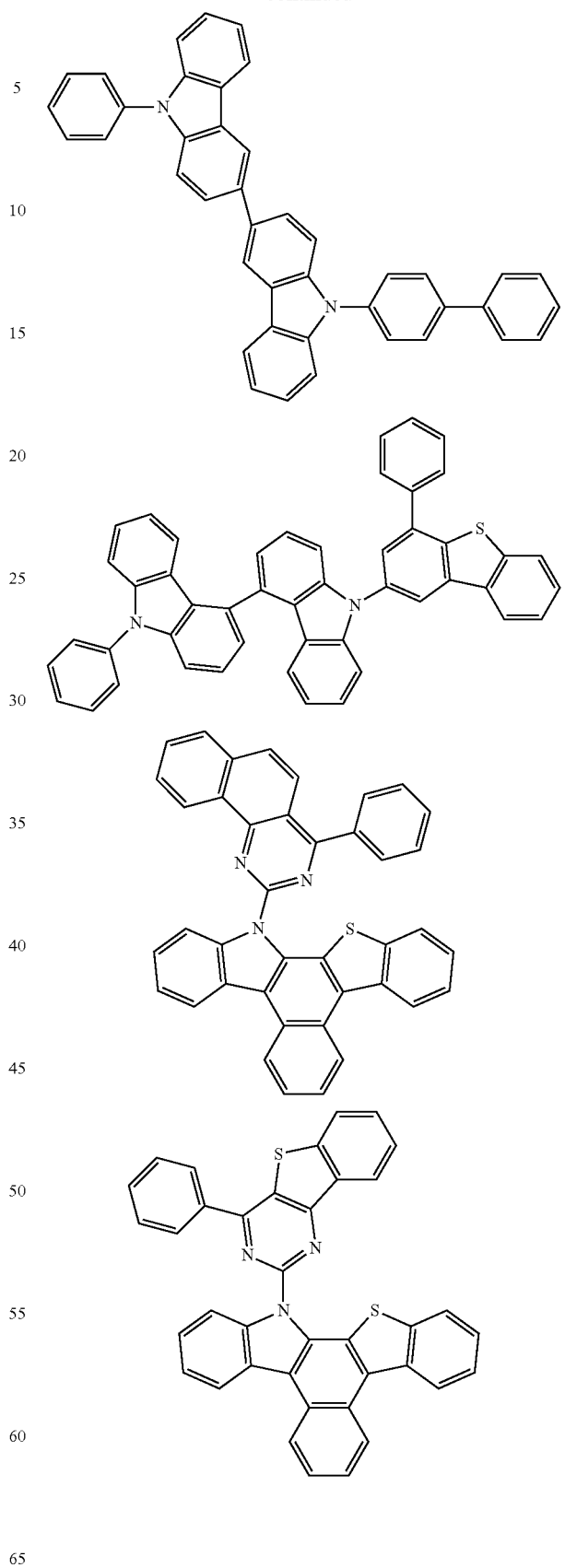

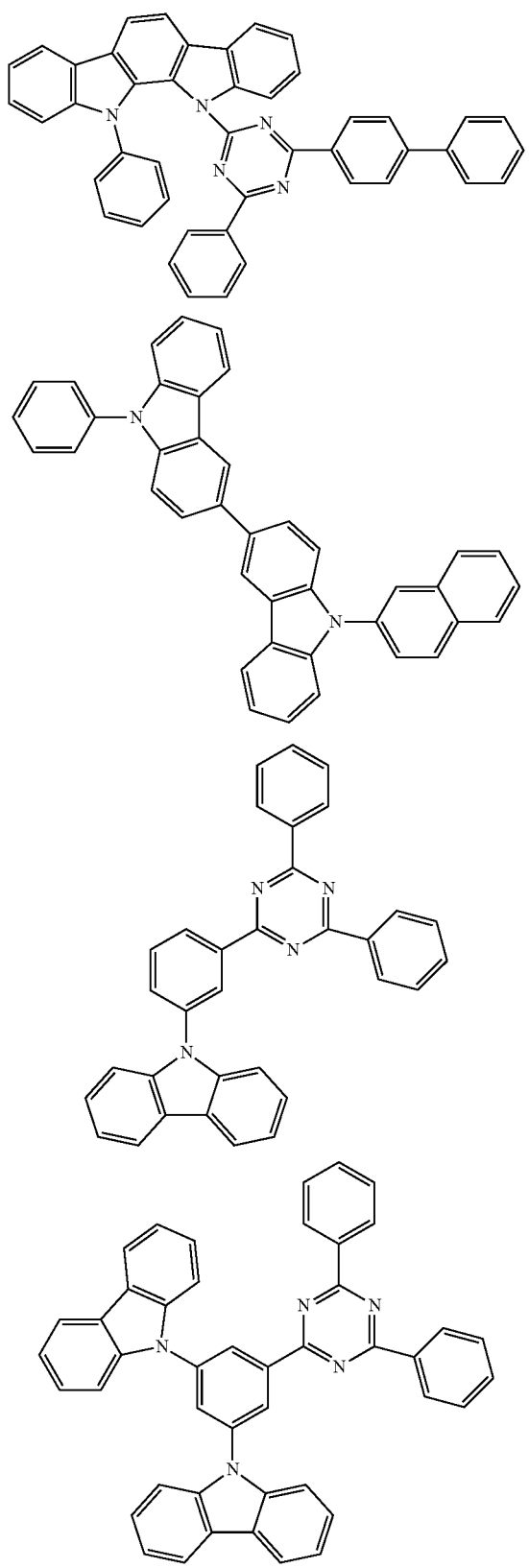

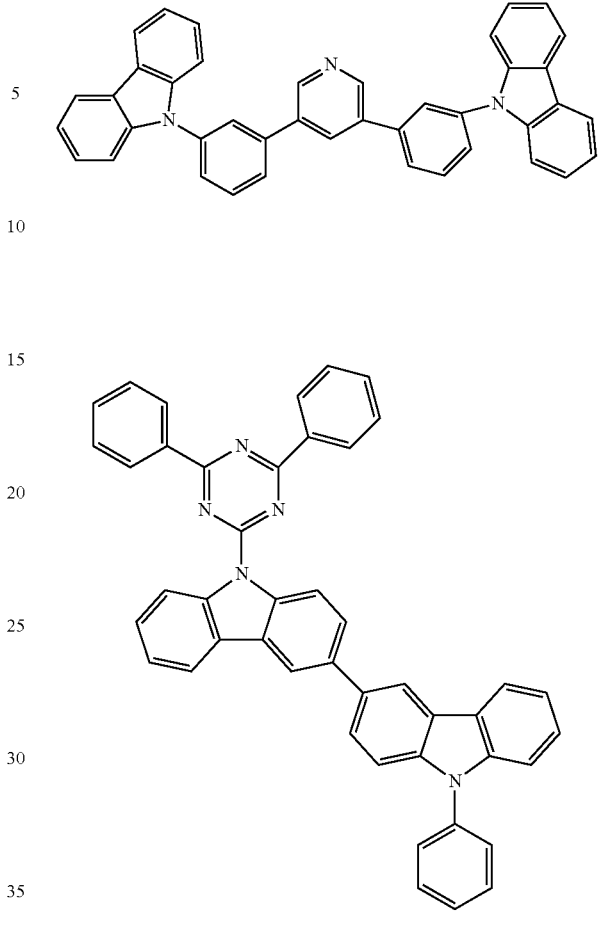

The emission layer EML may further include a general material in the art as a host material. For example, the emission layer EML may include, as a host material, at least one of bis[2-(diphenylphosphino)phenyl]ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi). However, embodiments are not limited thereto, and for example, tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzofuran (PPF), etc. may be used as a host material.

The emission layer EML may include a compound represented by Formula M-a or Formula M-b below. The compound represented by Formula M-a or Formula M-b below may be used as a phosphorescence dopant material.

[Formula M-a]

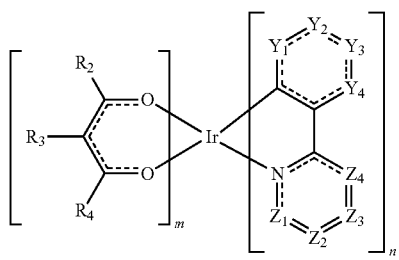

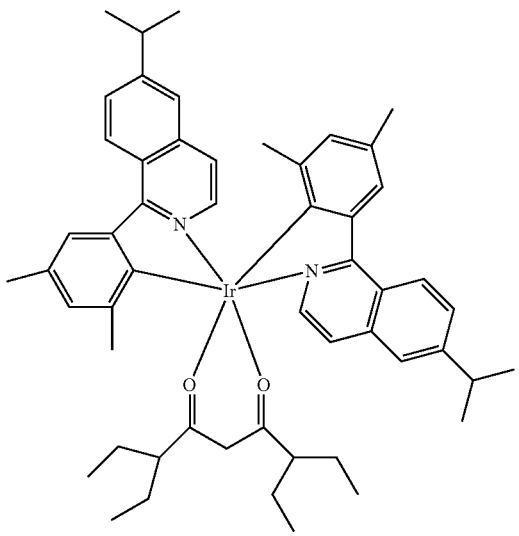
M-a2

In Formula M-a above, $Y_1$ to $Y_4$ and $Z_1$ to $Z_4$ may each independently be $C(R_1)$ or N, $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is O, n may be 3, and when m is 1, n may be 2.

The compound represented by Formula M-a may be used as a red phosphorescence dopant or a green phosphorescence dopant.

The compound represented by Formula M-a may be represented by any one among Compound M-a1 to Compound M-a19 below. However, Compounds M-a1 to M-a19 below are examples, and the compound represented by Formula M-a is not limited to those represented by Compounds M-a1 to M-a19 below.

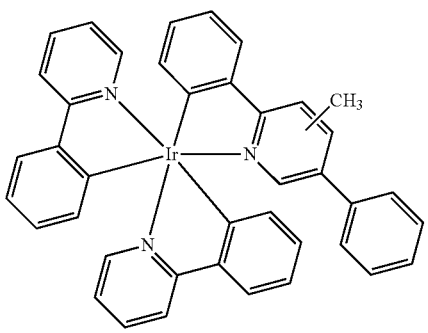
M-a3

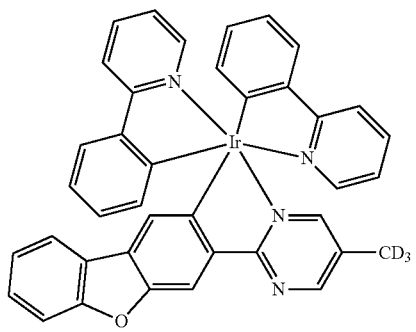
M-a4

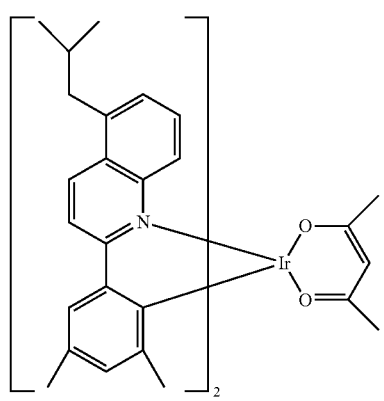
M-a1

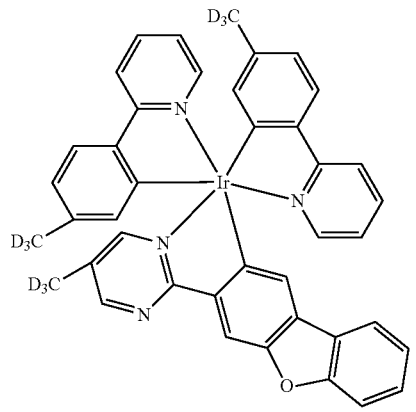
M-a5

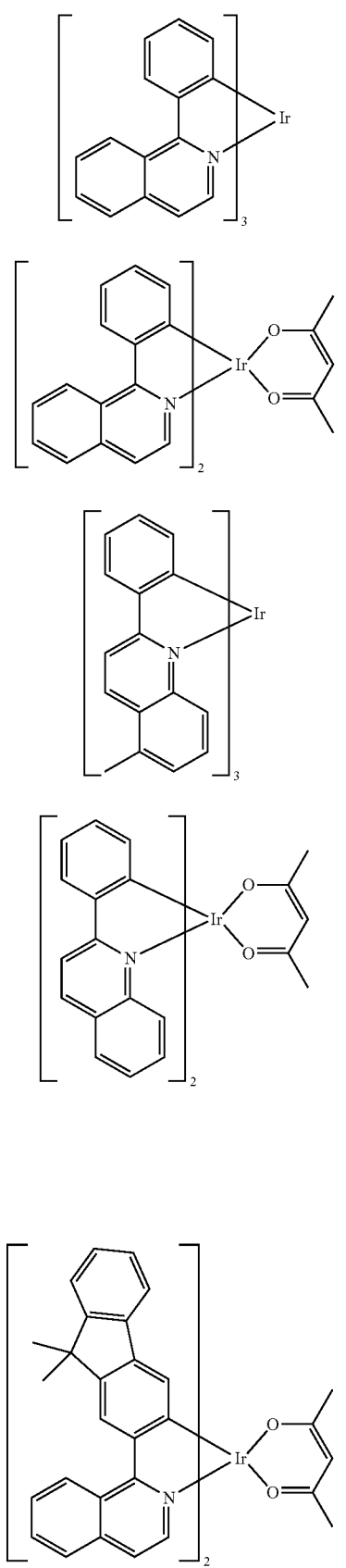
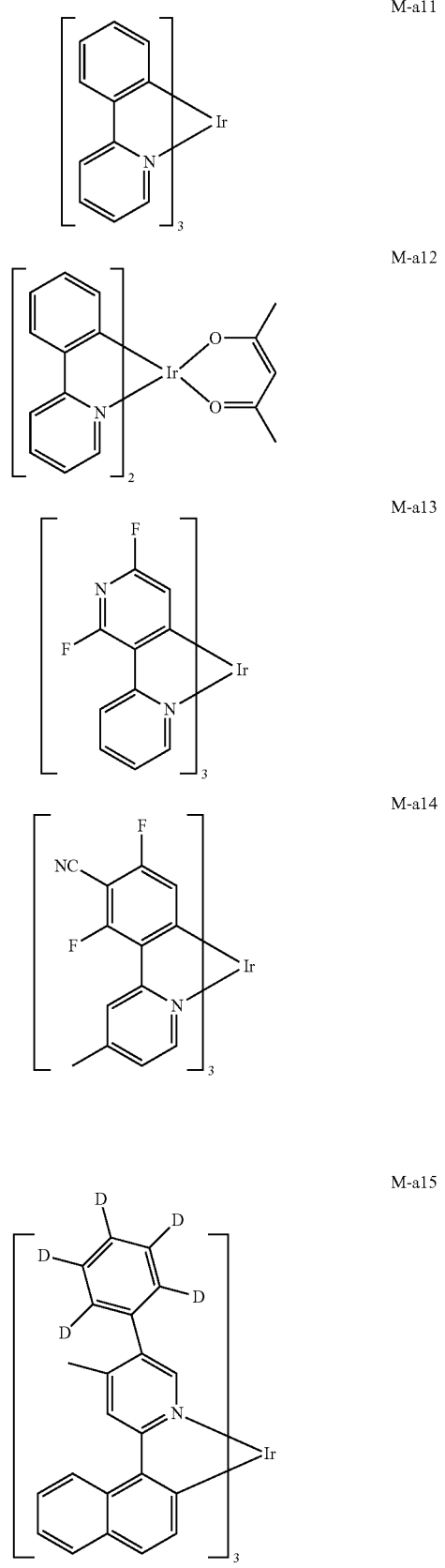

M-a16

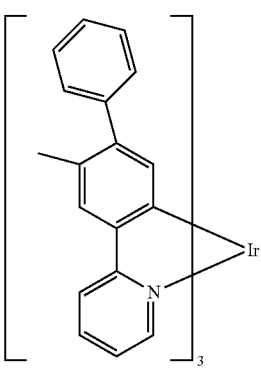

M-a17

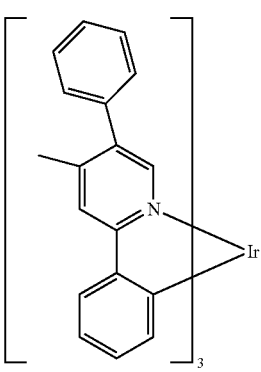

M-a18

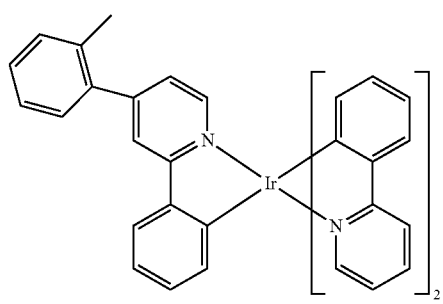

M-a19

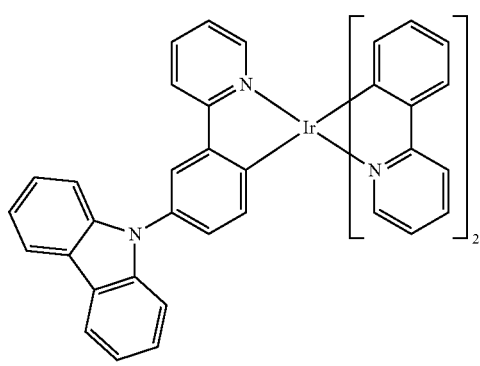

Compound M-a1 and Compound M-a2 may be used as a red dopant material, and Compound M-a3 to Compound M-a5 may be used as a green dopant material.

[Formula M-b]

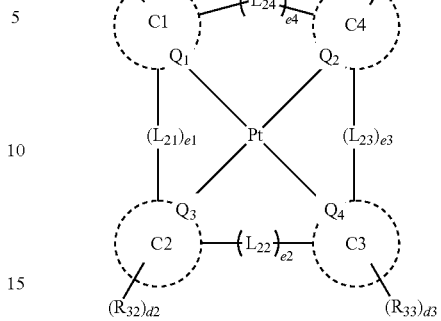

In Formula M-b, $Q_1$ to $Q_4$ may each independently be C or N, and $C_1$ to $C_4$ may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage, *—O—*, *—S—*,

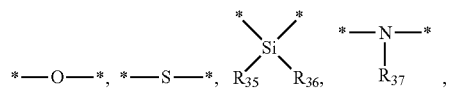

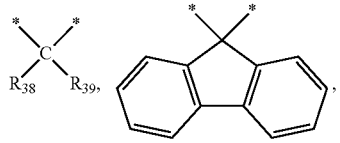

substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescence dopant or a green phosphorescence dopant.

The compound represented by Formula M-b may be represented by any one among the compounds below. However, the compounds below are examples, and the compound represented by Formula M-b is not limited to those represented by the compounds below.

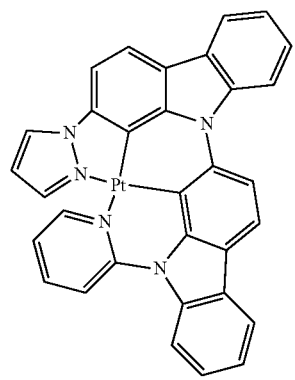
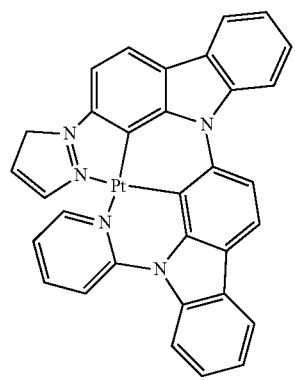
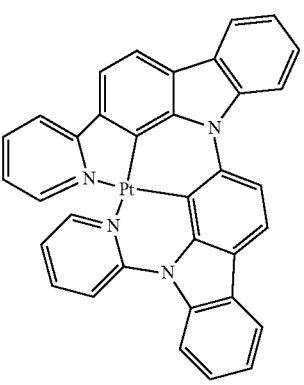
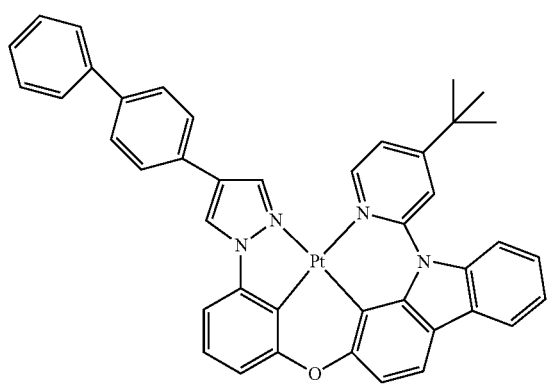
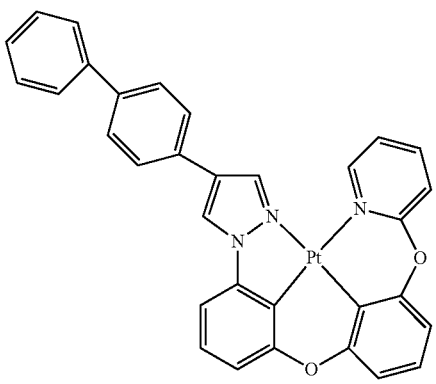
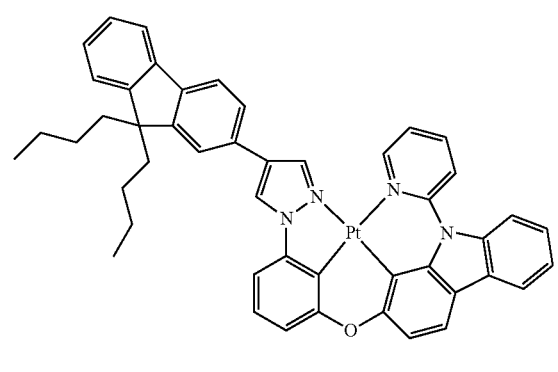
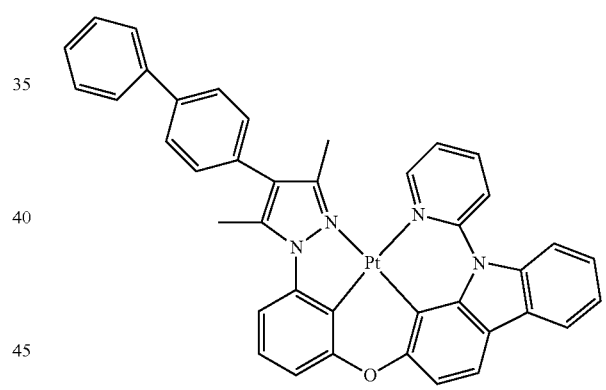
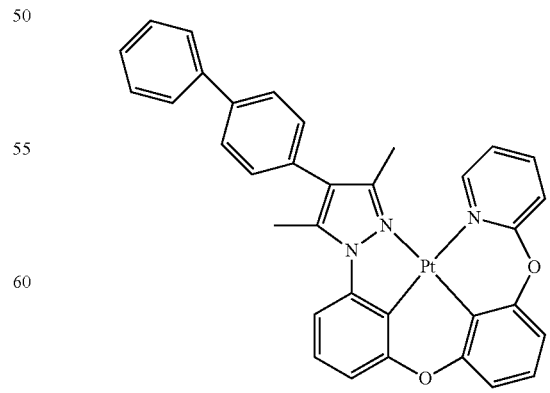

-continued

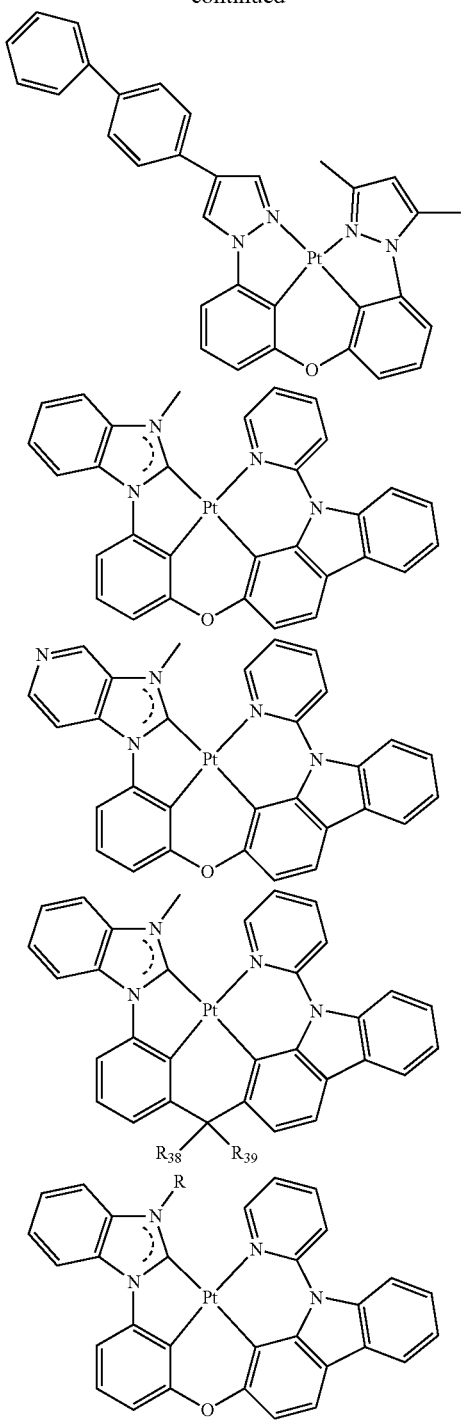

In the compounds, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one among Formula F-a to Formula F-c below. The compound represented by Formula F-a or Formula F-c below may be used as a fluorescence dopant material.

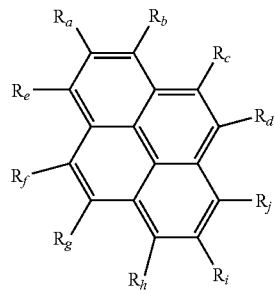

[Formula F-a]

In Formula F-a, two selected from among $R_a$ to $R_j$ may each independently be substituted with *—$NAr_1Ar_2$. The remainder of $R_a$ to $R_j$ which are not substituted with *—$NAr_1Ar_2$, may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ and $Ar_2$ may be a heteroaryl group containing O or S as a ring-forming atom.

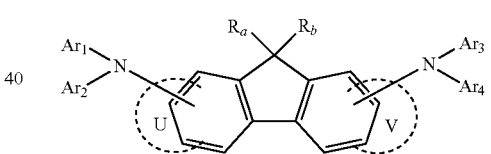

[Formula F-b]

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or V is 1, one ring forms a condensed ring at a part described as U or V, and when the number of U or V is 0, a ring described as U or V is not present. For example, when the number of U is 0 and the number of V is 1, or when the number of U is 1 and the number of V is 0, the condensed ring having a fluorene core of Formula F-b may be a four-ring cyclic compound. For example, when each number of U and V is 0, the condensed ring of Formula F-b may be a three-ring cyclic compound.

For example, when each number of U and V is 1, the condensed ring having a fluorene core of Formula F-b may be a five-ring cyclic compound.

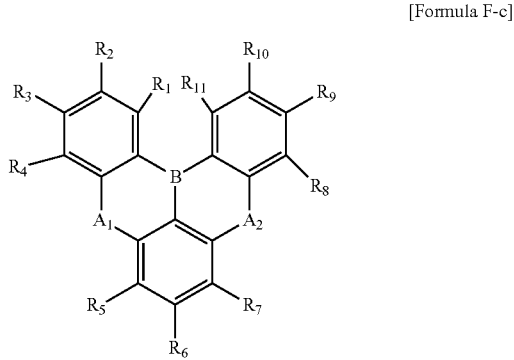

[Formula F-c]

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of an adjacent ring to form a condensed ring. For example, when $A_1$ and $A_2$ are each independently $N(R_m)$, $A_1$ may be bonded to $R_4$ or $R_5$ to form a ring. In an embodiment, $A_2$ may be bonded to $R_7$ or $R_8$ to form a ring.

In an embodiment, the emission layer EML may include, as a dopant material, styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzene mine (N-BDAVBi), 4,4'-bis[2-(4-(N,N-diphenylamino)phenyl)vinyl]biphenyl (DPAVBi), perylene and the derivatives thereof (e.g., 2,5,8, 11-tetra-t-butylperylene (TBP)), pyrene and the derivatives thereof (e.g., 1,1-dipyrene, 1,4-dipyrenylbenzene, 1,4-bis(N, N-diphenylamino)pyrene), etc.

The emission layer EML may include a phosphorescence dopant material. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescence dopant. For example, iridium(III) bis(4,6-difluorophenylpyridinato-N,C2')picolinate) (FIrpic), bis(2,4-difluorophenylpyridinato)-tetrakis(1-pyrazolyl)borate iridium(M) (Fir6), or platinum octaethyl porphyrin (PtOEP) may be used as a phosphorescence dopant. However, embodiments are not limited thereto.

The emission layer EML may include a quantum dot material. The core of the quantum dot may be selected from among a Group II-VI compound, a Group III-V compound, a Group IV-VI compound, a Group IV element, a Group IV compound, and a combination thereof.

A Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

A Group I-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in particles in a uniform concentration distribution, or may be present in the same particle in a partially different concentration distribution. In an embodiment, the quantum dot may have a core/shell structure in which one quantum dot surrounds another quantum dot. An interface between the core and the shell may have a concentration gradient in which the concentration of an element present in the shell becomes lower towards the center.

In an embodiment, a quantum dot may have the above-described core-shell structure including a core that includes a nanocrystal and a shell surrounding the core. The shell of the quantum dot may serve as a protection layer to prevent the chemical deformation of the core so as to maintain semiconductor properties, and/or as a charging layer to impart electrophoresis properties to the quantum dot. The shell may be a single layer or a multilayer. An interface between the core and the shell may have a concentration gradient in which the concentration of an element present in the shell becomes lower towards the center. An example of the shell of the quantum dot may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, COO, $Co_3O_4$, and NiO, or a ternary compound such as $MgAl_2O_4$, $CoFe_2O_4$, $NiFe_2O_4$, and $CoMn_2O_4$, but embodiments are not limited thereto.

The quantum dot may have a full width of half maximum (FWHM) of a light emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Color purity or color reproducibility may be improved in the above range. Light emitted through such a quantum dot may be emitted in all directions, and thus a wide viewing angle may be improved.

The form of the quantum dot is not particularly limited. For example, the quantum dot may have a spherical, a pyramidal, a multi-arm, or a cubic shape, or the quantum dot may be in the form of nanoparticles, nanotubes, nanowires, nanofibers, or nanoplate particles, etc.

A quantum dot may control the color of emitted light according to the particle size thereof and thus the quantum dot may have various light emission colors such as green, red, etc.

In each light emitting device ED of embodiments illustrated in FIGS. 3 to 6, the electron transport region ETR is provided on the emission layer EML. The electron transport region ETR may include at least one of the hole blocking layer HBL, the electron transport layer ETL, and the electron injection layer EIL, but embodiments are not limited thereto.

The electron transport region ETR may have a single layer formed of a single material, a single layer formed of different materials, or a multilayer structure including multiple layers formed of different materials.

For example, the electron transport region ETR may have a single layer structure of the electron injection layer EIL or the electron transport layer ETL, and may have a single layer structure formed of an electron injection material and an electron transport material. In an embodiment, the electron transport region ETR may have a single layer structure formed of different materials, or may have a structure in which an electron transport layer ETL/electron injection layer EIL and a hole blocking layer HBL/electron transport layer ETL/electron injection layer EIL are stacked in order from the emission layer EML, but embodiments are not limited thereto. A thickness of the electron transport region ETR may be, for example, in a range of about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

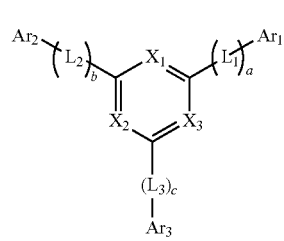

[Formula ET-1]

In Formula ET-1, at least one among $X_1$ to $X_3$ may be N, and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula ET-1, when a to c are an integer of 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum (Alq3), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl) anthracene (ADN), 1,3-Bis[3,5-di(pyridin-3-yl)phenyl] benzene (BmPyPhB), or a mixture thereof.

The electron transport region ETR may include a metal halide such as LiF, NaCl, CsF, RbCl, RbI, CuI, or KI, a lanthanide metal such as Yb, and a co-deposited material of a metal halide and a lanthanide metal. For example, the electron transport region ETR may include KI:Yb, RbI:Yb, etc. as a co-deposited material. The electron transport region ETR may be formed using a metal oxide such as $Li_2O$ or BaO, or 8-hydroxyl-lithium quinolate (Liq), etc., but embodiments are not limited thereto. The electron transport region ETR may also be formed of a mixture material of an electron transport material and an insulating organometallic salt. The organometallic salt may be a material having an energy band gap of about 4 eV or more. For example, the organometallic salt may include metal acetates, metal benzoates, metal acetoacetates, metal acetylacetonates, or metal stearates.

The electron transport region ETR may further include at least one of 2,9-dimethyl-4,7-diphenyl-1,10-phenanthroline (BCP) and 4,7-diphenyl-1,10-phenanthroline (Bphen) in addition to the above-described materials, but embodiments are not limited thereto.

The electron transport region ETR may include the above-described compounds of the hole transport region in at least one of the electron injection layer EIL, the electron transport layer ETL, and the hole blocking layer HBL.

When the electron transport region ETR includes an electron transport layer ETL, the electron transport layer ETL may have a thickness in a range of about 100 Å to about 1,000 Å. For example, the electron transport layer ETL may have a thickness in a range of about 150 Å to about 500 Å. If the thickness of the electron transport layer ETL satisfies the aforementioned range, satisfactory electron transport characteristics may be obtained without a substantial increase in driving voltage. When the electron transport region ETR includes an electron injection layer EIL, the electron injection layer EIL may have a thickness in a range of about 1 Å to about 100 Å. For example, the electron injection layer EIL may have a thickness in a range of about 3 Å to about 90 Å. If the thickness of the electron injection layer EIL satisfies the above-described range, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is s transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). In another embodiment, the second electrode EL2 may have a multi-layer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, or the like.

Although not shown in the drawings, the second electrode EL2 may be electrically connected to an auxiliary electrode. If the second electrode EL2 is electrically connected to an auxiliary electrode, the resistance of the second electrode EL2 may be decreased.

The light emitting device ED of an embodiment may further include a capping layer CPL that is disposed on the second electrode EL2. The capping layer CPL may be a single layer or a multilayer.

In an embodiment, the capping layer CPL may include an organic layer or an inorganic layer. For example, when the capping layer CPL includes an inorganic material, the inorganic material may include an alkaline metal compound such as LiF, an alkaline earth metal compound such as $MgF_2$, SiON, $SiN_x$, SiOy, etc.

For example, when the capping layer CPL includes an organic material, the organic material may include α-NPD, NPB, TPD, m-MTDATA, Alq3, CuPc, N4,N4,N4',N4'-tetra (biphenyl-4-yl)biphenyl-4,4'-diamine (TPD15), 4,4',4"-tris (carbazol-9-yl)triphenylamine (TCTA), etc., or an epoxy resin, or acrylate such as methacrylate. However, embodiments are not limited thereto, and the capping layer CPL may include at least one among Compounds P1 to P5 below:

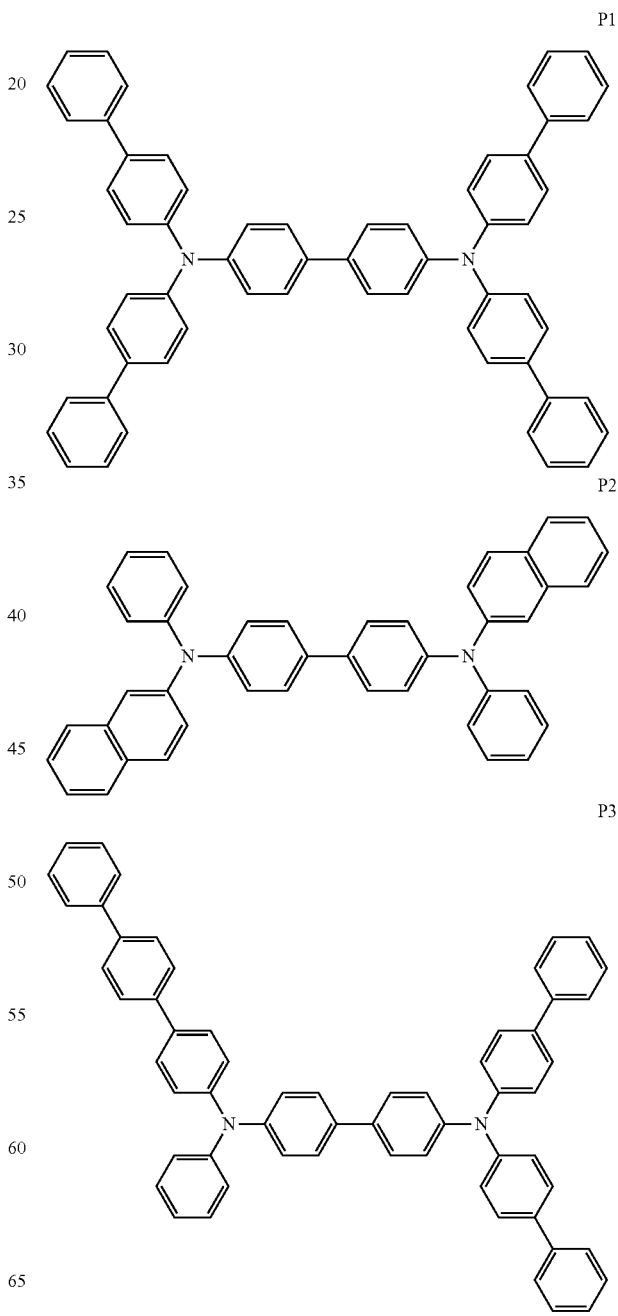

-continued

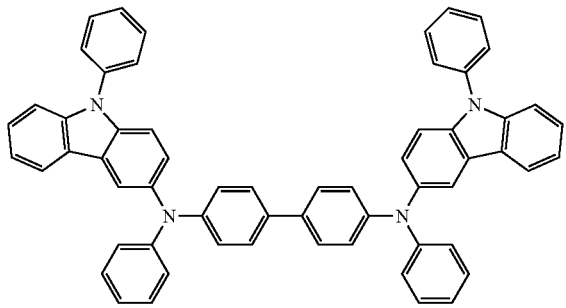
P4

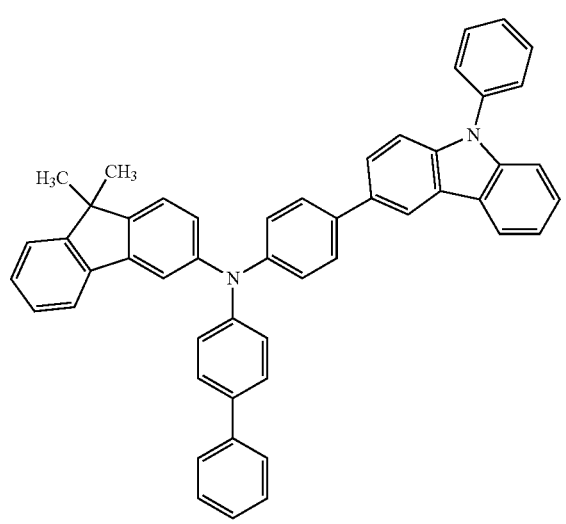
P5

A refractive index of the capping layer CPL may be equal to or greater than about 1.6. In an embodiment, the refractive index of the capping layer CPL may be equal to or greater than about 1.6 with respect to light in a wavelength range of about 550 nm to about 660 nm.

Figure 7:
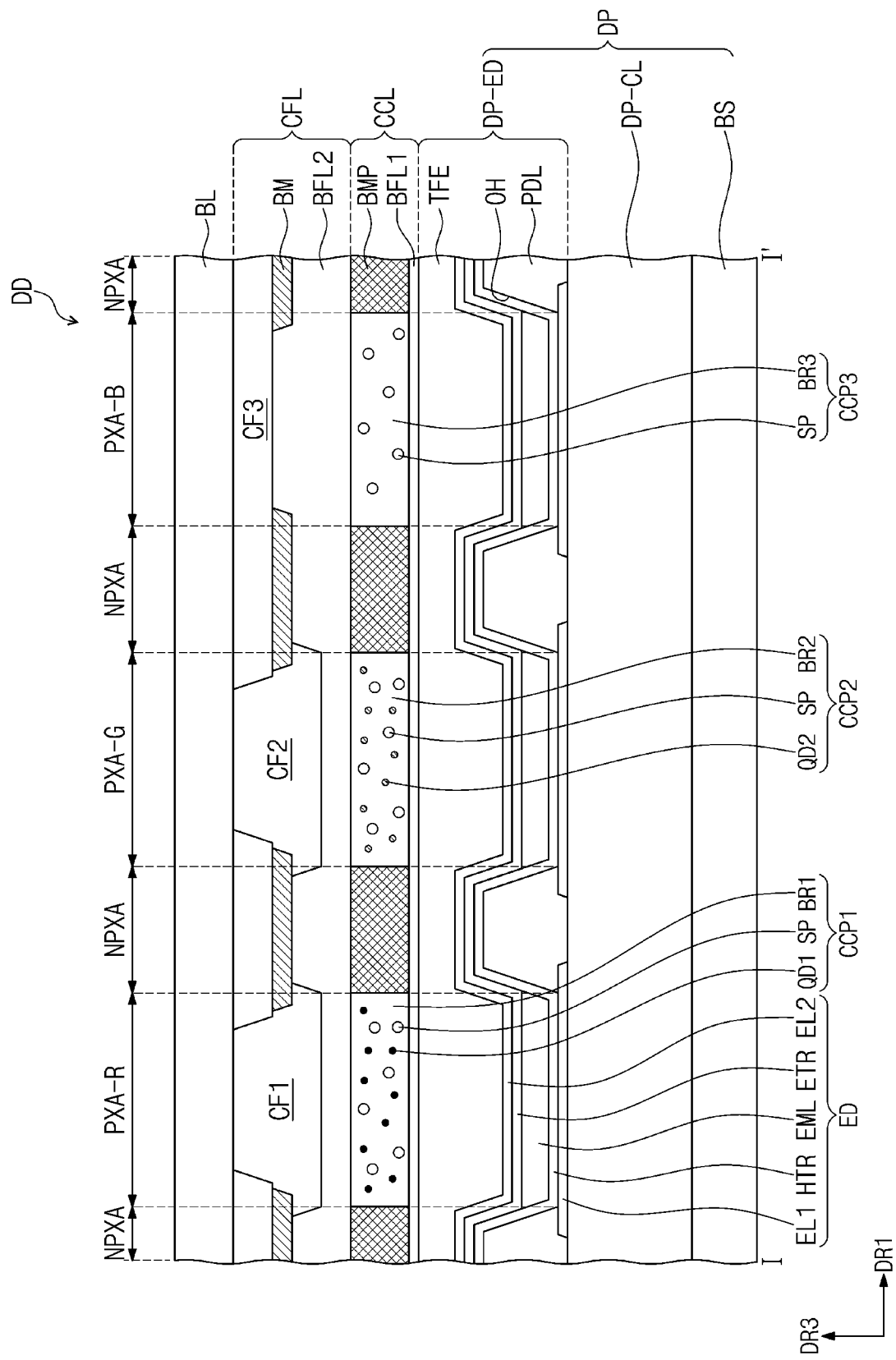
FIG. 7 is a schematic cross-sectional view illustrating a display apparatus according to an embodiment.
Figure 8:
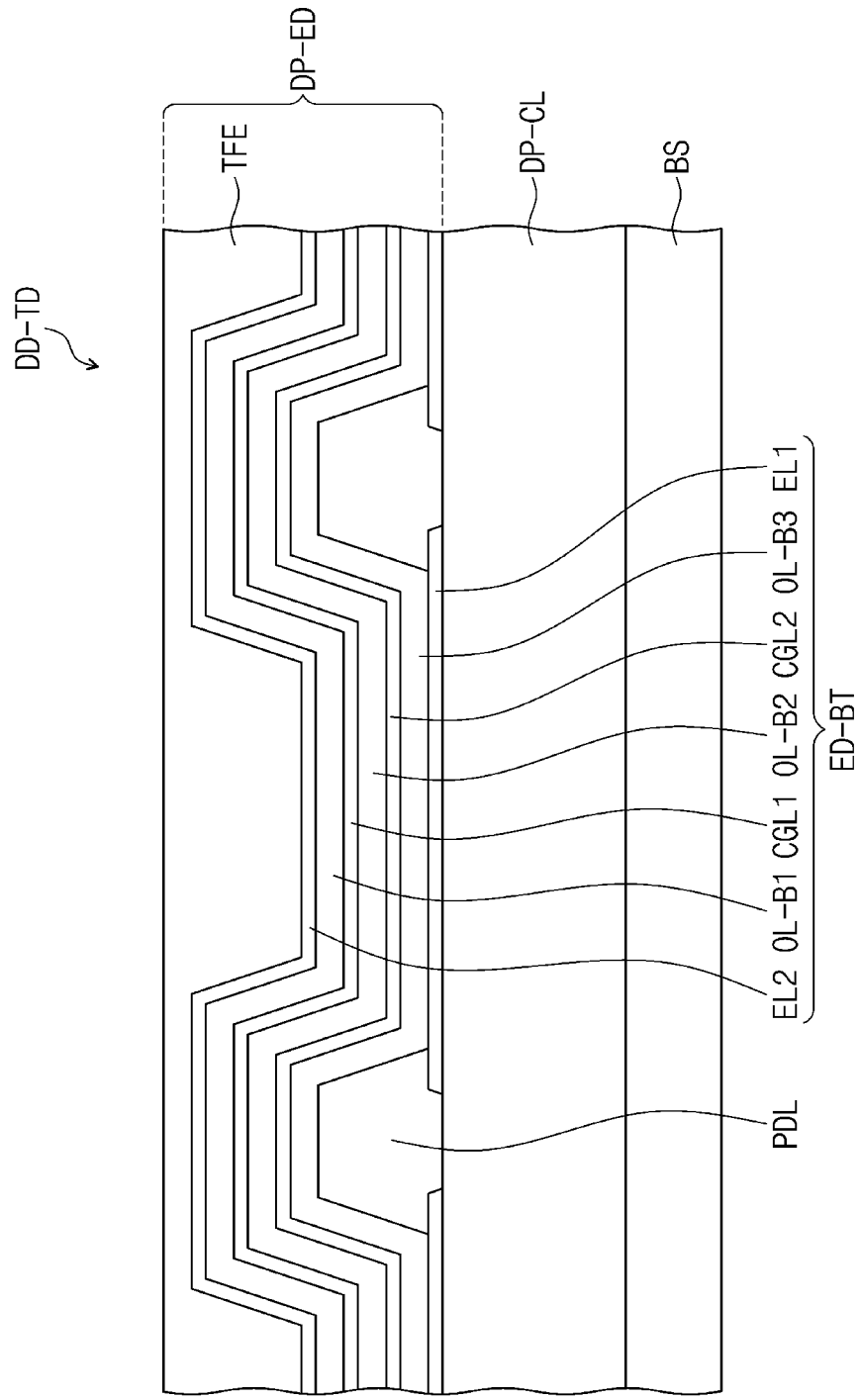
FIG. 8 is a schematic cross-sectional view illustrating a display apparatus according to an embodiment.

FIGS. 7 and 8 each are a schematic cross-sectional view of a display apparatus according to an embodiment. Hereinafter, in describing the display apparatus of an embodiment with reference to FIGS. 7 and 8, the duplicated features which have been described in FIGS. 1 to 6 are not described again, but their differences will be described.

Referring to FIG. 7, the display apparatus DD according to an embodiment may include a display panel DP including a display device layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The structures of the light emitting devices of FIGS. 3 to 6 as described above may be applied to the structure of the light emitting device ED shown in FIG. 7.

Referring to FIG. 7, the emission layer EML may be disposed in an opening OH defined in a pixel defining film PDL. For example, the emission layer EML which is divided by the pixel defining film PDL and provided corresponding to each of the light emitting regions PXA-R, PXA-G, and PXA-B may emit light in a same wavelength range. In the display apparatus DD of an embodiment, the emission layer EML may emit blue light. Although not shown in the drawings, in an embodiment, the emission layer EML may be provided as a common layer for all light emitting regions PXA-R, PXA-G, and PXA-B.

The light control layer CCL may be disposed on the display panel DP. The light control layer CCL may include a light conversion body. The light conversion body may include a quantum dot, a phosphor, or the like. The light conversion body may convert the wavelength of a light provided to the light conversion body and then emit the converted light. For example, the light control layer CCL may be a layer containing a quantum dot or may be a layer containing a phosphor.

The light control layer CCL may include light control units CCP1, CCP2, and CCP3. The light control units CCP1, CCP2, and CCP3 may be spaced apart from one another.

Referring to FIG. 7, divided patterns BMP may be disposed between the light control units CCP1, CCP2, and CCP3 which are spaced apart from each other, but embodiments are not limited thereto. FIG. 7 illustrates that the divided patterns BMP do not overlap the light control units CCP1, CCP2, and CCP3, but at least a portion of the edges of the light control units CCP1, CCP2, and CCP3 may overlap the divided patterns BMP.

The light control layer CCL may include a first light control unit CCP1 containing a first quantum dot QD1 which converts first color light provided from the light emitting device ED into second color light, a second light control unit CCP2 containing a second quantum dot QD2 which converts the first color light into third color light, and a third light control unit CCP3 which transmits the first color light.

In an embodiment, the first light control unit CCP1 may provide red light that is the second color light, and the second light control unit CCP2 may provide green light that is the third color light. The third light control unit CCP3 may provide by transmitting blue light that is the first color light provided in the light emitting device ED. For example, the first quantum dot QD1 may be a red quantum dot, and the second quantum dot QD2 may be a green quantum dot. The same description above regarding quantum dots may be applied with respect to the quantum dots QD1 and QD2.

In an embodiment, the light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include any quantum dot but include the scatterer SP.

The scatterer SP may be inorganic particles. For example, the scatterer SP may include at least one of $TiO_2$, ZnO, $Al_2O_3$, $SiO_2$, and hollow silica. The scatterer SP may include any one of $TiO_2$, ZnO, $Al_2O_3$, $SiO_2$, or hollow silica, or may be a mixture of at least two materials selected from among $TiO_2$, ZnO, $Al_2O_3$, $SiO_2$, and hollow silica.

The first light control unit CCP1, the second light control unit CCP2, and the third light control unit CCP3 may each include base resins $BR_1$, $BR_2$, and $BR_3$ in which the quantum dots QD1 and QD2 and the scatterer SP are dispersed. In an embodiment, the first light control unit CCP1 may include the first quantum dot QD1 and the scatterer SP dispersed in a first base resin $BR_1$, the second light control unit CCP2 may include the second quantum dot QD2 and the scatterer SP dispersed in a second base resin $BR_2$, and the third light control unit CCP3 may include the scatterer SP dispersed in a third base resin $BR_3$. The base resins $BR_1$, $BR_2$, and $BR_3$ are media in which the quantum dots QD1 and QD2 and the scatterer SP are dispersed, and may be formed of various resin compositions, which may be generally referred to as a binder. For example, the base resins $BR_1$, $BR_2$, and $BR_3$ may be acrylic-based resins, urethane-based resins, silicone-based resins, epoxy-based resins, etc. The base resins $BR_1$, $BR_2$, and $BR_3$ may be transparent resins. In an embodiment, the first base resin $BR_1$, the second base resin $BR_2$, and the third base resin $BR_3$ each may be the same as or different from each other.

The light control layer CCL may include a barrier layer BFL1. The barrier layer BFL1 may serve to prevent the penetration of moisture and/or oxygen (hereinafter, referred to as 'moisture/oxygen'). The barrier layer BFL1 may be disposed on the light control units CCP1, CCP2, and CCP3 to block the light control units CCP1, CCP2 and CCP3 from being exposed to moisture/oxygen. The barrier layer BFL1 may cover the light control units CCP1, CCP2, and CCP3. The barrier layer BFL1 may be provided between the light control units CCP1, CCP2, and CCP3 and the color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. The barrier layers BFL1 and BFL2 may further include an organic film. The barrier layers BFL1 and BFL2 may be formed of a single layer or of multiple layers.

In the display apparatus DD of an embodiment, the color filter layer CFL may be disposed on the light control layer CCL. For example, the color filter layer CFL may be directly disposed on the light control layer CCL. In an embodiment, the barrier layer BFL2 may be omitted.

The color filter layer CFL may include a light shielding unit BM and filters CF1, CF2, and CF3. The color filter layer CFL may include a first filter CF1 that transmits the second color light, a second filter CF2 that transmits the third color light, and a third filter CF3 that transmits the first color light. For example, the first filter CF1 may be a red filter, the second filter CF2 may be a green filter, and the third filter CF3 may be a blue filter. The filters CF1, CF2, and CF3 may each include a polymeric photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may not be separated but may be provided as one filter.

The light shielding unit BM may be a black matrix. The light shielding unit BM may include an organic light shielding material or an inorganic light shielding material containing a black pigment or dye. The light shielding unit BM may prevent light leakage, and may separate boundaries between the adjacent filters CF1, CF2, and CF3. In an embodiment, the light shielding unit BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may be a member which provides a base surface in which the color filter layer CFL, the light control layer CCL, and the like are disposed. The base substrate BL may be a glass substrate, a metal substrate, a plastic substrate, etc. However, embodiments are not limited thereto, and the base substrate BL may be an inorganic layer, an organic layer, or a composite material layer. Although not shown in the drawings, in an embodiment, the base substrate BL may be omitted.

FIG. 8 is a schematic cross-sectional view illustrating a part of a display apparatus according to an embodiment. FIG. 8 illustrates a schematic cross-sectional view of a part corresponding to the display panel DP of FIG. 7. In the display device DD-TD of an embodiment, the light emitting device ED-BT may include light emitting structures OL-B1, OL-B2, and OL-B3. The light emitting device ED-BT may include a first electrode EL1 and a second electrode EL2 which face each other, and the light emitting structures OL-B1, OL-B2, and OL-B3 may be sequentially stacked in a thickness direction between the first electrode EL1 and the second electrode EL2. The light emitting structures OL-B1, OL-B2, and OL-B3 may each include an emission layer EML (FIG. 7) and a hole transport region HTR and an electron transport region ETR disposed with the emission layer EML (FIG. 7) therebetween.

For example, the light emitting device ED-BT included in the display apparatus DD-TD of an embodiment may be a light emitting device having a tandem structure and including multiple emission layers.

In an embodiment illustrated in FIG. 8, each light emitted from each of the light emitting structures OL-B1, OL-B2, and OL-B3 may be blue light. However, embodiments are not limited thereto, and the light emitted from each of the light emitting structures OL-B1, OL-B2, and OL-B3 may be in a wavelength range different from each other. For example, the light emitting device ED-BT including the light emitting structures OL-B1, OL-B2, and OL-B3 which emit light in a wavelength range different from each other may emit white light.

Charge generation layers CGL1 and CGL2 may be disposed between the neighboring light emitting structures OL-B1, OL-B2, and OL-B3. The charge generation layers CGL1 and CGL2 may include a p-type charge generation layer and/or an n-type charge generation layer.

Hereinafter, with reference to Examples and Comparative Examples, a compound according to an embodiment and a light emitting device of an embodiment will be described in detail. The Examples shown below are illustrated only for the understanding of the disclosure, and the scope of the disclosure is not limited thereto.

EXAMPLES

1. Synthesis of Amine Compound of One Example

First, a synthesis method of the amine compound according to an embodiment will be described in detail by illustrating synthetic methods of Compounds 1, 2, 3, 8, 22, 51, and 82. In the following descriptions, the synthesis method of the amine compound is provided as an example, but the synthesis method according to an embodiment is not limited to Examples below.

(1) Synthesis of Compound 1

Amine Compound 1 according to an example may be synthesized by, for example, the steps shown in Reaction Scheme 1-1 to Reaction Scheme 1-4 below.

Synthesis of Intermediate A

Intermediate A was synthesized by Reaction Scheme 1-1 below:

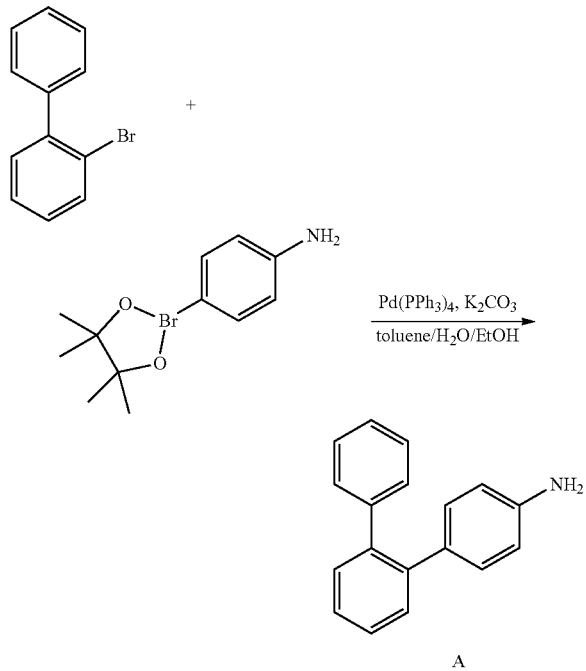

In an argon atmosphere, in a 2 L three-neck flask, 2-bromobiphenyl (35.0 g), 4-(4,4,5,5-tetramethyl-1,3,2-dioxaborolan-2-yl)aniline (49.3 g), tetrakis(triphenylphosphine)palladium(0) (Pd(PPh$_3$)$_4$, 8.7 g), and potassium carbonate (K$_2$CO$_3$, 41.5 g) were added and dissolved in a mixed solvent of toluene, water, and ethanol (10:2:1, 600 mL), and the mixture was heated and stirred at about 80° C. for about 18 hours. The resultant mixture was extracted with dichloromethane (CH$_2$Cl$_2$) by adding water to obtain organic layers. The obtained organic layers were combined and dried over magnesium sulfate (MgSO$_4$), and the solvent was removed by distillation under reduced pressure. The resulting crude product was purified by silica gel column chromatography to obtain Intermediate A (24.8 g, yield: 67%). The molecular weight of Intermediate A measured by FAB-MS measurement was 245.

Synthesis of Intermediate C

Intermediate C was synthesized by Reaction Scheme 1-2 below:

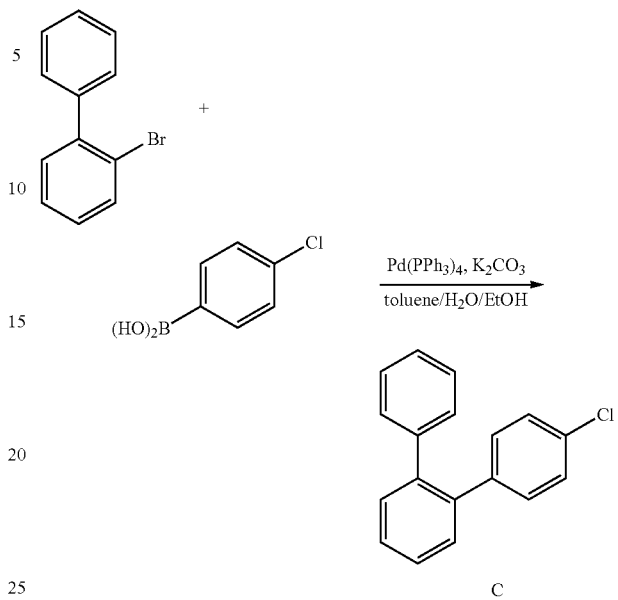

In an argon atmosphere, in a 1 L three-neck flask, 2-bromobiphenyl (20.0 g), 4-chlorophenylboronic acid (13.4 g), Pd(PPh$_3$)$_4$ (9.9 g), and K$_2$CO$_3$ (23.7 g) were added and dissolved in a mixed solvent of toluene, water, and ethanol (10:2:1, 400 mL), and the mixture was heated and stirred at about 80° C. for about 12 hours. The resultant mixture was extracted with CH$_2$Cl$_2$ by adding water to obtain organic layers. The obtained organic layers were combined and dried over MgSO$_4$, and the solvent was removed by distillation under reduced pressure. The resulting crude product was purified by silica gel column chromatography to obtain Intermediate C (13.6 g, yield: 60%). The molecular weight of Intermediate C measured by FAB-MS measurement was 264.

Synthesis of Intermediate G

Intermediate G was synthesized by Reaction Scheme 1-3 below:

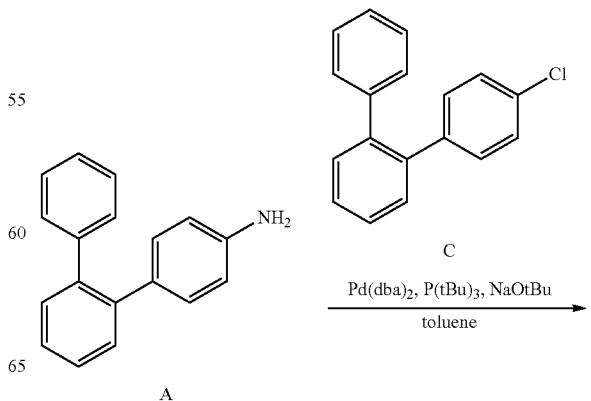

89
-continued

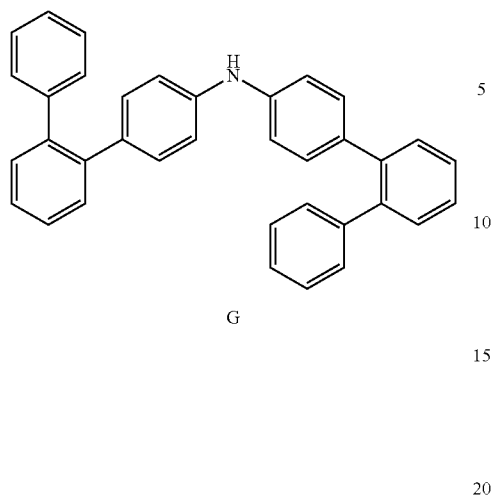

G

90
-continued

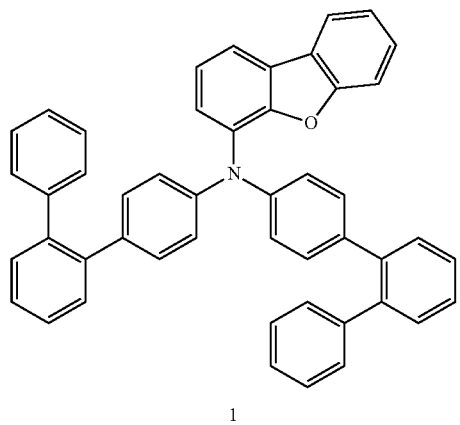

1

In an argon atmosphere, in a 1 L three-neck flask, Intermediate A (15.0 g), Intermediate C (16.2 g), bis(dibenzylideneacetone)palladium(0) (Pd(dba)$_2$, 3.5 g), sodium tert-butoxide (NaOtBu, 5.9 g) were added and dissolved in toluene (300 mL), and tri-tert-butylphosphine (P(tBu)$_3$, 2.0 M in toluene, 6.0 mL) was added thereto, and the mixture was heated under reflux for about 6 hours. The resultant mixture was extracted with CH$_2$Cl$_2$ by adding water to obtain organic layers. The obtained organic layers were combined and dried over MgSO$_4$, and the solvent was removed by distillation under reduced pressure. The resulting crude product was purified by silica gel column chromatography to obtain Intermediate G (17.9 g, yield: 62%). The molecular weight of Intermediate G measured by FAB-MS measurement was 473.

Synthesis of Compound 1

Amine Compound 1 was synthesized by Reaction Scheme 1-4 below:

In an argon atmosphere, in a 500 mL three-neck flask, Intermediate G (5.0 g), 4-bromodibenzofuran (2.6 g), Pd(dba)$_2$ (0.6 g), and NaOtBu (1.1 g) were added and dissolved in toluene (50 mL), and P(tBu)$_3$ (2.0 M in toluene, 1.0 mL) was added thereto, and the mixture was heated under reflux for about 6 hours. The resultant mixture was extracted with CH$_2$Cl$_2$ by adding water to obtain organic layers. The obtained organic layers were combined and dried over MgSO$_4$, and the solvent was removed by distillation under reduced pressure. The resulting crude product was purified by silica gel column chromatography to obtain Compound 1 (5.81 g, yield: 86%). The molecular weight of Compound 1 measured by FAB-MS measurement was 639.

(2) Synthesis of Compound 2

Amine Compound 2 according to an example may be synthesized by, for example, the steps shown in Reaction Scheme 2 below:

[Reaction Scheme 1-4]

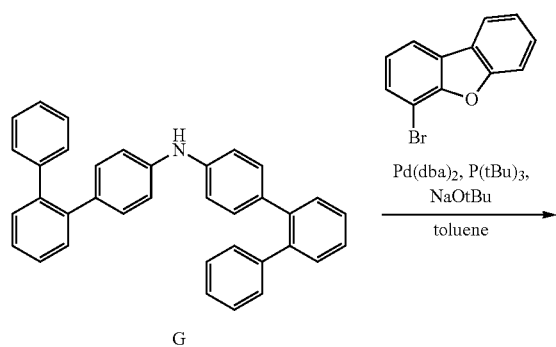

[Reaction Scheme 2]

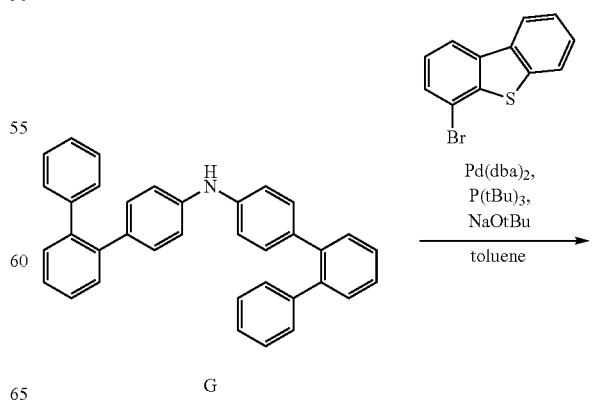

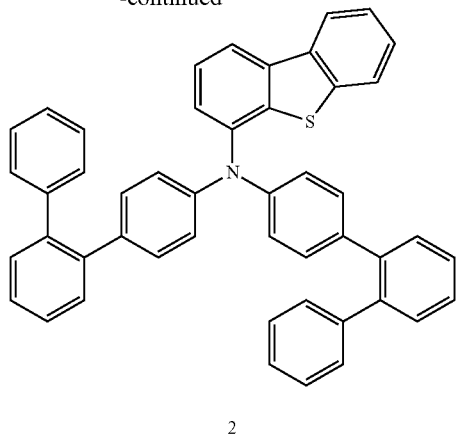

2

Compound 2 (5.7 g, yield: 83%) was obtained in the same manner as the synthesis of Compound 1 by using 4-bromodibenzothiophene (2.8 g) instead of 4-bromodibenzofuran (2.6 g). The molecular weight of Compound 2 measured by FAB-MS measurement was 655.

(3) Synthesis of Compound 3

Amine Compound 3 according to an example may be synthesized by, for example, the steps shown in Reaction Scheme 3 below:

[Reaction Scheme 3]

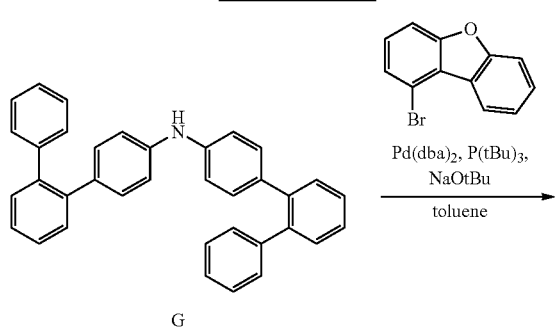

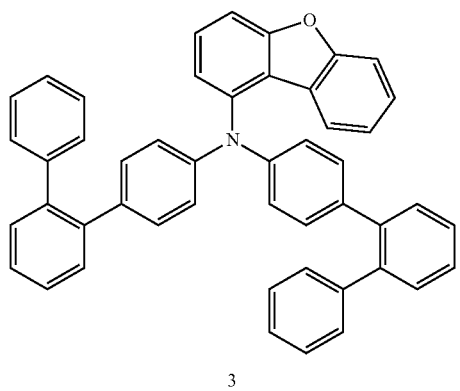

3

Compound 3 (5.5 g, yield: 82%) was obtained in the same manner as the synthesis of Compound 1 by using 1-bromodibenzofuran (2.6 g) instead of 4-bromodibenzofuran (2.6 g). The molecular weight of Compound 3 measured by FAB-MS measurement was 639.

(4) Synthesis of Compound 8

Amine Compound 8 according to an example may be synthesized by, for example, the steps shown in Reaction Scheme 4-1 to Reaction Scheme 4-4 below:

Synthesis of Intermediate E

Intermediate E was synthesized by Reaction Scheme 4-1 below:

[Reaction Scheme 4-1]

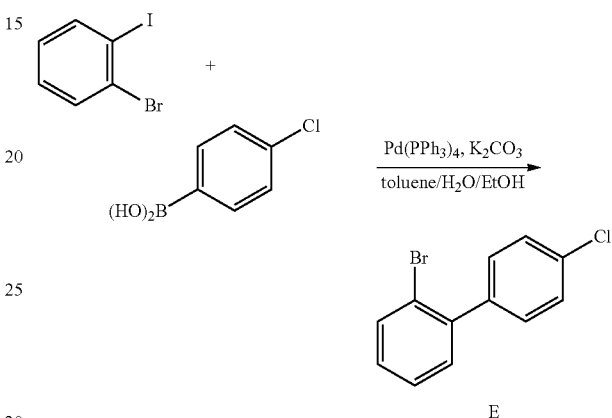

E

In an argon atmosphere, in a 1 L three-neck flask, 1-bromo-2-iodobenzene (25.0 g), 4-chlorophenylboronic acid (13.8 g), Pd(PPh$_3$)$_4$ (5.1 g), and K$_2$CO$_3$ (24.4 g) were added and dissolved in a mixed solvent of toluene, water, and ethanol (10:2:1, 350 mL), and the mixture was heated and stirred at about 80° C. for about 4 hours. The resultant mixture was extracted with CH$_2$Cl$_2$ by adding water to obtain organic layers. The obtained organic layers were combined and dried over MgSO$_4$, and the solvent was removed by distillation under reduced pressure. The resulting crude product was purified by silica gel column chromatography to obtain Intermediate E (22.1 g, yield: 94%). The molecular weight of Intermediate E measured by FAB-MS measurement was 267.

Synthesis of Intermediate F

Intermediate F was synthesized by Reaction Scheme 4-2 below:

[Reaction Scheme 4-2]

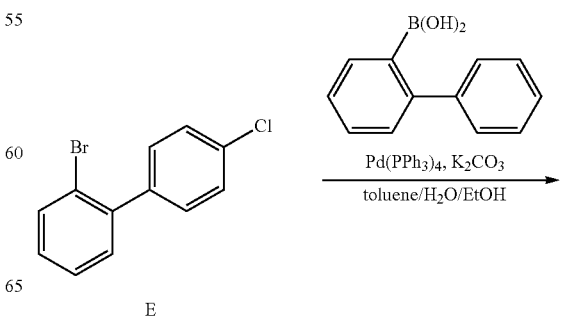

E

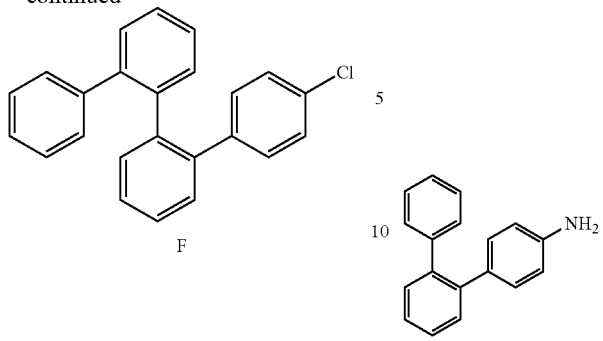

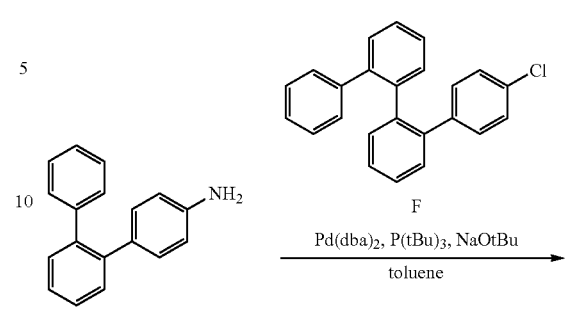

[Reaction Scheme 4-3]

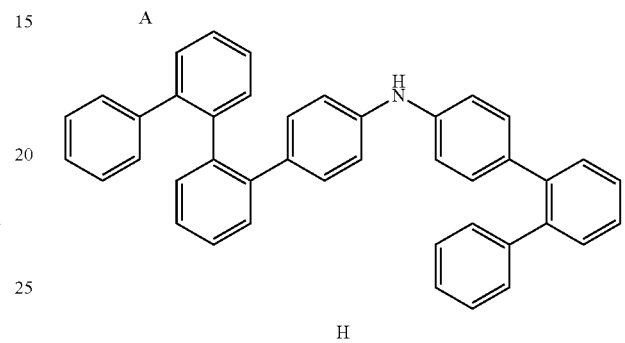

In an argon atmosphere, in a 1 L three-neck flask, Intermediate E (15.0 g), 2-biphenylboronic acid (11.1 g), Pd(PPh$_3$)$_4$ (6.5 g), and K$_2$CO$_3$ (15.5 g) were added and dissolved in a mixed solvent of toluene, water, and ethanol (10:2:1, 280 mL), and the mixture was heated and stirred at about 80° C. for about 10 hours. The resultant mixture was extracted with CH$_2$Cl$_2$ by adding water to obtain organic layers. The obtained organic layers were combined and dried over MgSO$_4$, and the solvent was removed by distillation under reduced pressure. The resulting crude product was purified by silica gel column chromatography to obtain Intermediate F (12.4 g, yield: 65%). The molecular weight of Intermediate F measured by FAB-MS measurement was 340.

Synthesis of Intermediate H

Intermediate H was synthesized by Reaction Scheme 4-3 below:

Intermediate H (6.6 g, yield: 59%) was obtained in the same manner as the synthesis of Intermediate G by using Intermediate A (5.0 g) instead of Intermediate A (15.0 g) and Intermediate F (6.9 g) instead of Intermediate C (16.2 g). The molecular weight of Intermediate H measured by FAB-MS measurement was 549.

Synthesis of Compound 8

Amine Compound 8 was synthesized by Reaction Scheme 4-4 below:

[Reaction Scheme 4-4]

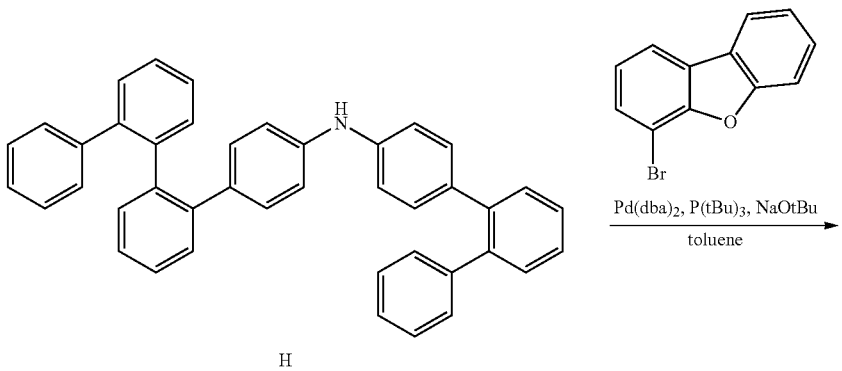

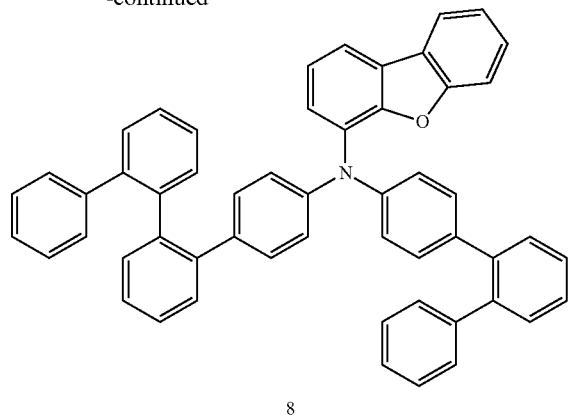

8

Compound 8 (5.3 g, yield: 82%) was obtained in the same manner as the synthesis of Compound 1 by using Intermediate H (5.0 g) instead of Intermediate G (5.0 g) and 4-bromodibenzofuran (2.3 g) instead of 4-bromodibenzofuran (2.6 g). The molecular weight of Compound 8 measured by FAB-MS measurement was 715.

(5) Synthesis of Compound 22

Amine Compound 22 according to an example may be synthesized by, for example, the steps shown in Reaction Scheme 5-1 to Reaction Scheme 5-3 below.

Synthesis of Intermediate D

Intermediate D was synthesized by Reaction Scheme 5-1 below:

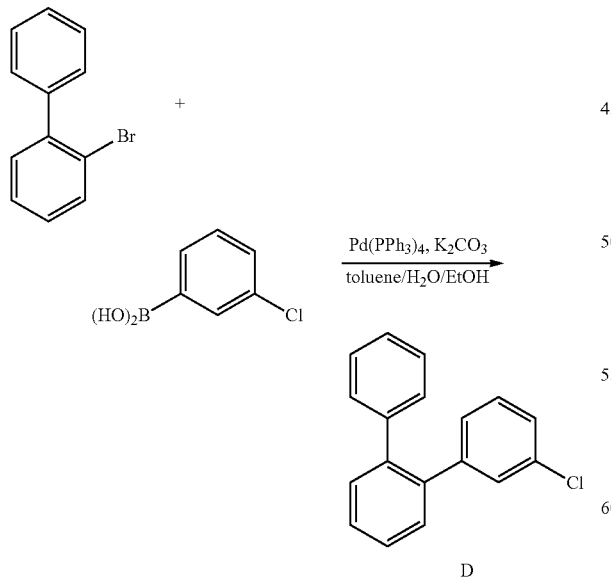

Intermediate D (13.2 g, yield: 58%) was obtained in the same manner as the synthesis of Intermediate C by using 2-bromobiphenyl (20.0 g) and 3-chlorophenylboronic acid (13.4 g). The molecular weight of Intermediate D measured by FAB-MS measurement was 264.

Synthesis of Intermediate J

Intermediate J was synthesized by Reaction Scheme 5-2 below:

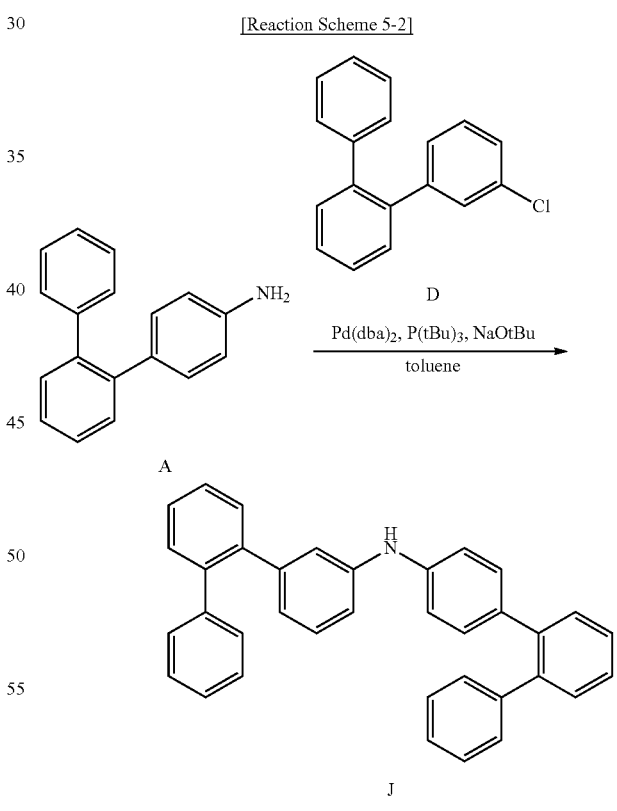

Intermediate J (5.8 g, yield: 60%) was obtained in the same manner as the synthesis of Intermediate G by using Intermediate A (5.0 g) instead of Intermediate A (15.0 g) and Intermediate D (5.4 g) instead of Intermediate C (16.2 g). The molecular weight of Intermediate J measured by FAB-MS measurement was 473.

Synthesis of Compound 22

Amine Compound 22 was synthesized by Reaction Scheme 5-3 below:

[Reaction Scheme 5-3]

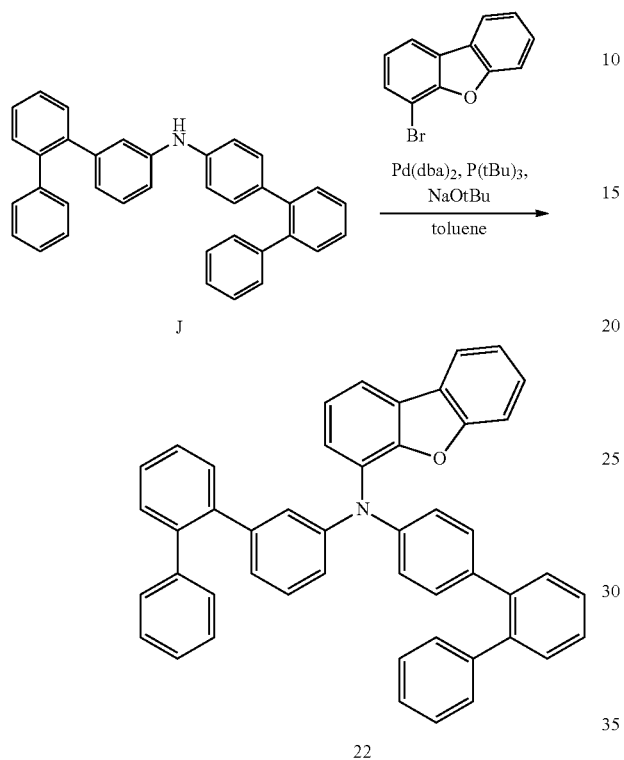

Compound 22 (5.4 g, yield: 80%) was obtained in the same manner as the synthesis of Compound 1 by using Intermediate J (5.0 g) instead of Intermediate G (5.0 g). The molecular weight of Compound 22 measured by FAB-MS measurement was 639.

(6) Synthesis of Compound 51

Amine Compound 51 according to an example may be synthesized by, for example, the steps shown in Reaction Scheme 6-1 to Reaction Scheme 6-3 below:

Synthesis of Intermediate B

Intermediate B was synthesized by Reaction Scheme 6-1 below:

[Reaction Scheme 6-1]

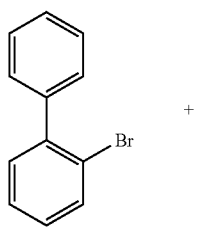

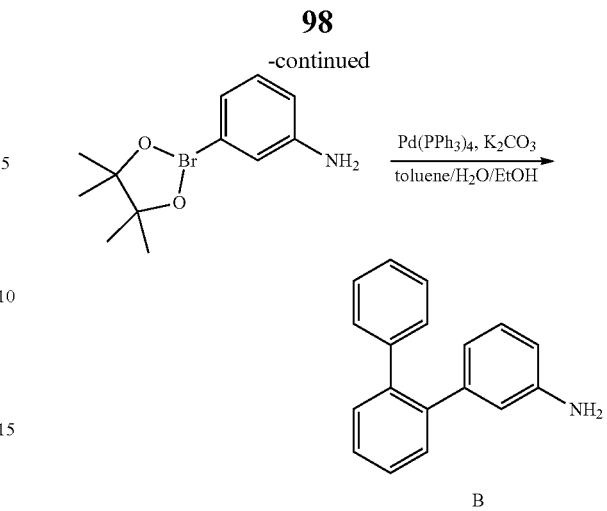

Intermediate B (13.7 g, yield: 65%) was obtained in the same manner as the synthesis of Intermediate A by using 2-bromobiphenyl (20.0 g) instead of 2-bromobiphenyl (35.0 g) and 3-(4,4,5,5-tetramethyl-1,3,2-dioxaborolan-2-yl)aniline (28.1 g) instead of 4-(4,4,5,5-tetramethyl-1,3,2-dioxaborolan-2-yl)aniline (49.3 g). The molecular weight of Intermediate B measured by FAB-MS measurement was 245.

Synthesis of Intermediate K

Intermediate K was synthesized by Reaction Scheme 6-2 below:

[Reaction Scheme 6-2]

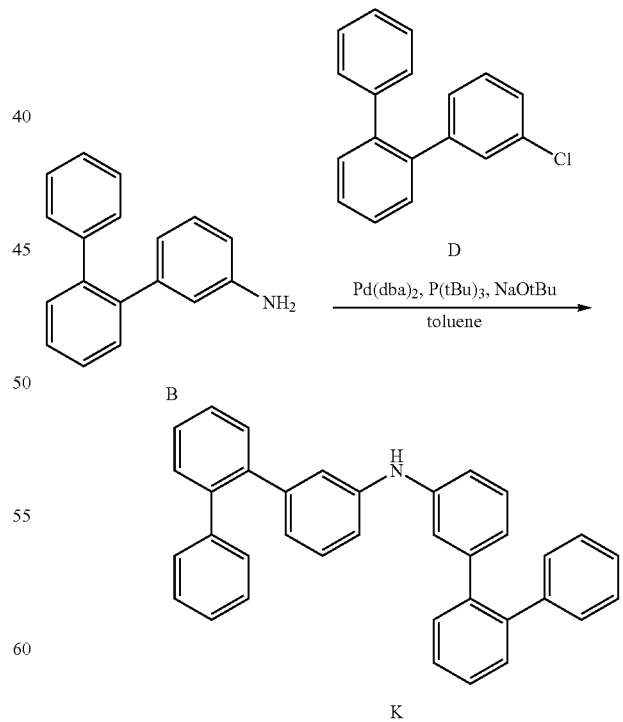

Intermediate K (5.8 g, yield: 60%) was obtained in the same manner as the synthesis of Intermediate G by using Intermediate B (5.0 g) instead of Intermediate A (15.0 g) and Intermediate D (5.4 g) instead of Intermediate C (16.2 g). The molecular weight of Intermediate K measured by FAB-MS measurement was 473.

Synthesis of Compound 51

Amine Compound 51 was synthesized by Reaction Scheme 6-3 below:

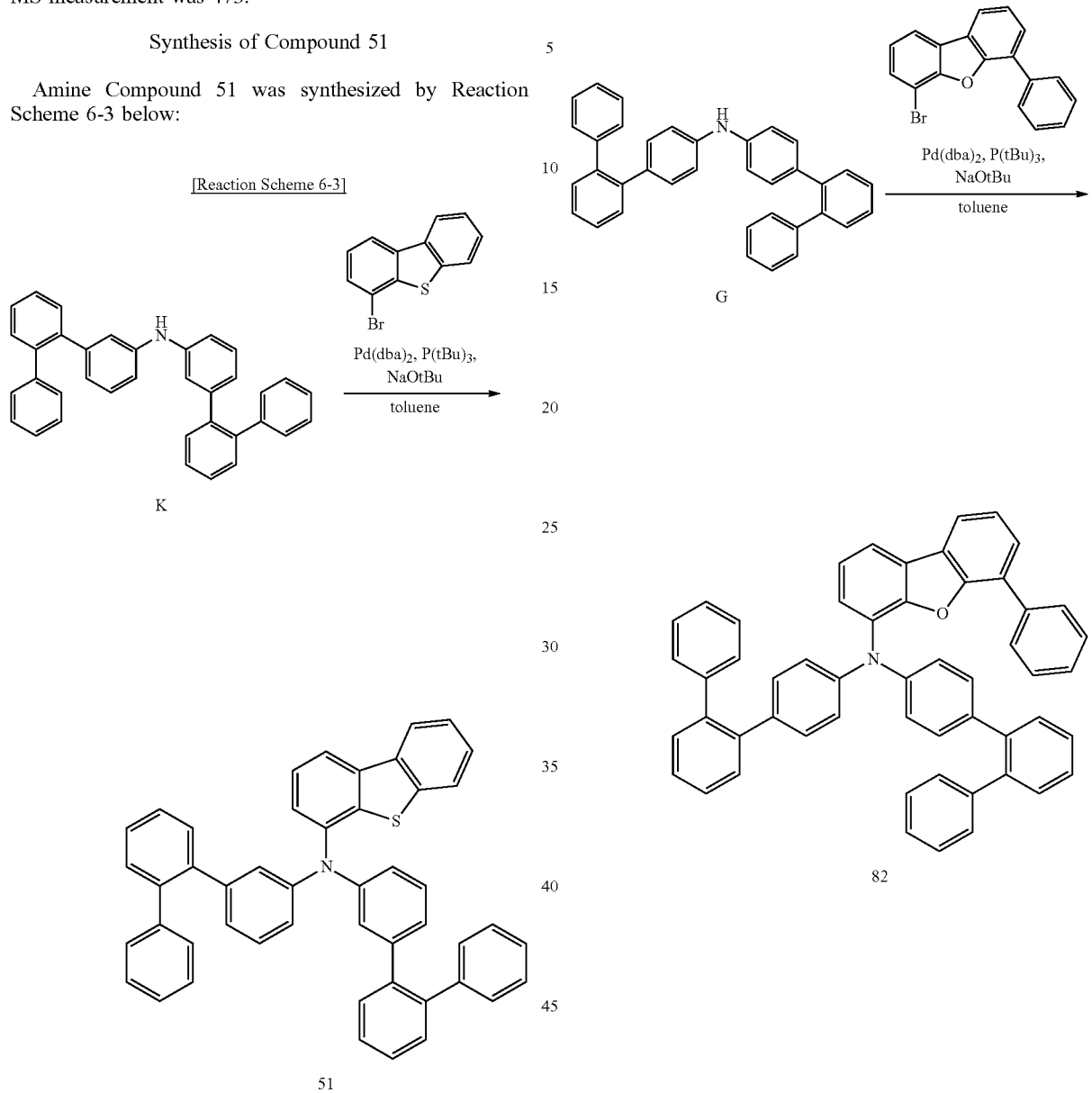

Compound 51 (5.3 g, yield: 77%) was obtained in the same manner as the synthesis of Compound 1 by using Intermediate K (5.0 g) instead of Intermediate G (5.0 g) and 4-bromodibenzothiophene (2.8 g) instead of 4-bromodibenzofuran (2.6 g). The molecular weight of Compound 51 measured by FAB-MS measurement was 655.

(7) Synthesis of Compound 82

Amine Compound 82 according to an example may be synthesized by, for example, the steps shown in Reaction Scheme 7 below:

Compound 82 (5.6 g, yield: 75%) was obtained in the same manner as the synthesis of Compound 1 by using 4-bromo-6-phenyldibenzofuran (3.4 g) instead of 4-bromodibenzofuran (2.6 g). The molecular weight of Compound 82 measured by FAB-MS measurement was 715.

2. Evaluation of Energy Level of Compounds

A lowest singlet exciton energy level (Si level) and a lowest triplet exciton energy level (T1 level) of each of Compounds 1, 2, 3, 8, 22, 51, and 82, which are Example Compounds, and Comparative Example Compound X-1 to Comparative Example Compound X-6 are shown in Table 2 below.

Comparative Example Compound X-1 to Comparative Example Compound X-6 are shown in Table 1.

TABLE 1
Comparative Example Compound X-1
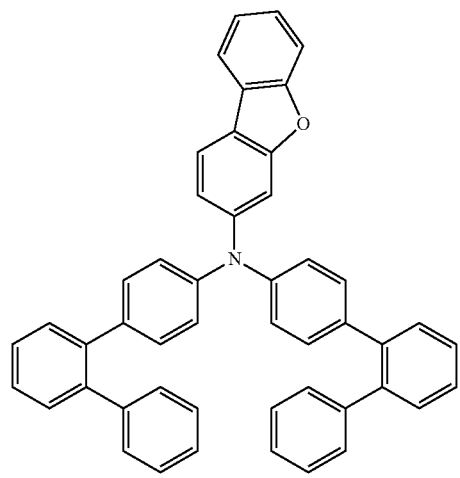 [SMILES: c1ccc(-c2ccccc2-c2ccc(N(c3ccc(-c4ccccc4-c4ccccc4)cc3)c3ccc4c(c3)oc3ccccc34)cc2)cc1]
X-1
Comparative Example Compound X-2
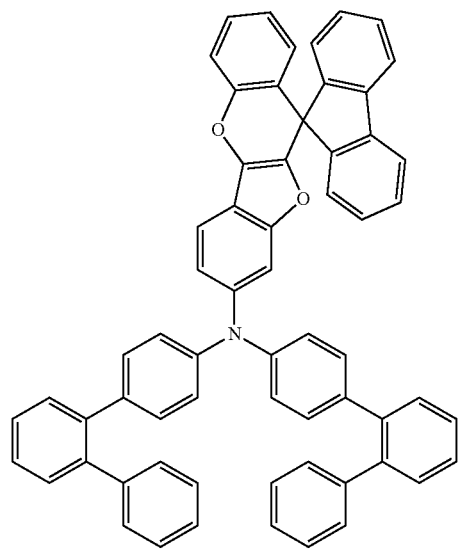 [SMILES: c1ccc(-c2ccccc2-c2ccc(N(c3ccc(-c4ccccc4-c4ccccc4)cc3)c3ccc4c5c(oc4c3)C3(c4ccccc4O5)c4ccccc4-c4ccccc43)cc2)cc1]
X-2
Comparative Example Compound X-3
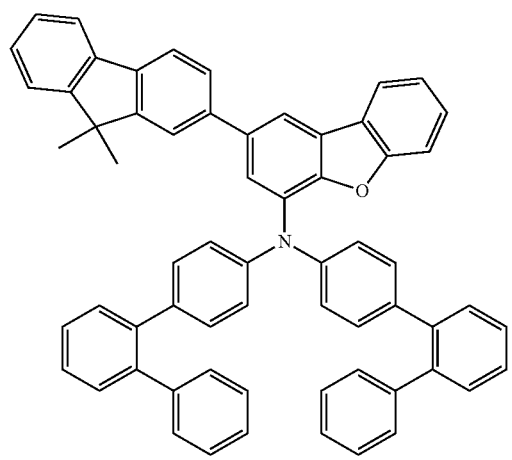 [SMILES: CC1(C)c2ccccc2-c2ccc(-c3cc(N(c4ccc(-c5ccccc5-c5ccccc5)cc4)c4ccc(-c5ccccc5-c5ccccc5)cc4)c4oc5ccccc5c4c3)cc21]
X-3

TABLE 1-continued
| | |
|---|---|
| Comparative Example Compound X-4 | 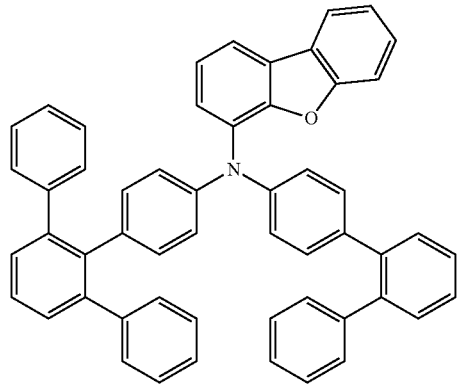 [SMILES: c1ccc(-c2ccccc2-c2ccc(N(c3ccc(-c4c(-c5ccccc5)cccc4-c4ccccc4)cc3)c3cccc4c3oc3ccccc34)cc2)cc1]<br>X-4 |
| Comparative Example Compound X-5 | 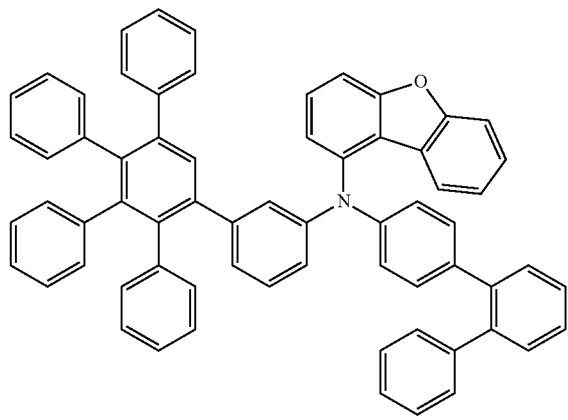 [SMILES: c1ccc(-c2ccccc2-c2ccc(N(c3cccc(-c4cc(-c5ccccc5)c(-c5ccccc5)c(-c5ccccc5)c4-c4ccccc4)c3)c3cccc4oc5ccccc5c34)cc2)cc1]<br>X-5 |
| Comparative Example Compound X-6 | 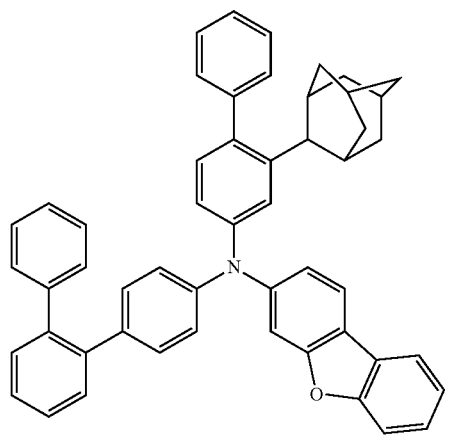 [SMILES: c1ccc(-c2ccccc2-c2ccc(N(c3ccc(-c4ccccc4)c(C4C5CC6CC(C5)CC4C6)c3)c3ccc4c(c3)oc3ccccc34)cc2)cc1]<br>X-6 |

The value of the energy level in Table 2 was calculated by a non-empirical molecular orbital method. The value was calculated with B3LYP/6-31G(d) using Gaussian 09 from Gaussian, Inc. (Wallingford, CT, USA).

TABLE 2

| Compounds | S1 level (eV) | T1 level (eV) |
|---|---|---|
| Compound 1 | 3.35 | 2.82 |
| Compound 2 | 3.37 | 2.87 |
| Compound 3 | 3.35 | 2.85 |
| Compound 8 | 3.36 | 2.82 |
| Compound 22 | 3.40 | 2.85 |
| Compound 51 | 3.47 | 2.92 |
| Compound 82 | 3.21 | 2.88 |
| Comparative Example Compound X-1 | 3.37 | 2.72 |
| Comparative Example Compound X-2 | 3.42 | 2.73 |
| Comparative Example Compound X-3 | 3.38 | 2.75 |
| Comparative Example Compound X-4 | 3.29 | 2.83 |
| Comparative Example Compound X-5 | 3.37 | 2.87 |
| Comparative Example Compound X-6 | 3.40 | 2.72 |

Referring to Table 2, it may be seen that Compounds 1, 3, 8, 22, 51, and 82 which are the amine compounds of examples exhibit lowest triplet exciton energy levels higher than those of Comparative Example Compounds X-1 to X-3 and X-6. It may be seen that Comparative Example Compounds X-4 and X-5 exhibit lowest triplet exciton energy levels higher than those of Comparative Example Compounds X-1 to X-3 and X-6. Compounds 1, 3, 8, 22, 51, and 82 each exhibit a lowest triplet exciton energy level of 2.8 eV or more, and thus may be used as a hole transport material of a blue phosphorescence device. Comparative Example Compounds X-4 and X-5 each exhibit a lowest triplet exciton energy level of 2.8 eV or more, and thus may be used as a hole transport material of a blue phosphorescence device.

3. Manufacture and Evaluation of Light Emitting Device (1) Manufacture of Light Emitting Devices Light emitting devices including an amine compound of an example or Comparative Example Compound in a hole transport layer were manufactured as follows. Compound 1, Compound 2, Compound 3, Compound 8, Compound 22, Compound 51, and Compound 82 which are the amine compounds of examples were used as a hole transport layer material to manufacture the light emitting devices of Examples 1 to 7, respectively. Comparative Example Compound X-1 to Comparative Example Compound X-6 were used in a hole transport layer to manufacture the light emitting devices of Comparative Examples 1 to 6, respectively.

A 1,500 Å-thick ITO was patterned on a glass substrate, the glass substrate was washed with ultrapure water, irradiated with ultraviolet rays for about 30 minutes, and treated with ozone. HAT-CN was deposited to a thickness of about 100 Å, TAPC was deposited to a thickness of about 800 Å, and Example Compound or Comparative Example Compound was deposited to a thickness of about 50 Å to form a hole transport region.

FIrpic and mCBP were co-deposited at a ratio of 5:95 to form a 300 Å-thick emission layer. A 300 Å-thick layer was formed on the emission layer with TmPyPB, and a 5 Å-thick layer was formed with LiF to form an electron transport region. A second electrode having a thickness of about 1,000 Å was formed with aluminum (Al). A 600 Å-thick capping layer was formed with Compound P4 below on the second electrode. In the Examples, the hole transport region, the emission layer, the electron transport region, and the second electrode were formed using a vacuum deposition apparatus.

HAT-CN, TAPC, mCBP, FIrpic, and TmPyPB, which were used in the manufacture of the light emitting devices were used by sublimation purification of commercially available products.

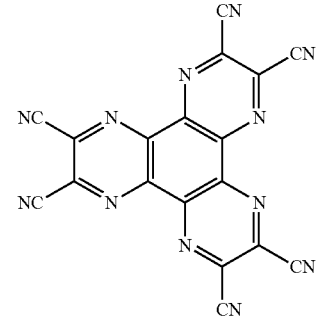

HAT-CN

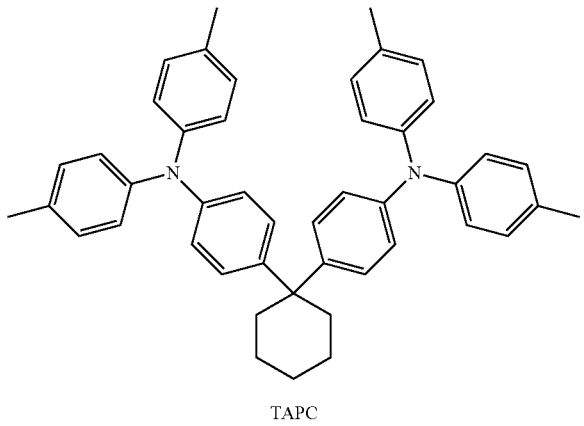

TAPC

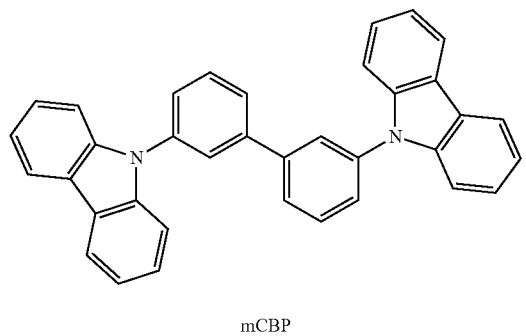

mCBP

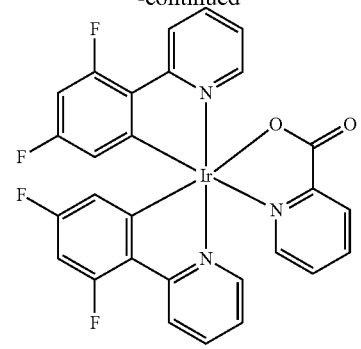

FIrpic

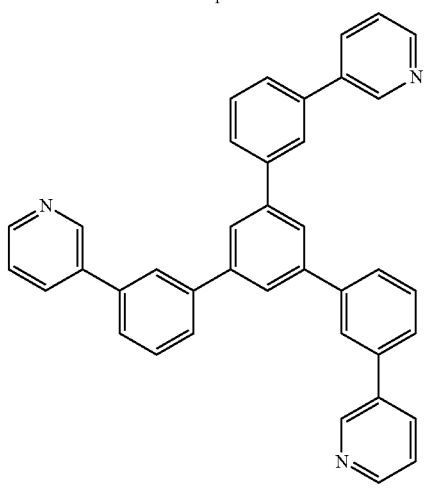

TmPyPB

P4

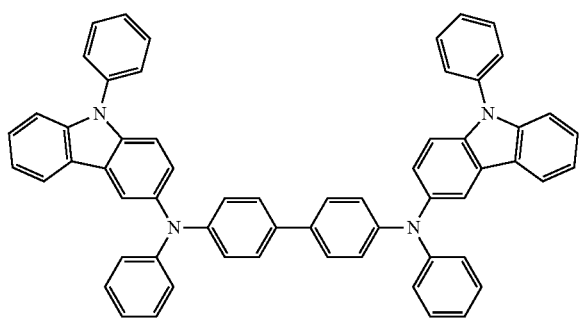

(2) Evaluation of Light Emitting Devices

Luminous efficiencies and service lives of the light emitting devices of Examples and Comparative Examples are shown in Table 3 below. In Table 3, the luminous efficiencies and service lives are relative values, which are represented for comparison, on the basis that the luminous efficiency and service life of the light emitting device of Comparative Example 1 are each 100%. The luminous efficiency shows a luminous efficiency value with respect to a current density of 10 mA/cm$^2$. The luminous efficiency was measured by using a brightness light distribution characteristics measurement device, $C_{9920}$-11 manufactured by Hamamatsu Photonics, inc. The device service life ($LT_{50}$) shows, for comparison, a time taken to reduce the brightness of the light emitting device to 50%.

TABLE 3

| Examples of manufactured devices | Hole transport layer material | Luminous efficiency (%) | Device service life ($LT_{50}$) |
|---|---|---|---|
| Example 1 | Compound 1 | 115% | 150% |
| Example 2 | Compound 2 | 110% | 150% |
| Example 3 | Compound 3 | 130% | 120% |
| Example 4 | Compound 8 | 115% | 150% |
| Example 5 | Compound 22 | 120% | 130% |
| Example 6 | Compound 51 | 125% | 130% |
| Example 7 | Compound 82 | 113% | 150% |
| Comparative Example 1 | Comparative Example Compound X-1 | 100% | 100% |
| Comparative Example 2 | Comparative Example Compound X-2 | 98% | 80% |
| Comparative Example 3 | Comparative Example Compound X-3 | 99% | 100% |
| Comparative Example 4 | Comparative Example Compound X-4 | 97% | 50% |
| Comparative Example 5 | Comparative Example Compound X-5 | 97% | 40% |
| Comparative Example 6 | Comparative Example Compound X-6 | 96% | 30% |

Referring to Table 3, it may be seen that the light emitting devices of Examples 1 to 7 have excellent luminous efficiencies and device service lives compared to the light emitting devices of Comparative Examples 1 to 6. The light emitting devices of Examples 1 to 7 include the amine compounds of examples as described above, and include Compounds 1, 2, 3, 8, 22, 51, and 82, respectively. The light emitting devices of Examples 1 to 7 include, in a hole transport layer, Compounds 1, 2, 3, 8, 22, 51, and 82, respectively, which have lowest triplet exciton energy levels higher than those of Comparative Example Compounds X-1 to X-3 and X-6. Compounds 1, 2, 3, 8, 22, 51, and 82 having relatively high lowest triplet exciton energy levels may prevent excitons from moving from the emission layer to a functional layer such as the hole transport layer to prevent exciton from disappearing without emitting. As the amine compounds of examples having improved stability of the material by including an o-terphenyl group as described above, the light emitting devices of Examples 1 to 7 may exhibit improved device service lives. The o-terphenyl group included in the amine compound of an example does not reduce the stability of the amine compound, but contributes to maintaining a high lowest triplet exciton energy level of the amine compound. Thus, it is thought that the light emitting device including the amine compound of an example may exhibit improved luminous efficiency and device service life.

In the light emitting device ED, as a voltage is applied to the first electrode EL1 and the second electrode EL2, respectively, the holes injected from the first electrode EL1 are moved through the hole transport region HTR to the emission layer EML, and the electrons injected from the second electrode EL2 are moved through the electron transport region ETR to the emission layer EML. The electrons and holes are recombined in the emission layer EML to generate excitons and emit light when the excitons return to a ground state from an excited state.

Comparative Example Compounds X-4 and X-5 include a substituent having a high steric hindrance such as 3',6'-diphenyl-1,1':2',1''-terphenyl or 3'-phenyl-1,1':2',1''-terphenyl. In Table 2, Comparative Example Compounds X-4 and X-5 exhibited lowest triplet exciton energy levels higher than those of Comparative Example Compounds X-1 to X-3. However, it is thought that the light emitting devices of Comparative Examples 4 and 5 including Comparative Example Compounds X-4 and X-5 due to the substituent having a high steric hindrance have reduced luminous efficiencies and service lives.

The amine compound of an example may include two o-terphenyl groups bonded to one nitrogen atom to exhibit improved stability and hole transport properties of the material. Thus, when the amine compound of an embodiment is used in the emission layer, luminous efficiency and a device service life may be improved.

The light emitting device of an example may include a first electrode, a second electrode, which face each other, and at least one functional layer disposed between the first electrode and the second electrode. In the light emitting device of an example, at least one functional layer may include an amine compound of an example to exhibit improved device service life and luminous efficiency.

The light emitting device of an embodiment may include the amine compound of an embodiment in the hole transport region, thereby exhibiting high efficiency and long service life characteristics.

The amine compound of an embodiment may improve luminous efficiency and a device service life of the light emitting device.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting device comprising:
    a first electrode;
    a second electrode disposed on the first electrode; and
    at least one functional layer disposed between the first electrode and the second electrode and comprising an amine compound represented by Formula 1:

[Formula 1]

wherein in Formula 1, the amine compound represented by Formula 1 comprises two o-terphenyl groups bonded to the N atom, n1 and n2 are each independently 0 or 1, a1 and a2 are each independently an integer from 0 to 5, a3 to a6 are each independently an integer from 0 to 4, $R_1$ to $R_6$ are each independently a hydrogen atom, a deuterium atom, a halogen atom, a substituted or unsubstituted alkyl group having 1 to 15 carbon atoms, or a substituted or unsubstituted heteroaryl group having 2 to 20 carbon atoms, and $Q_1$ is a group represented by one of Formula 2-1, Formula 2-2, or Formula 2-4:

[Formula 2-1]

[Formula 2-2]

[Formula 2-4]

wherein in Formula 2-1, Formula 2-2, and Formula 2-4, $C_1$ to $C_4$ each represent a position of a carbon atom, X is O or S, a11 is an integer from 0 to 7, $R_{11}$ is a hydrogen atom, a deuterium atom, or a substituted or unsubstituted phenyl, group and represents a binding site to a neighboring atom.

2. The light emitting device of claim 1, wherein Formula 1 is represented by one of Formula 1-A and Formula 1-B:

[Formula 1-A]

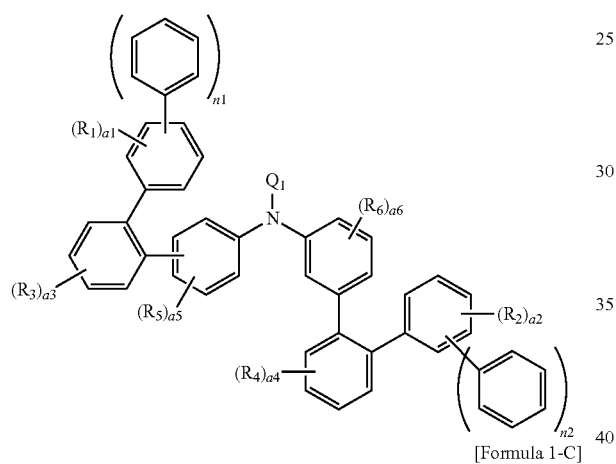

[Formula 1-B]

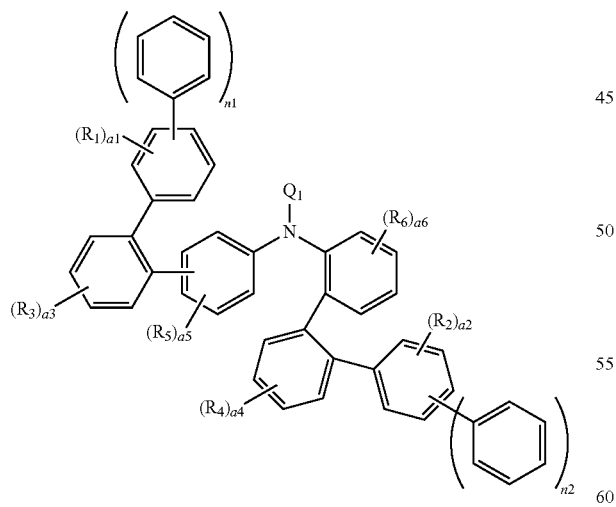

[Formula 1-C]

wherein in Formula 1-A and Formula 1-B,
a1 to a6, $R_1$ to $R_6$, n1, n2, and $Q_1$ are the same as defined in connection with Formula 1.

3. The light emitting device of claim 1, wherein $R_1$ and $R_5$ are each independently a fluorine atom or a methyl group.

4. The light emitting device of claim 1, wherein
a11 is 0 or 1, and
$R_{11}$ is a substituted or unsubstituted phenyl group.

5. The light emitting device of claim 1, wherein at least one of $R_1$ to $R_3$ is a deuterium atom.

6. The light emitting device of claim 1, wherein
the at least one functional layer comprises:
an emission layer;
a hole transport region disposed between the first electrode and the emission layer; and
an electron transport region disposed between the emission layer and the second electrode, and
the hole transport region comprises the amine compound.

7. The light emitting device of claim 6, wherein
the hole transport region comprises:
a hole injection layer disposed on the first electrode;
a hole transport layer disposed on the hole injection layer; and
an electron blocking layer disposed on the hole transport layer, and
at least one of the hole injection layer, the hole transport layer, and the electron blocking layer comprises the amine compound.

8. The light emitting device of claim 1, wherein the amine compound is one selected from Compound Group 1:

[Compound Group 1]

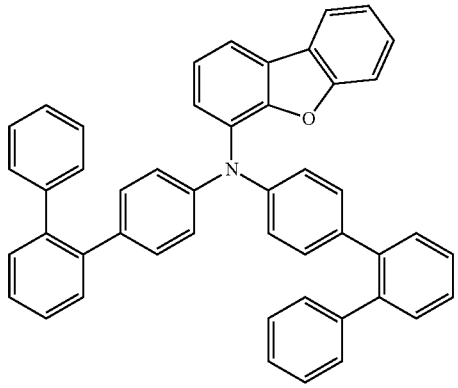

1

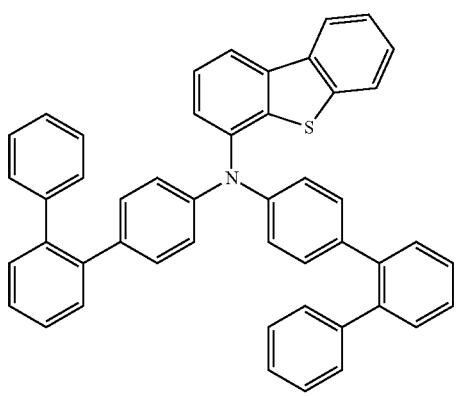

2

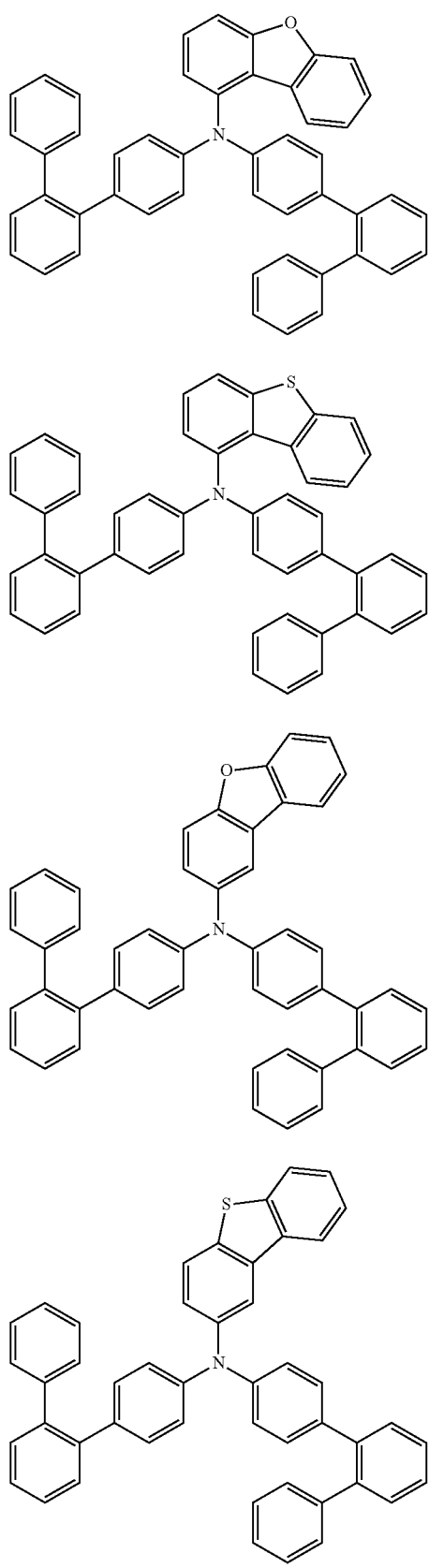
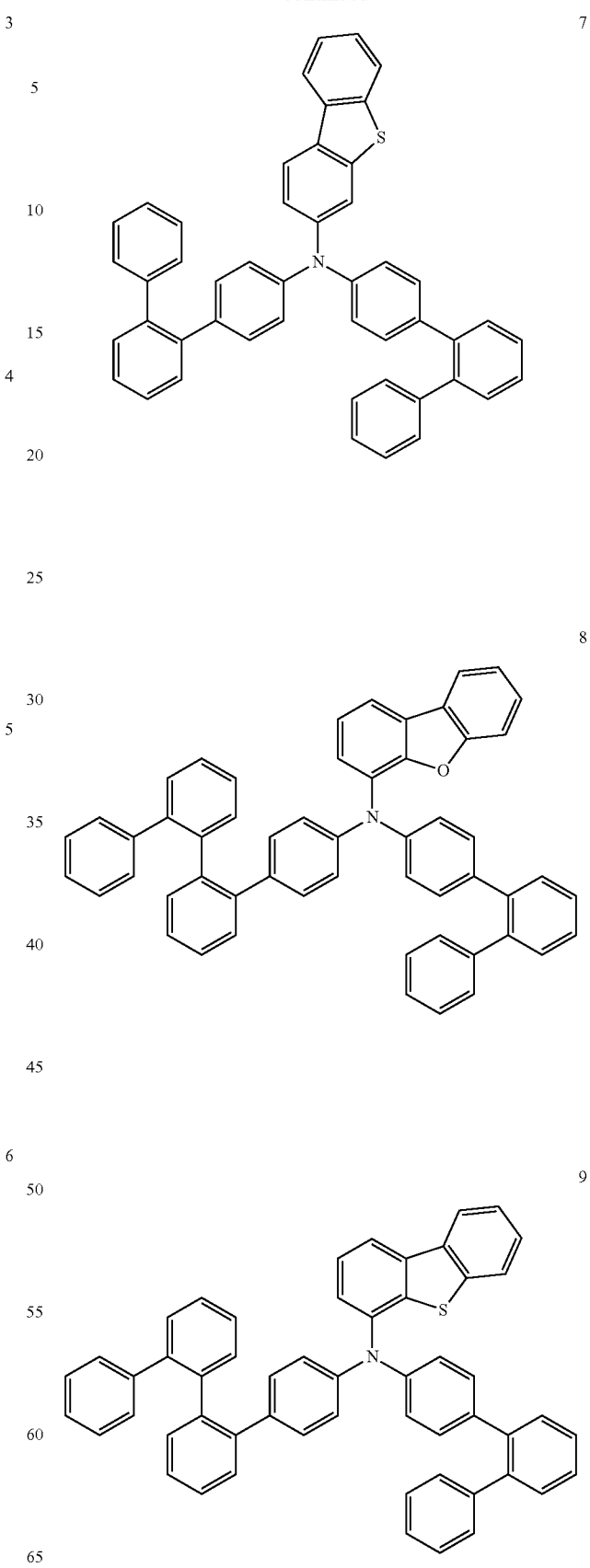

10
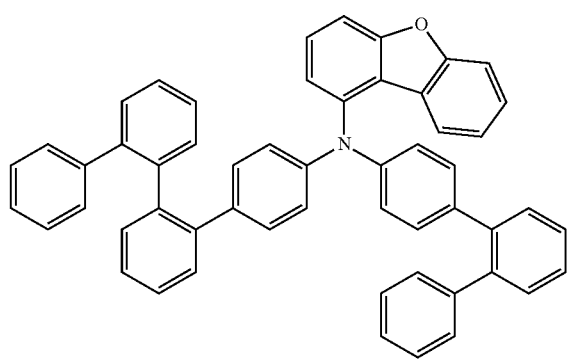
11
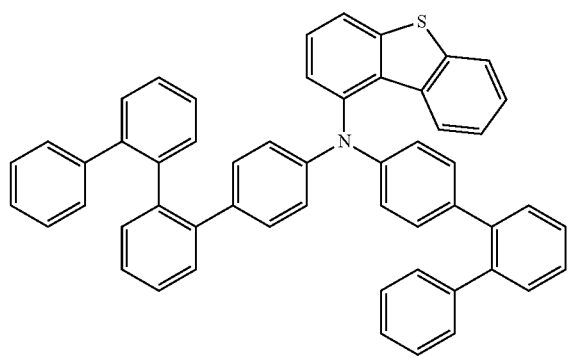
12
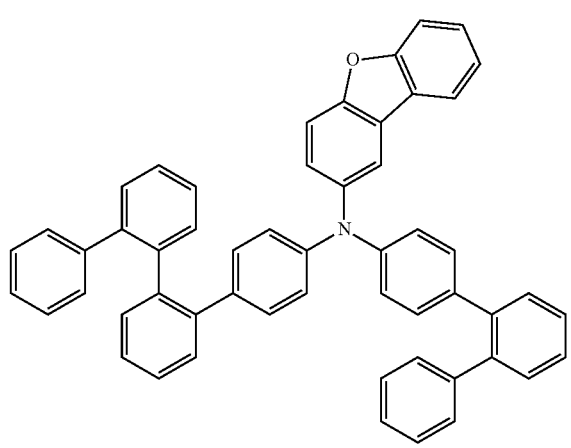
13
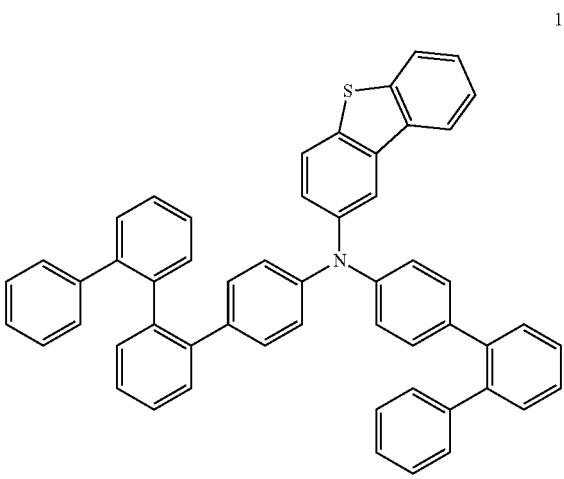
14
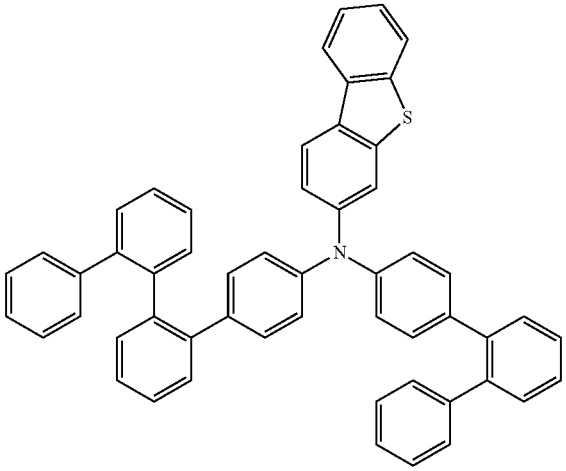
15
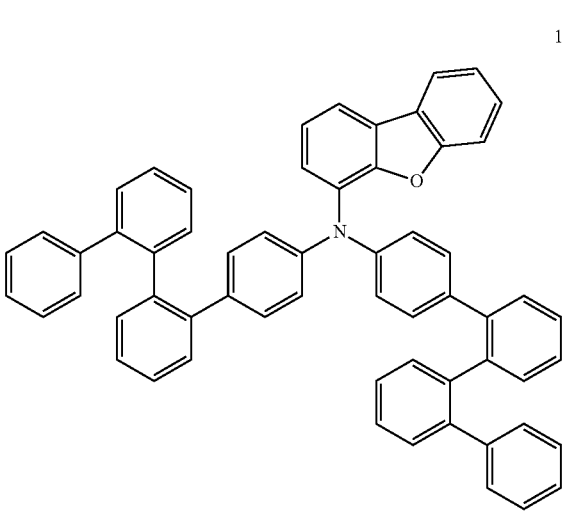

16
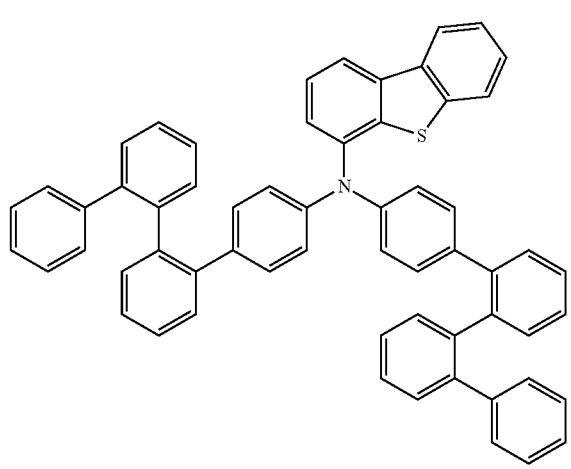
17
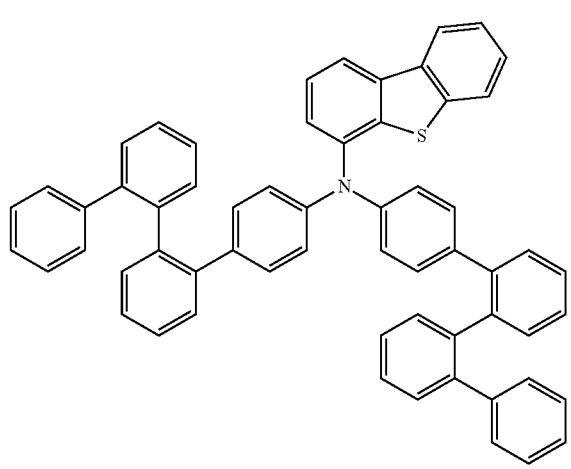
18
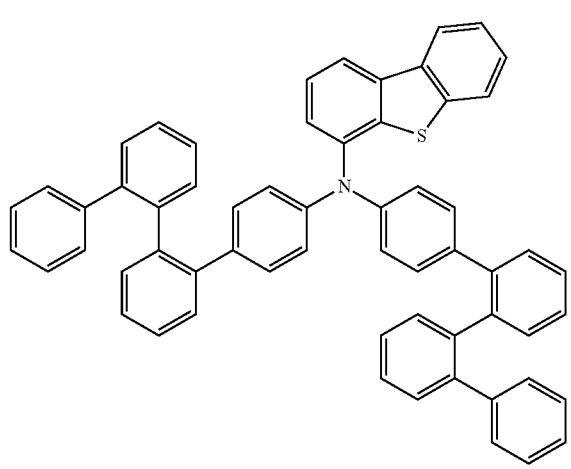
19
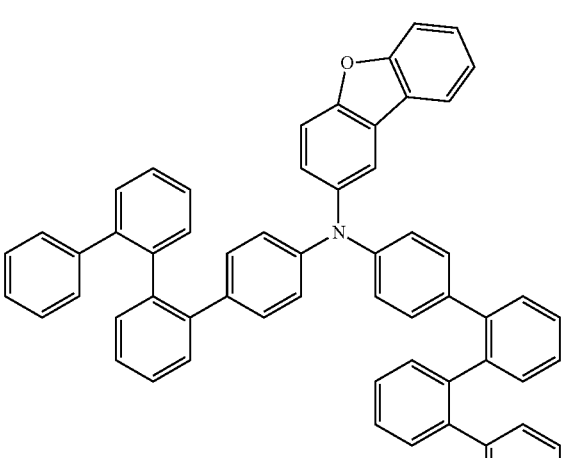
20
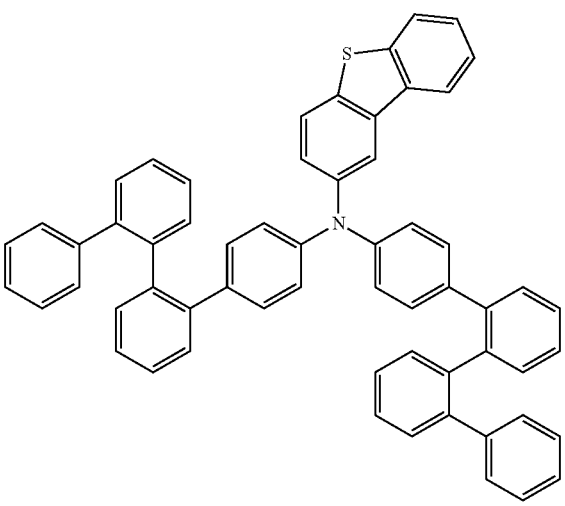
21
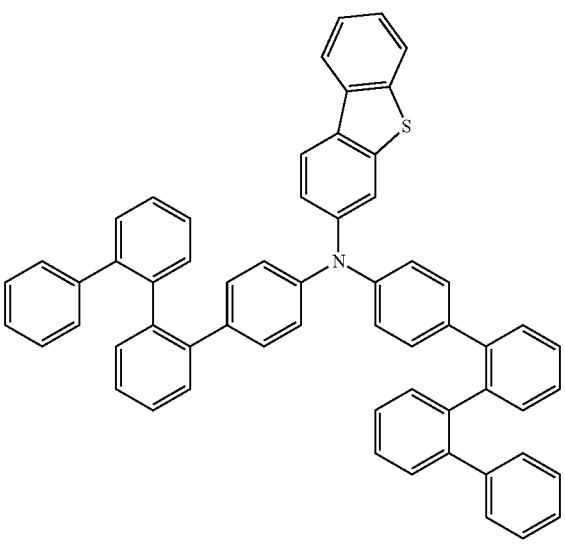

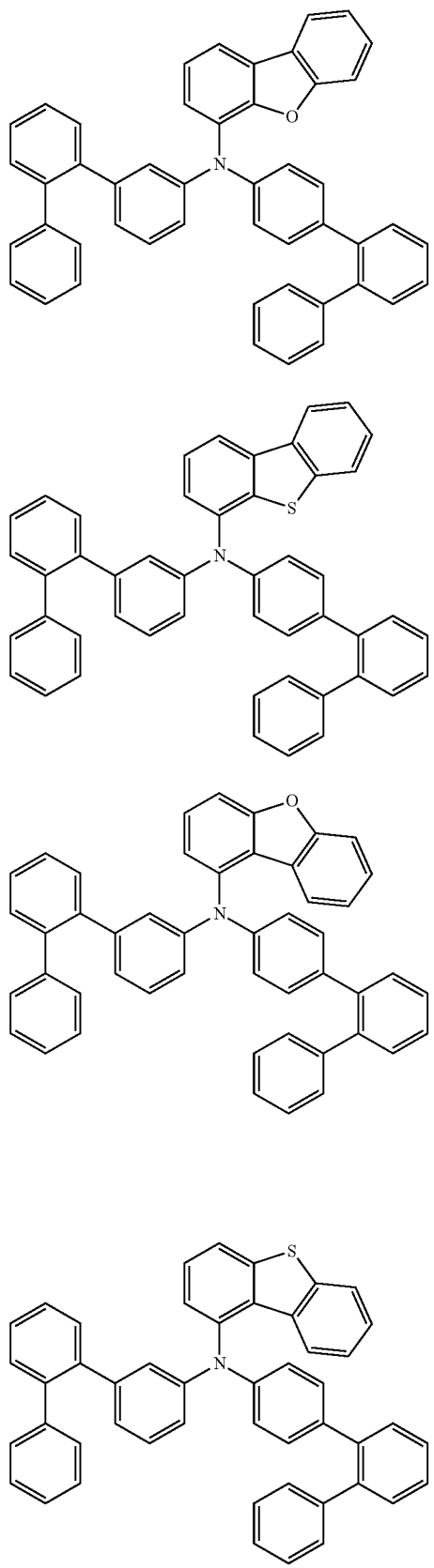
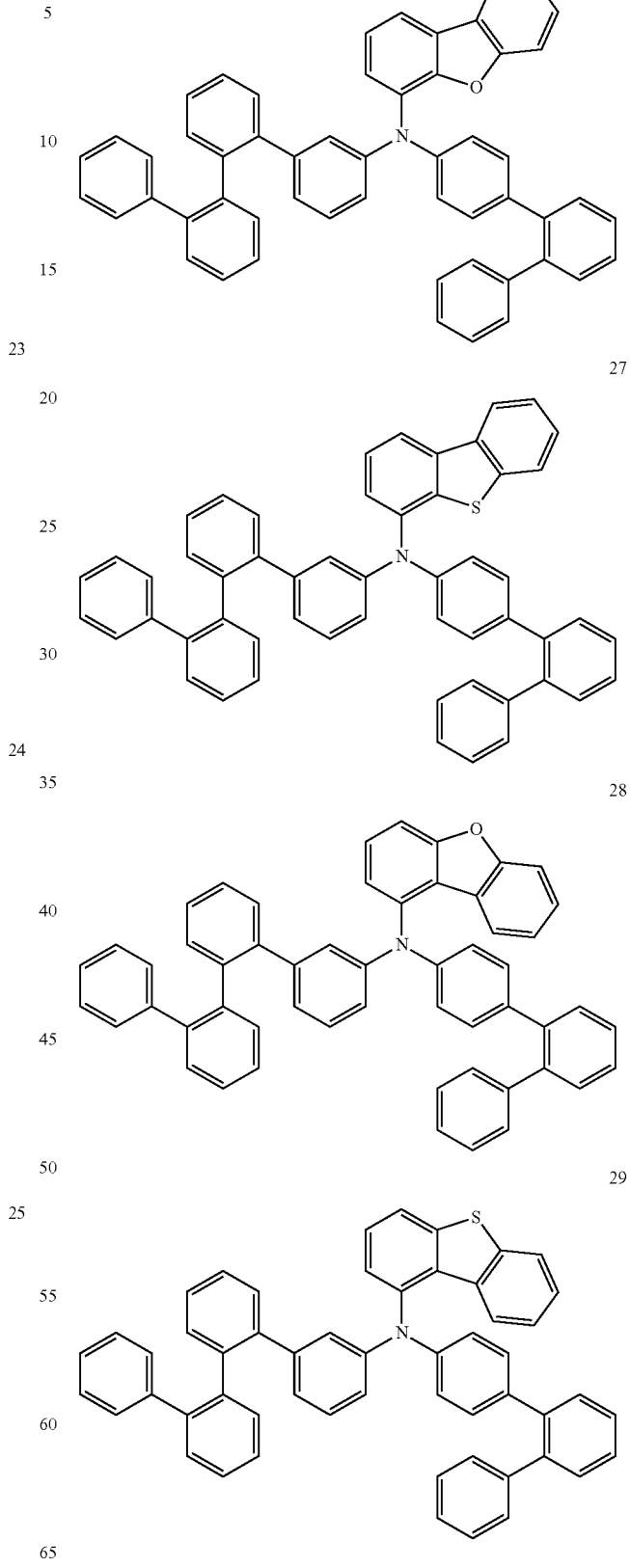

30
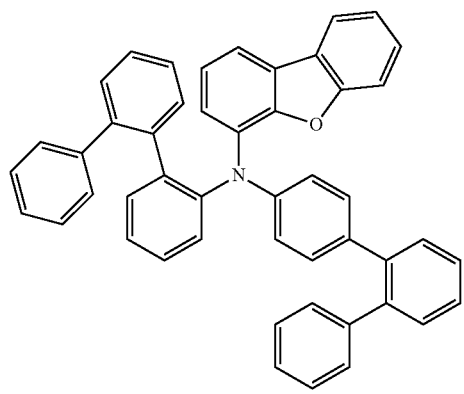
31
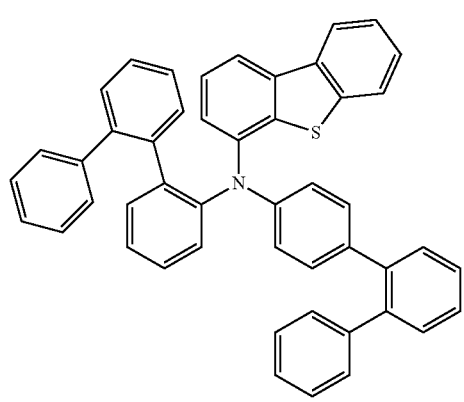
32
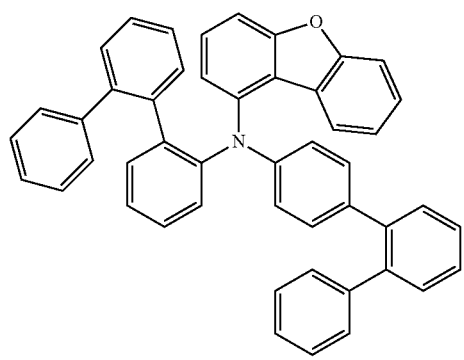
33
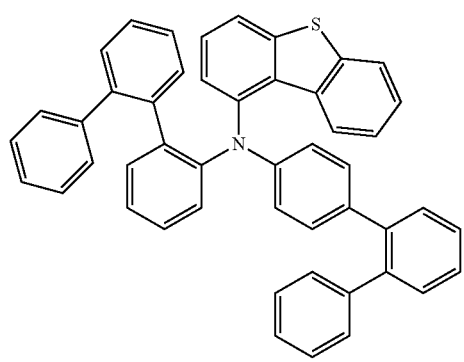
34
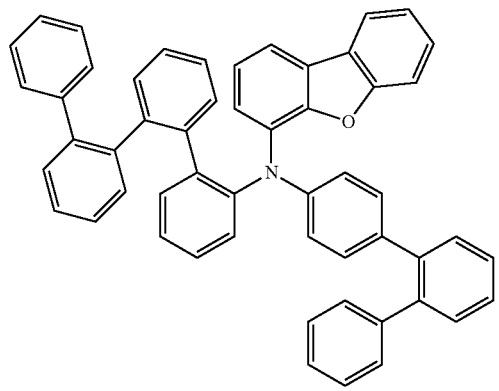
35
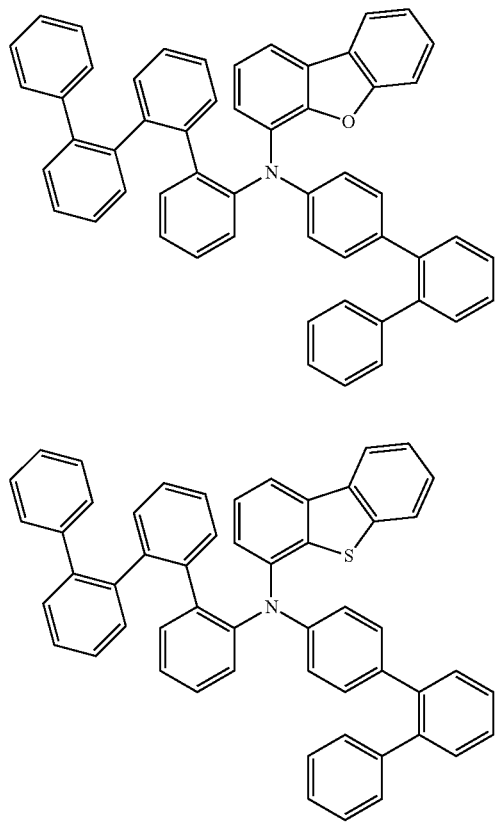
36
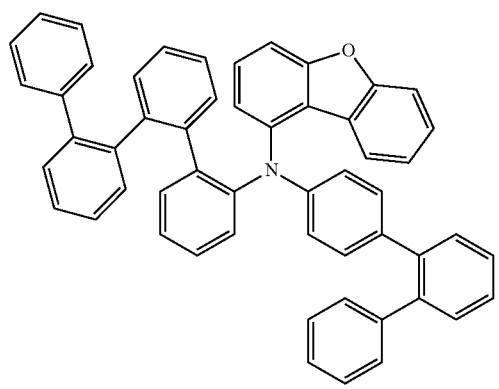
37
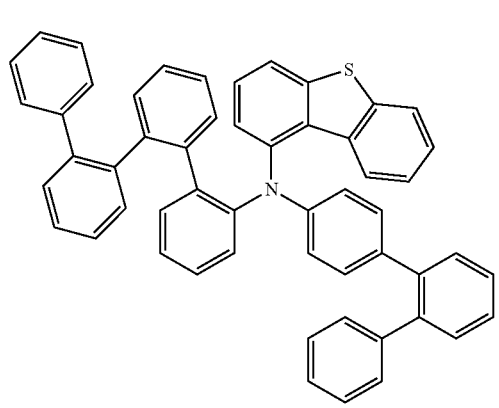

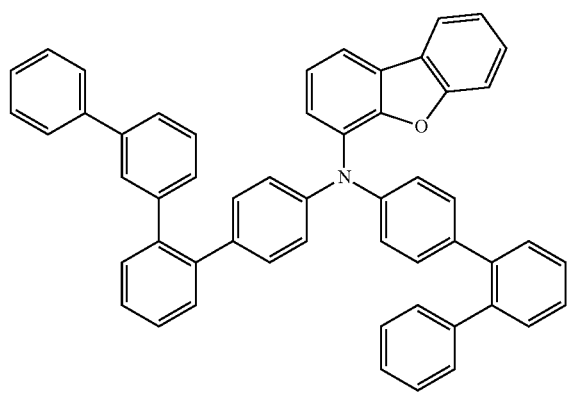
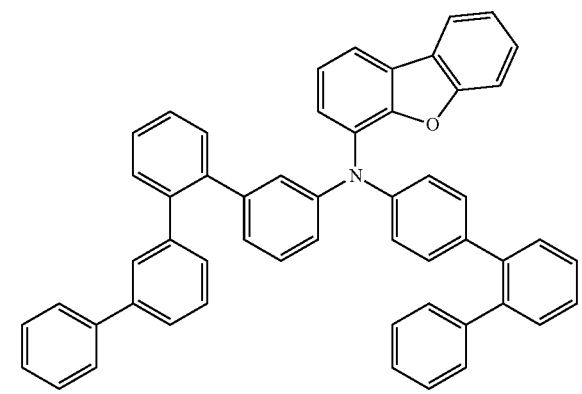
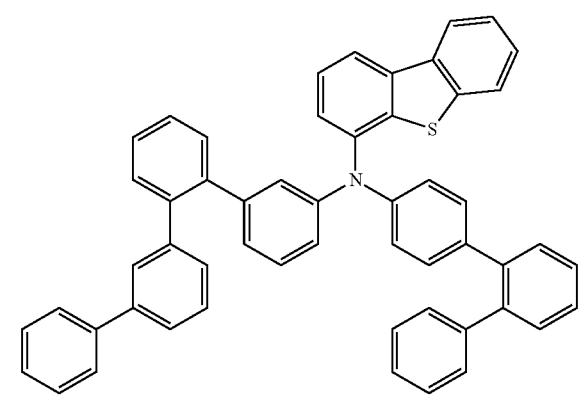
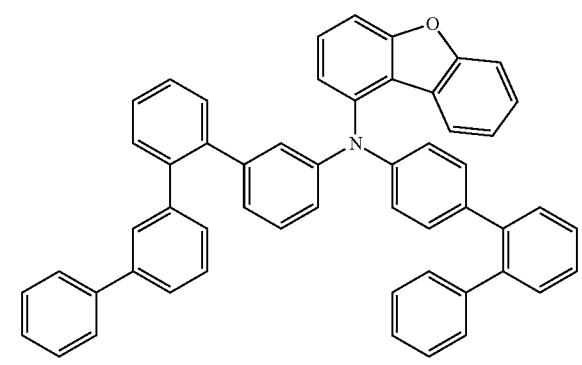
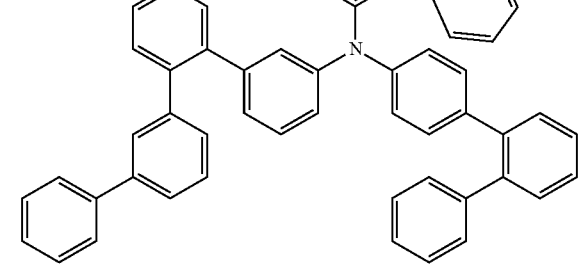

-continued
46
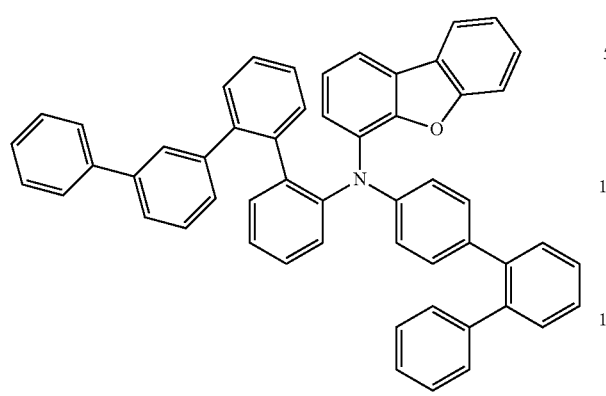
47
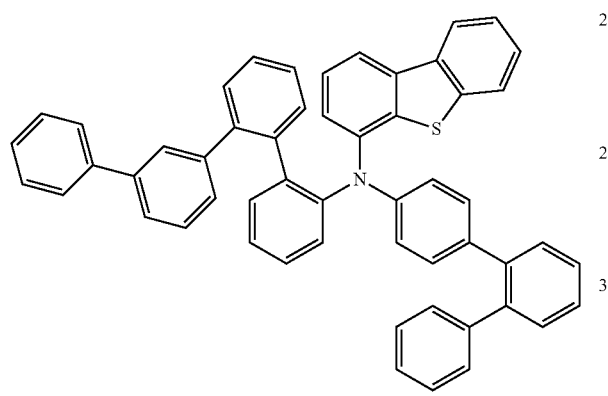
48
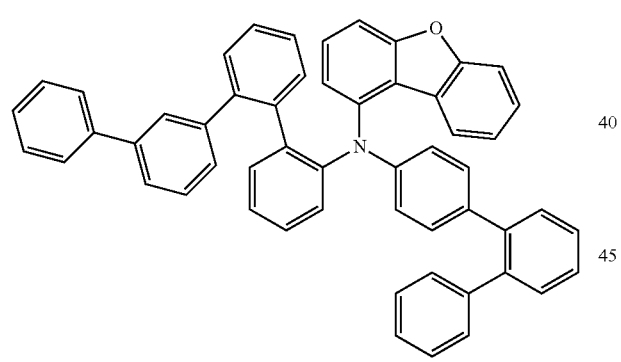
49
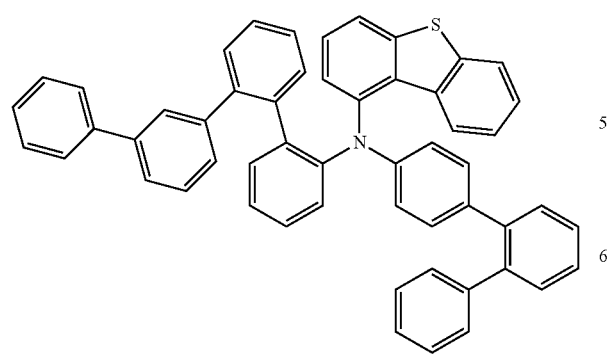
-continued
50
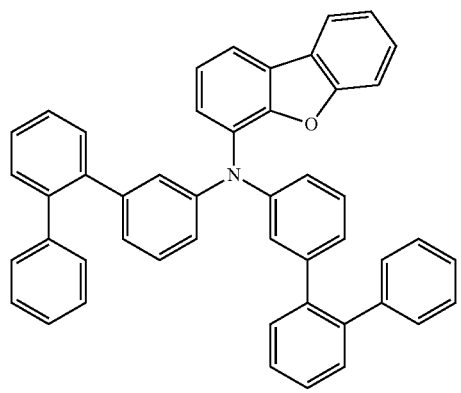
51
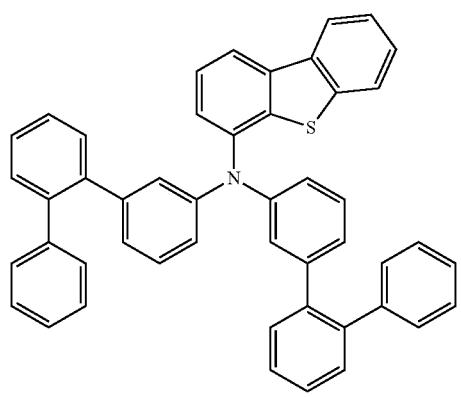
52
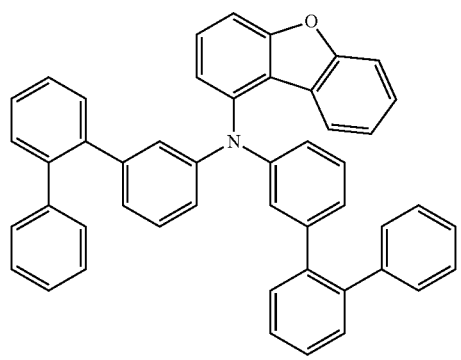
53
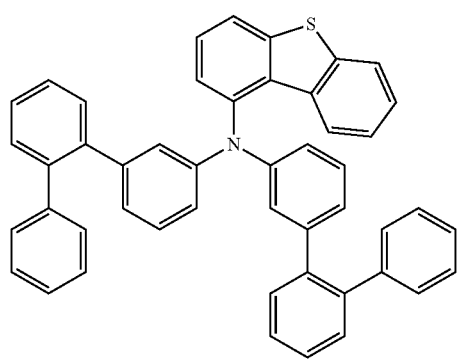

54
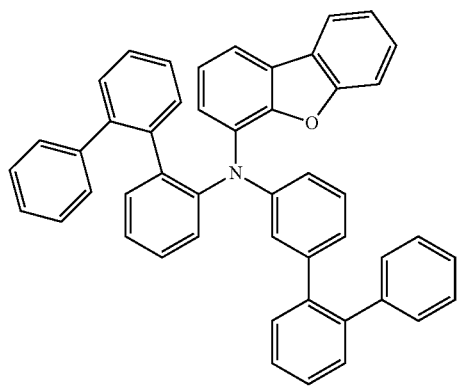
55
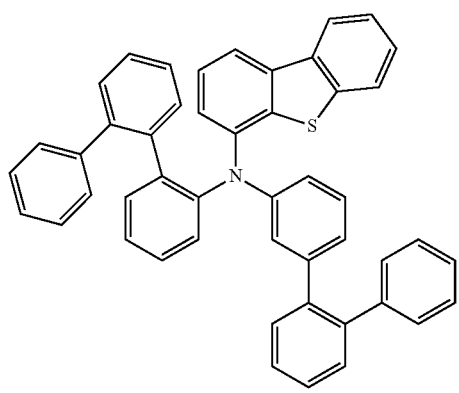
56
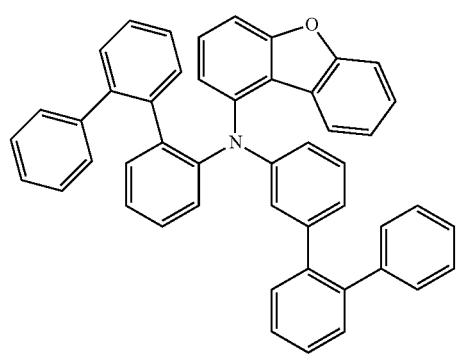
57
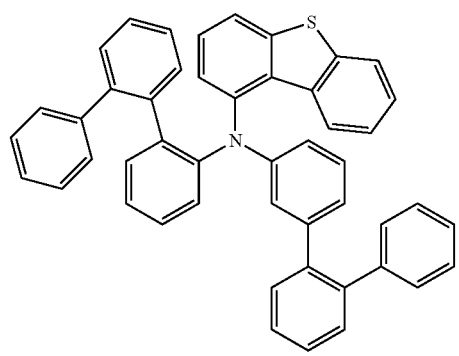
58
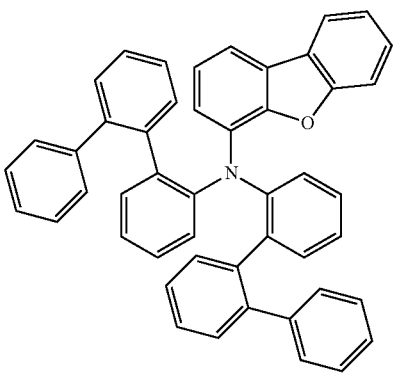
59
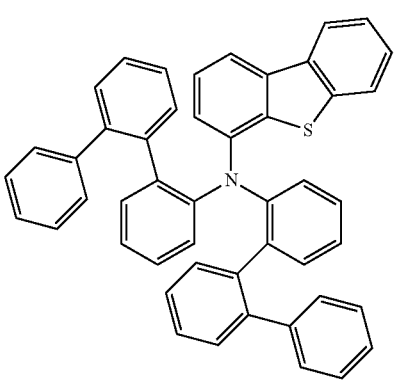
60
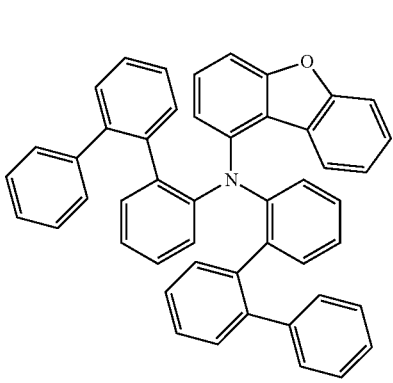
61
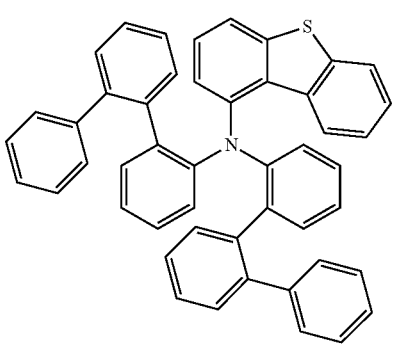

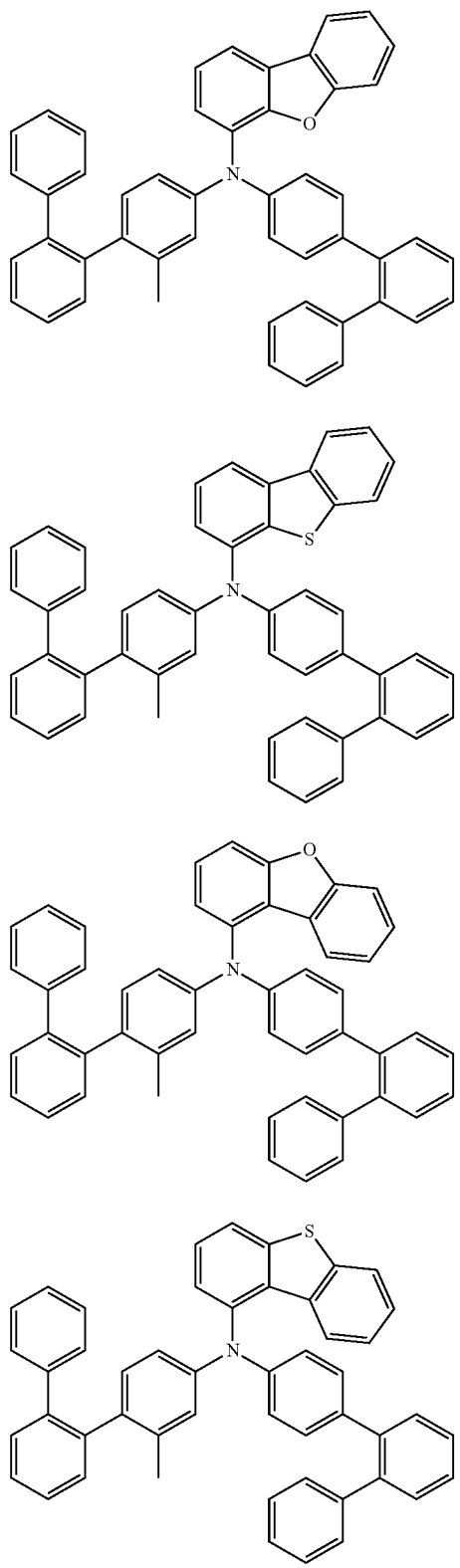
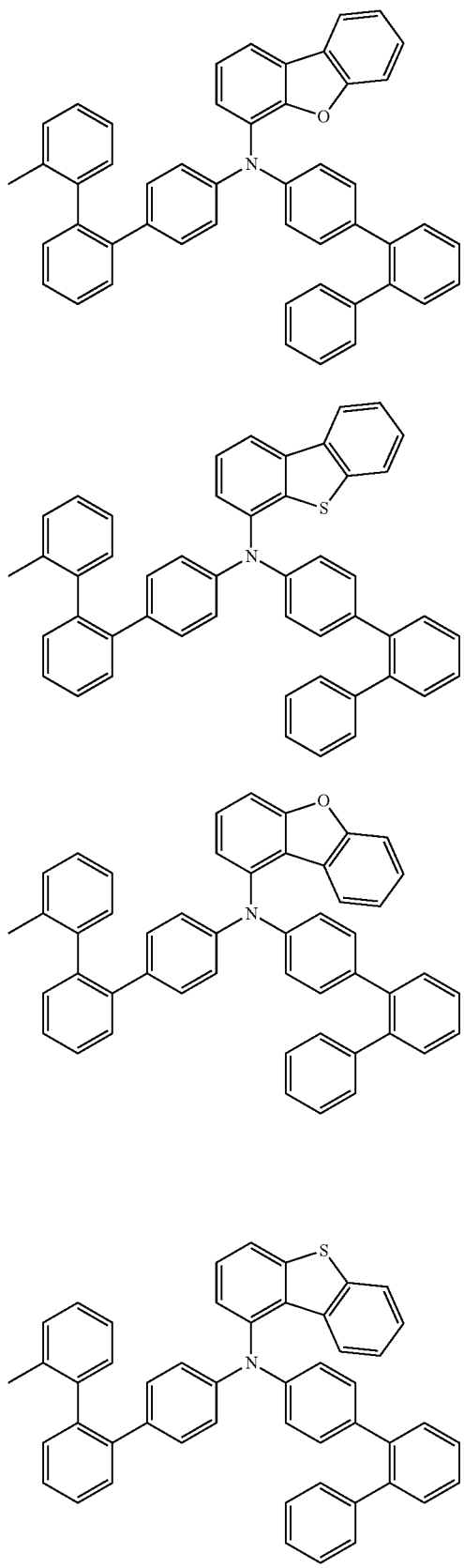

131
-continued
70
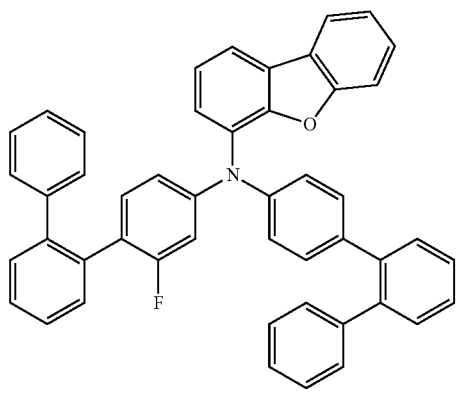
71
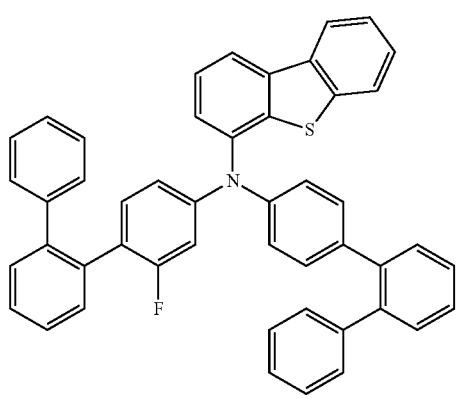
72
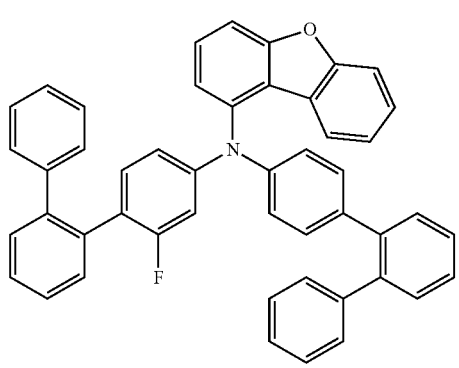
73
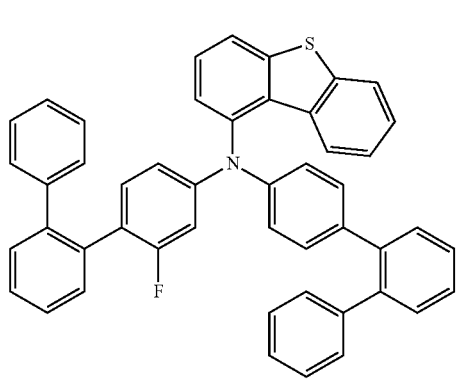
132
-continued
74
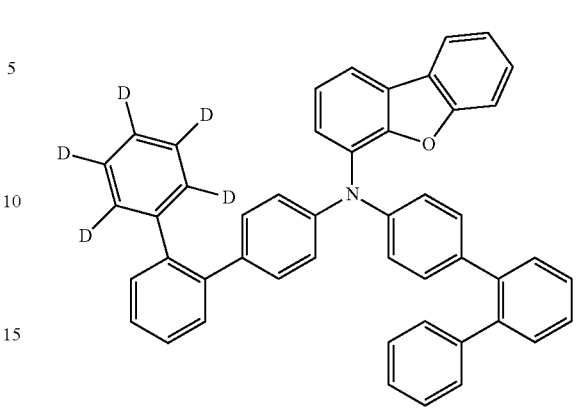
75
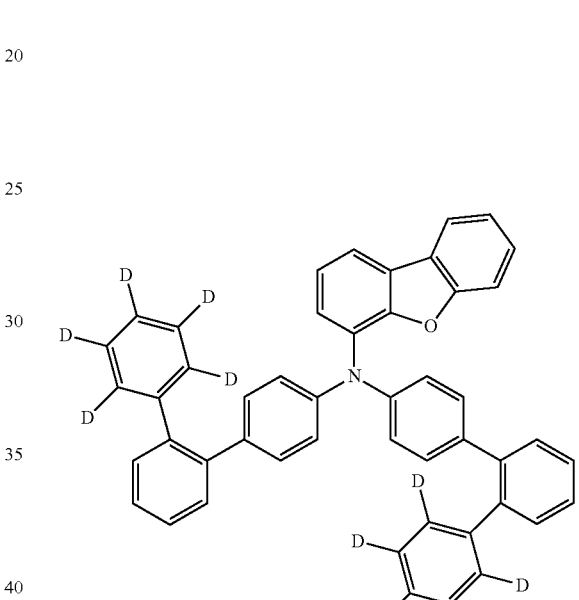
76
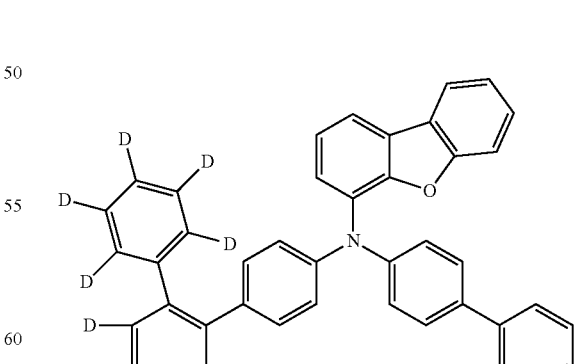

77
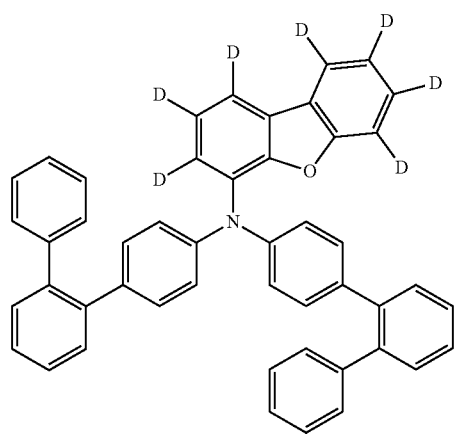
78
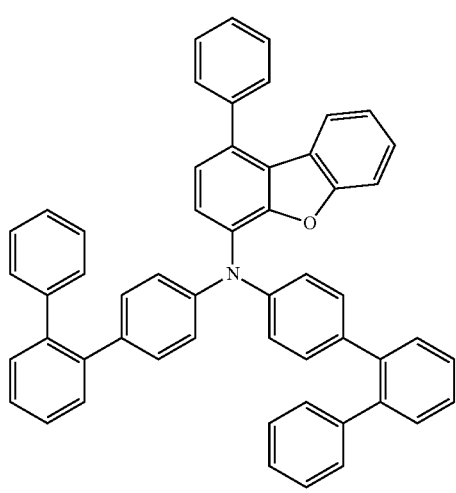
79
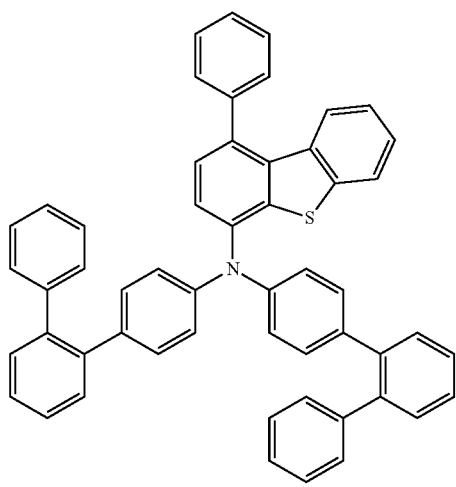
80
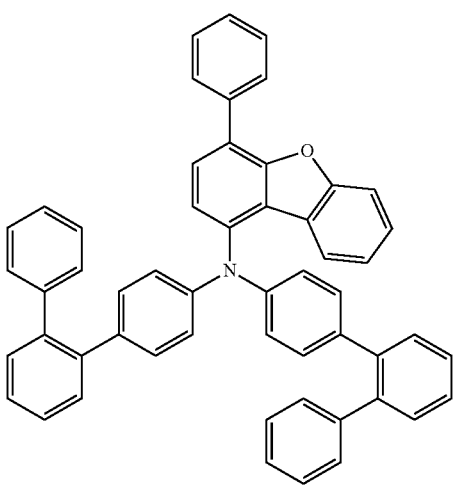
81
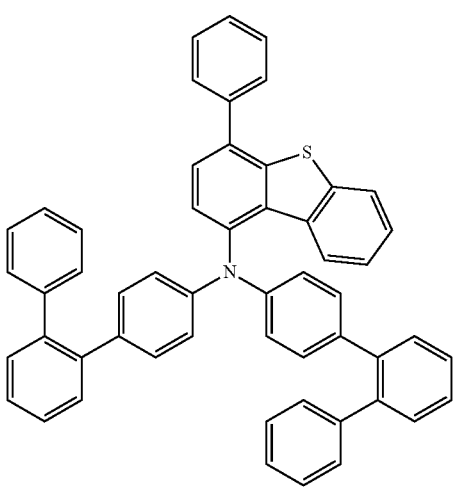
82
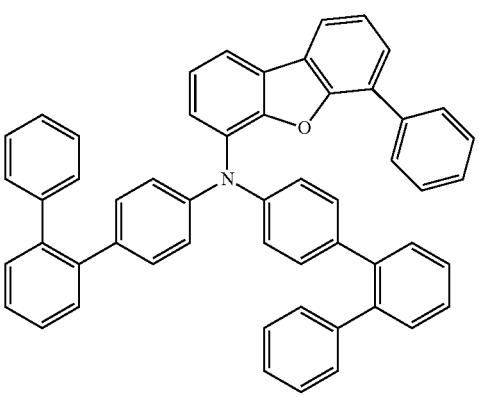

83
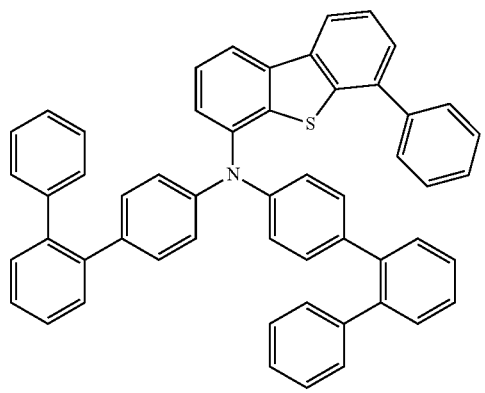
84
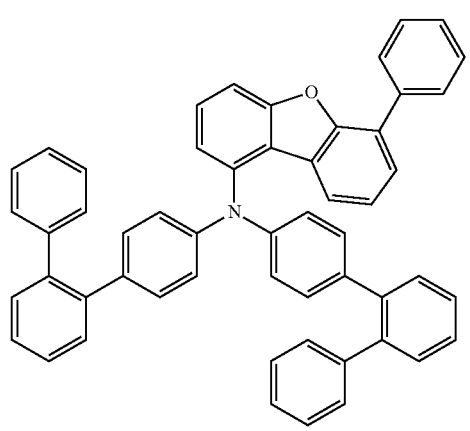
85
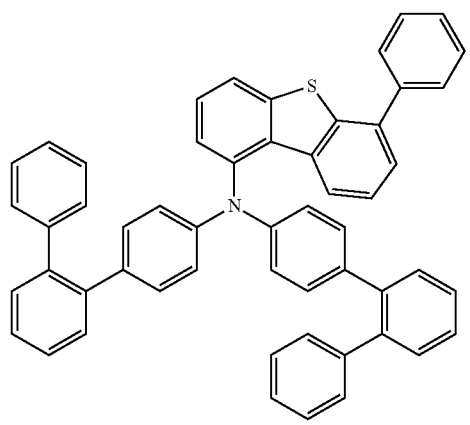
86
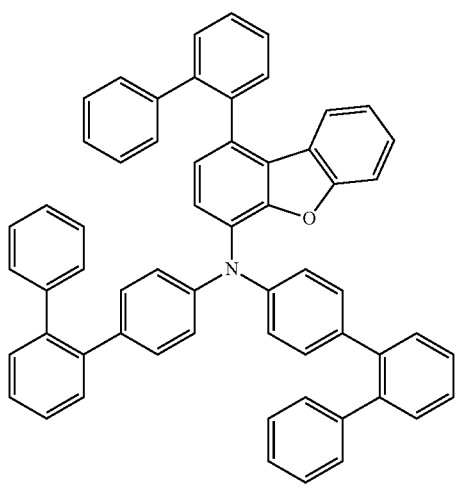
87
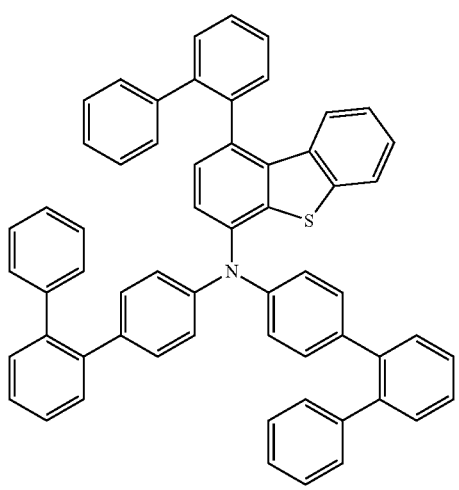
88
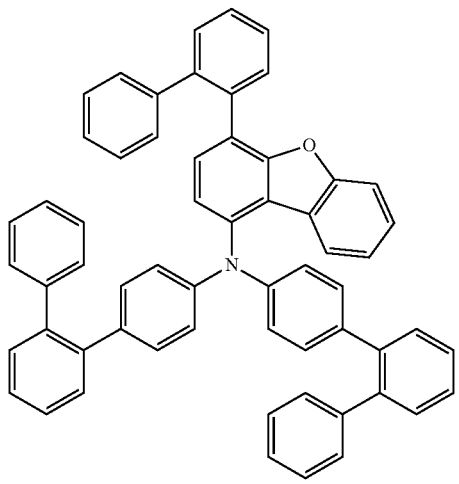

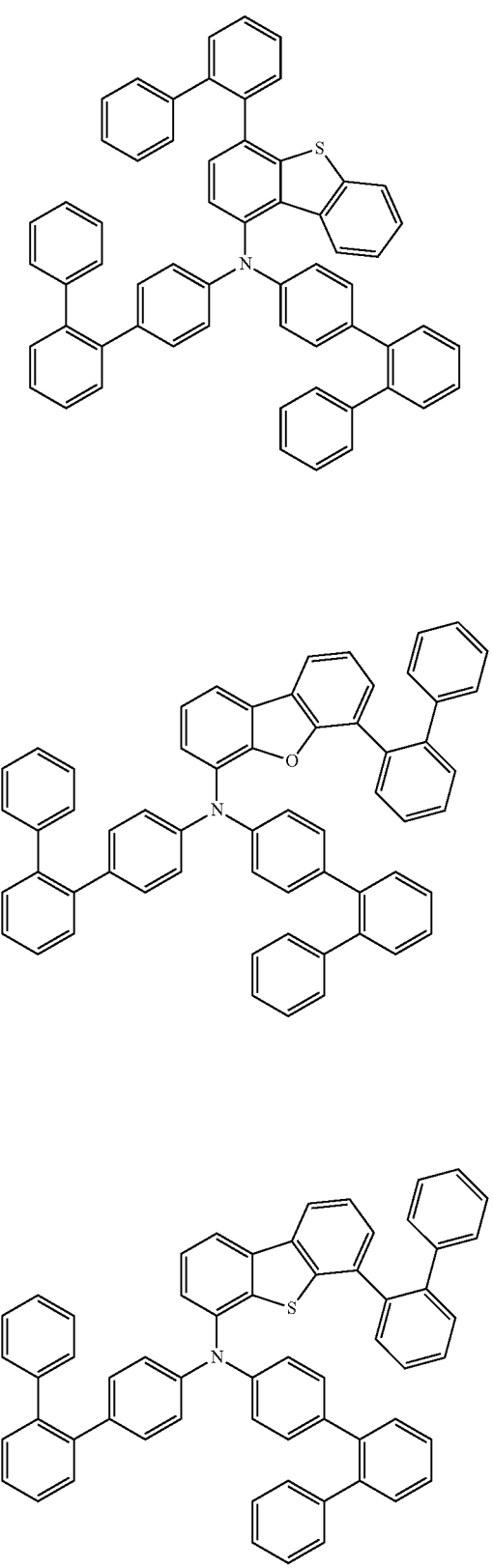
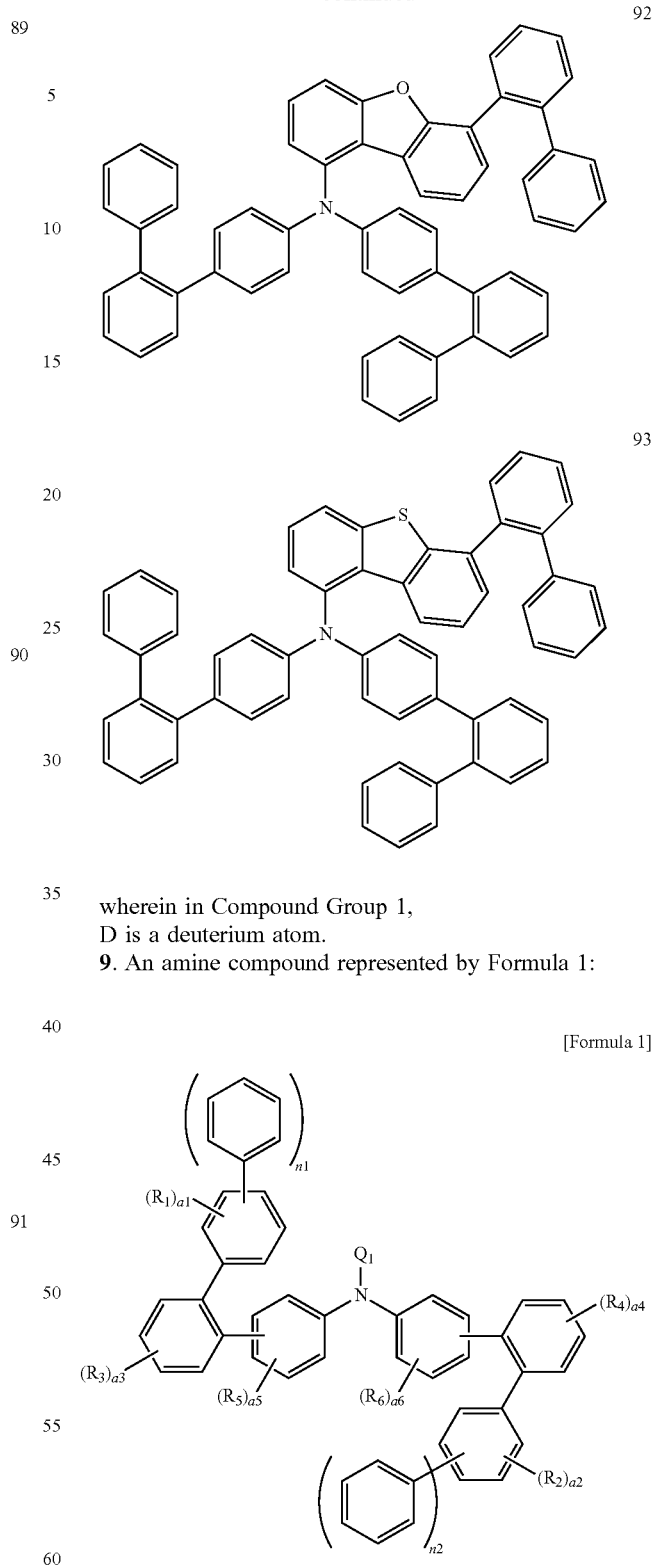
wherein in Compound Group 1,
D is a deuterium atom.
9. An amine compound represented by Formula 1:
[Formula 1]
wherein in Formula 1,
the amine compound represented by Formula 1 comprises two o-terphenyl groups bonded to the N atom,
n1 and n2 are each independently 0 or 1,
a1 and a2 are each independently an integer from 0 to 5,
a3 to a6 are each independently an integer from 0 to 4, R₁ to R₆ are each independently a hydrogen atom, a deuterium atom, a halogen atom, a substituted or unsubstituted alkyl group having 1 to 15 carbon atoms, or a substituted or unsubstituted heteroaryl group having 2 to 20 carbon atoms, and $Q_1$ is a group represented by one of Formula 2-1, Formula 2-2, or Formula 2-4:

[Formula 2-1]

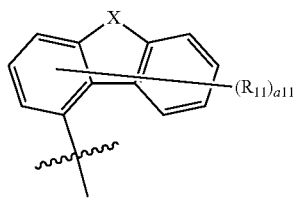

[Formula 2-2]

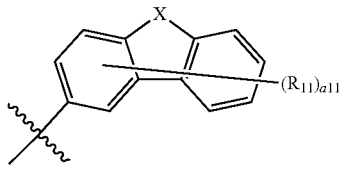

[Formula 2-4]

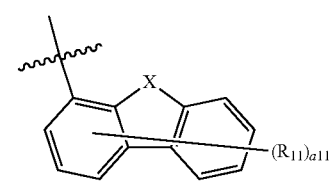

wherein in Formula 2-1, Formula 2-2, and Formula 2-4,

X is O or S, a11 is an integer from 0 to 7, $R_{11}$ is a hydrogen atom, a deuterium atom, or a substituted or unsubstituted phenyl group, and

represents a binding site to a neighboring atom.

10. The amine compound of claim 9, wherein Formula 1 is represented by one of Formula 1-A and Formula 1-B:

[Formula 1-A]

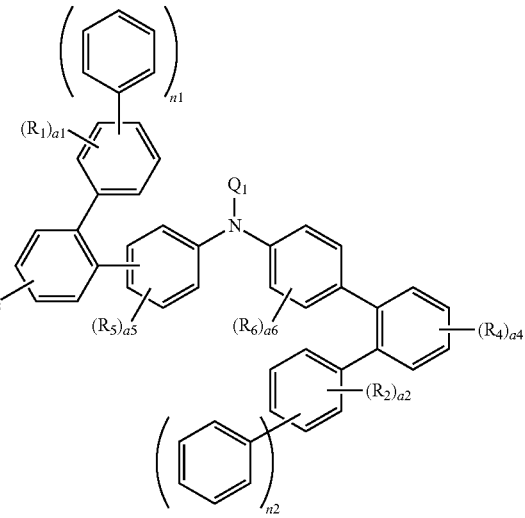

[Formula 1-B]

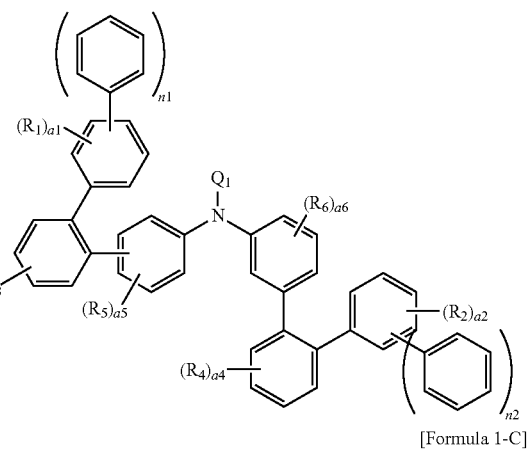

[Formula 1-C]

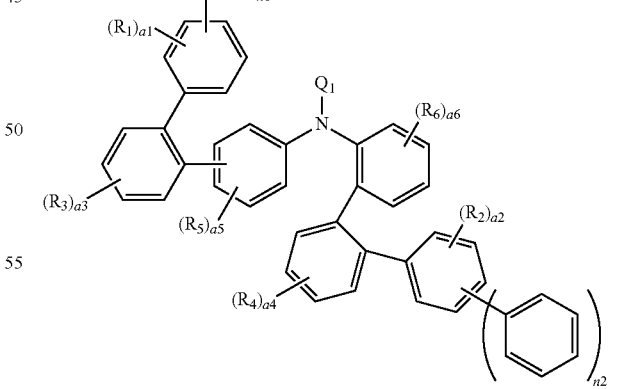

wherein in Formula 1-A and Formula 1-B, a1 to a6, $R_1$ to $R_6$, n1, n2, and $Q_1$ are the same as defined in connection with Formula 1.

11. The amine compound of claim 9, wherein $R_1$ and $R_5$ are each independently a fluorine atom or a methyl group.

12. The amine compound of claim 9, wherein
a11 is 0 or 1, and
$R_{11}$ is a substituted or unsubstituted phenyl group.
13. The amine compound of claim 9, wherein at least one of $R_1$ to $R_3$ is a deuterium atom.
14. The amine compound of claim 9, wherein the amine compound is one selected from Compound Group 1:
[Compound Group 1]
1
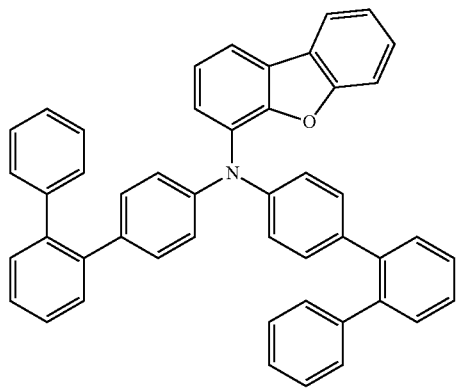
2
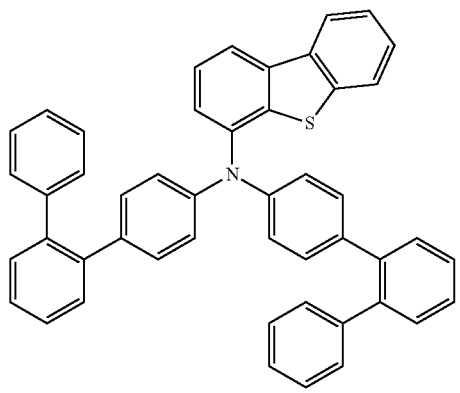
3
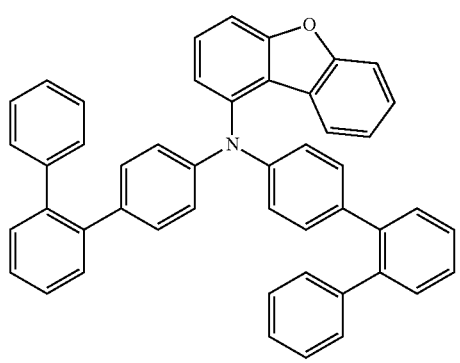
-continued
4
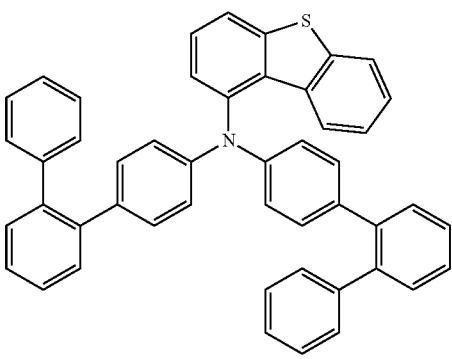
5
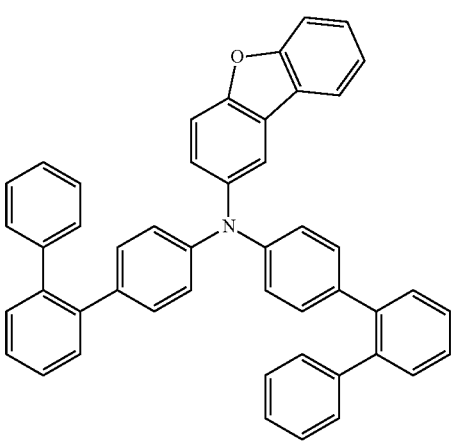
6
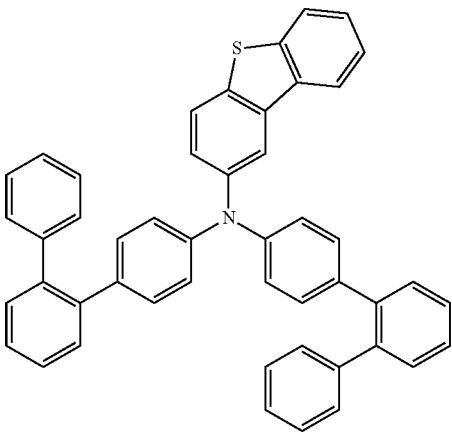

7
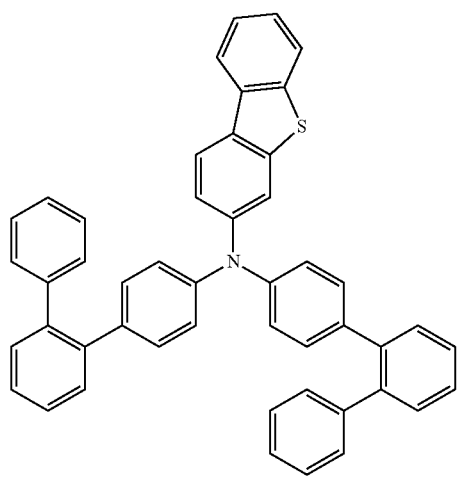
8
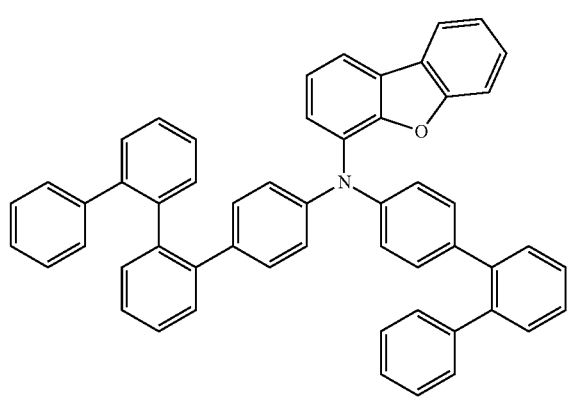
9
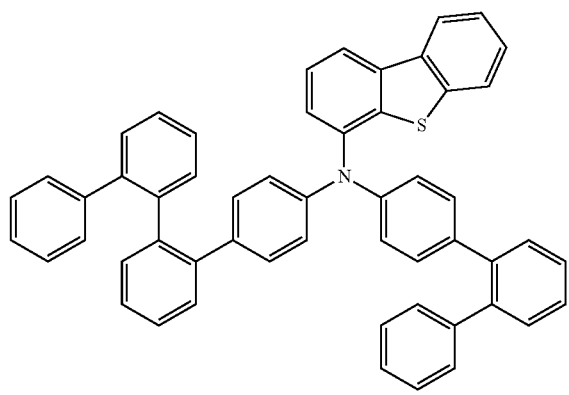
10
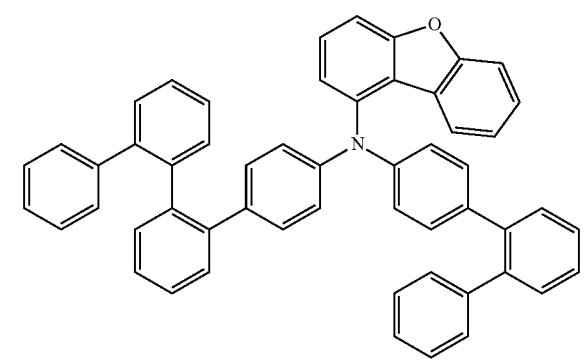
11
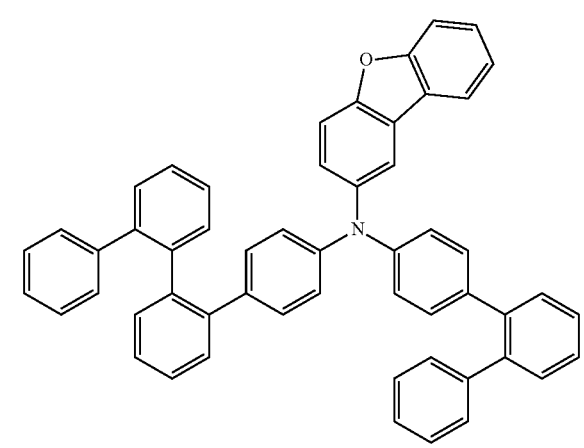
12

13
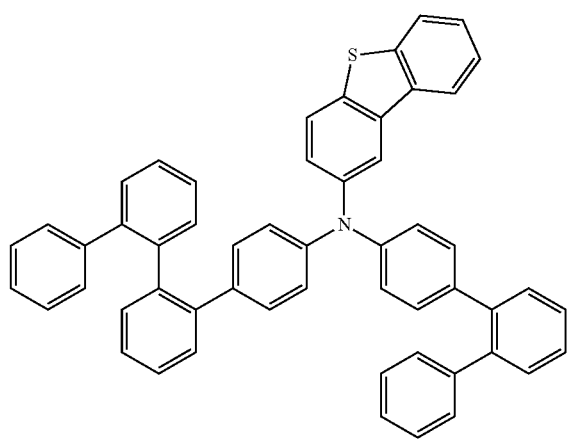
14
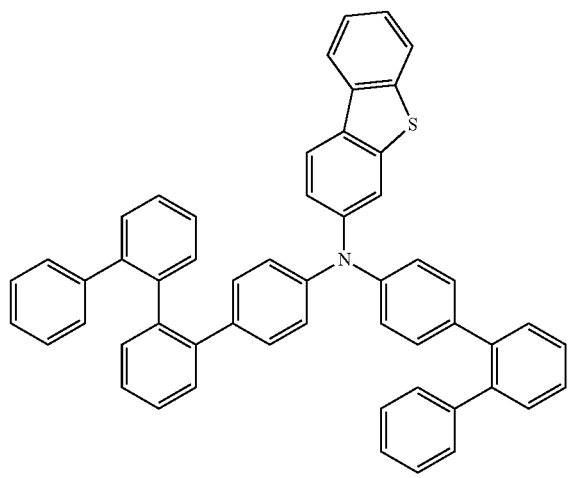
15
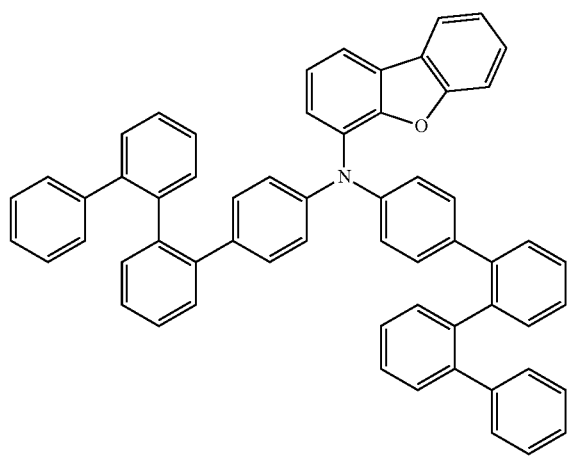
16
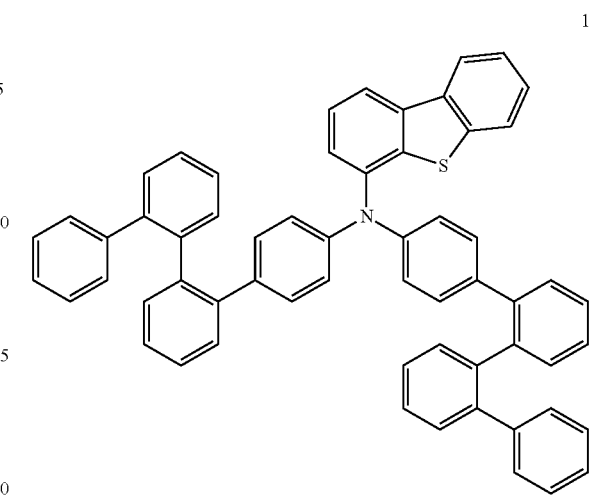
17
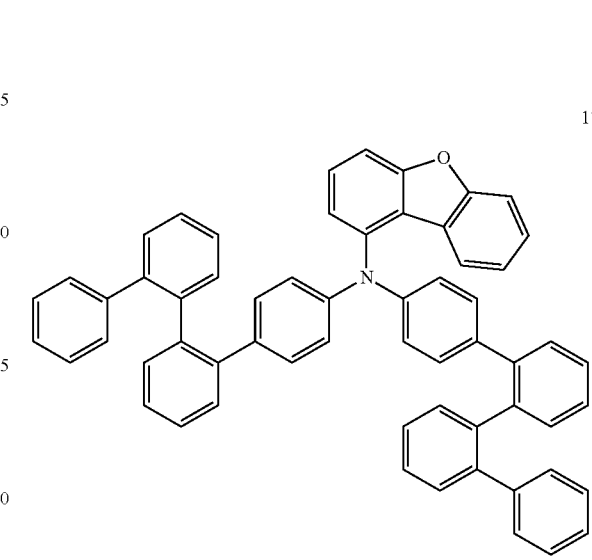
18
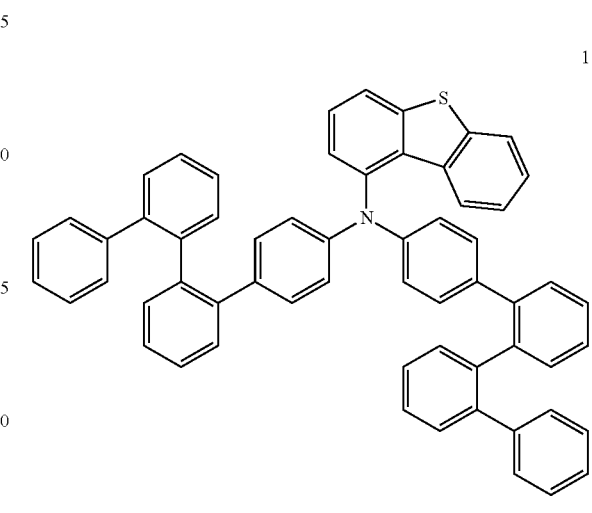

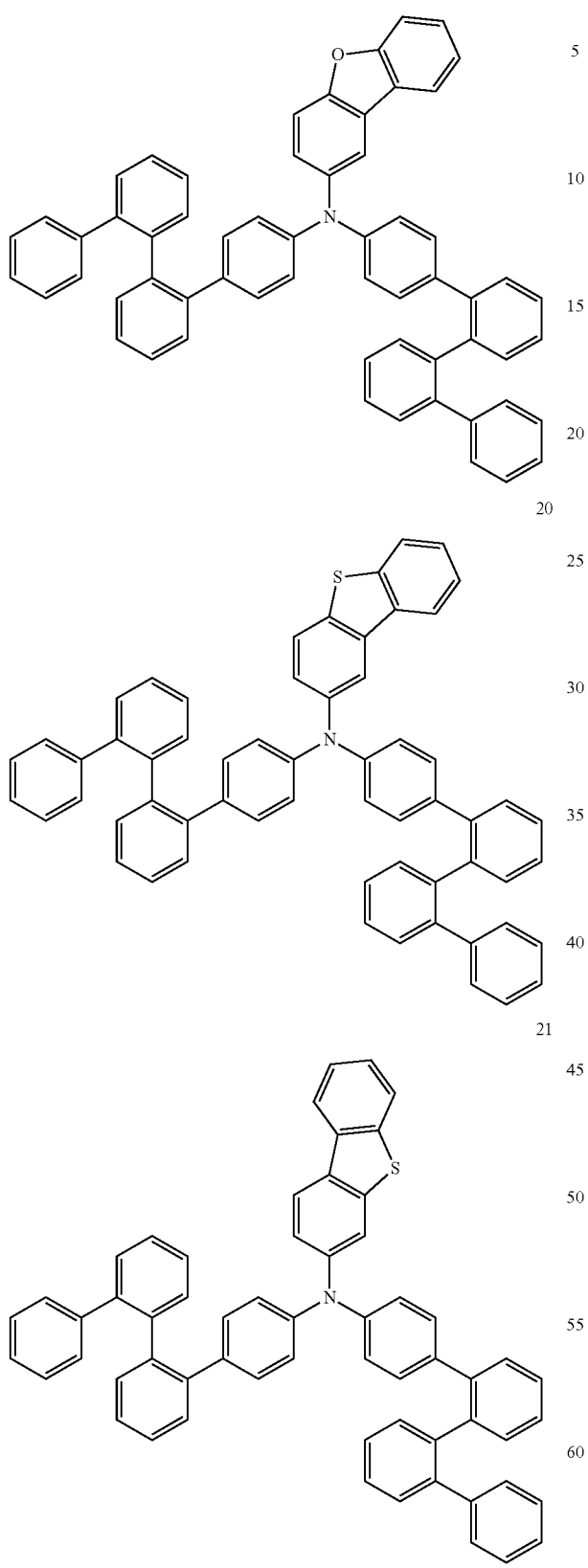
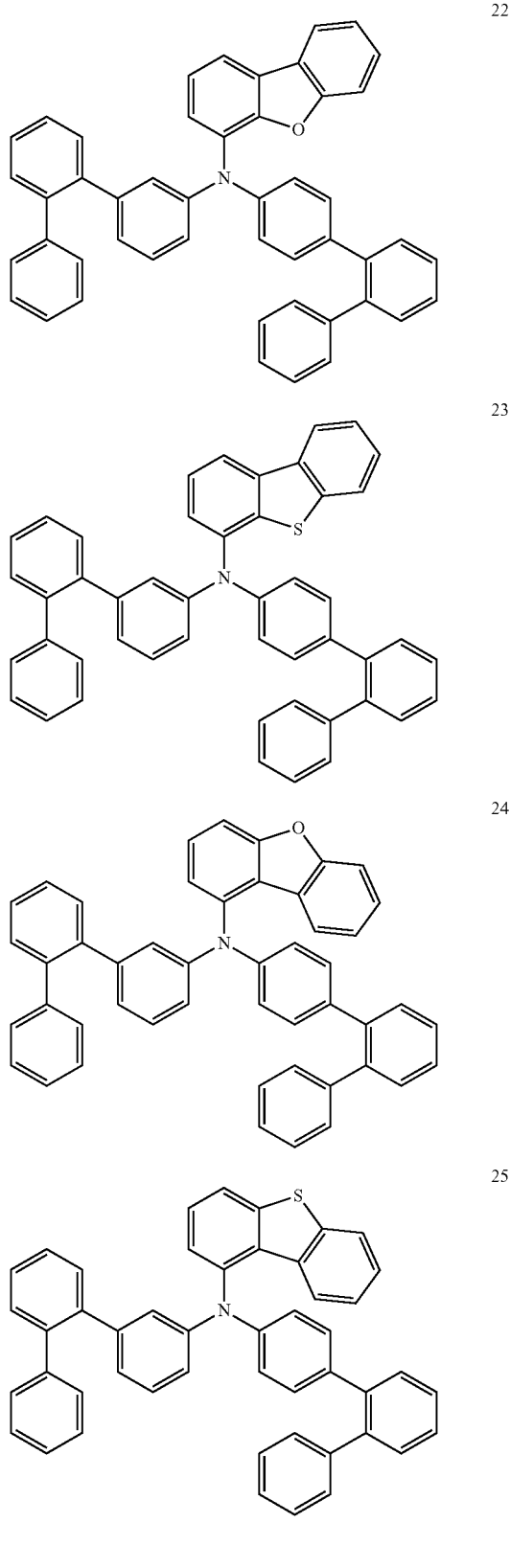

26
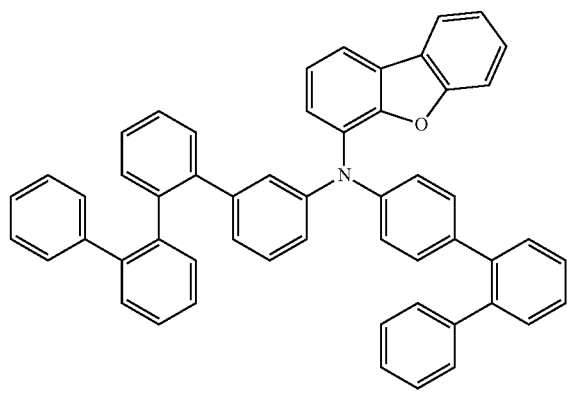
27
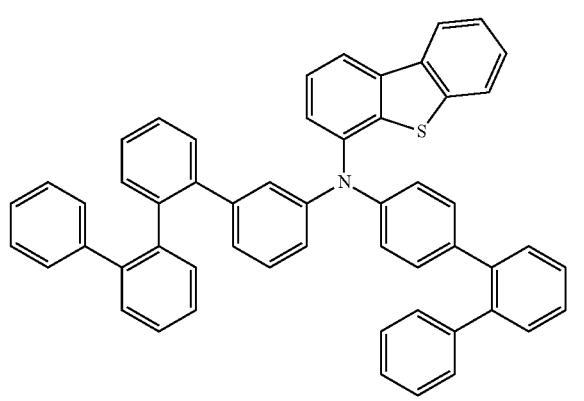
28
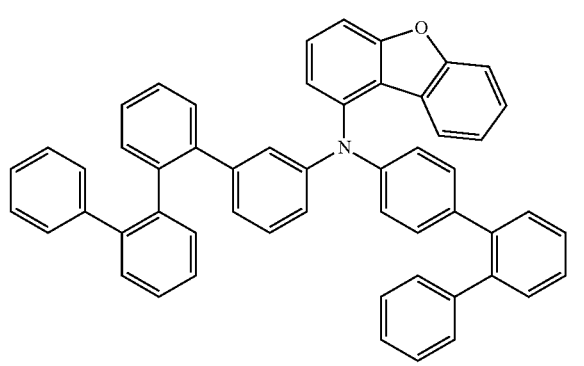
29
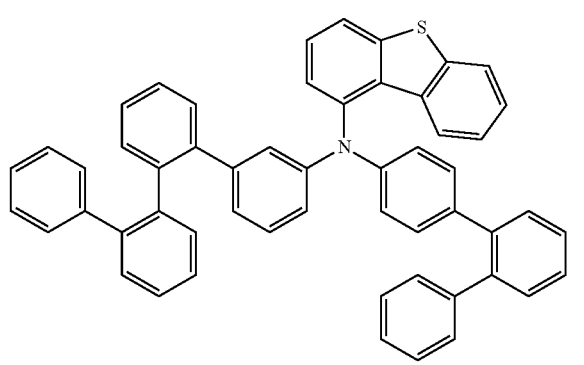
30
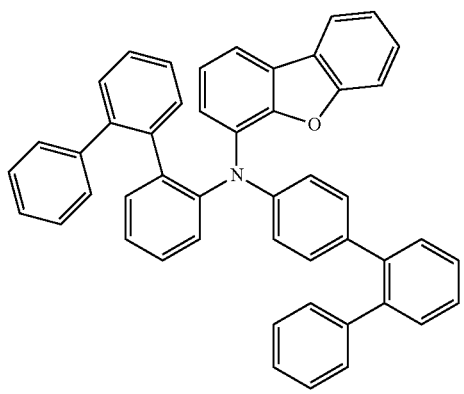
31
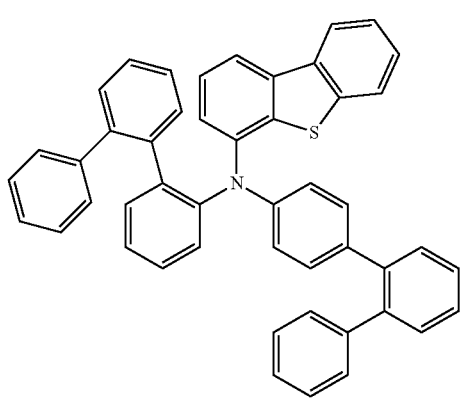
32
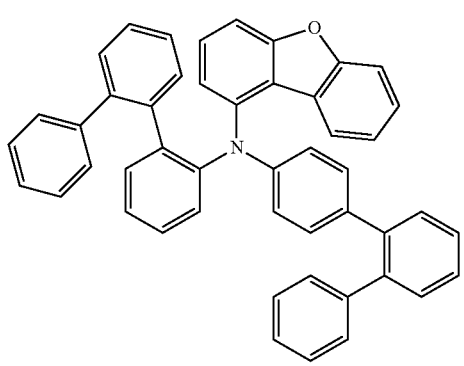
33
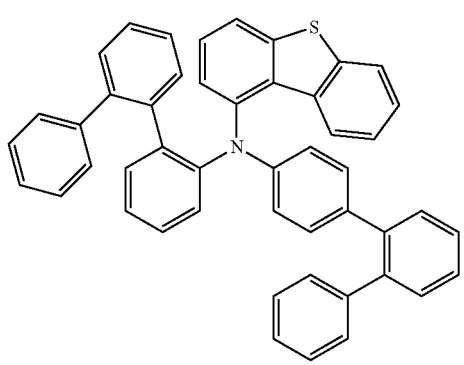

34
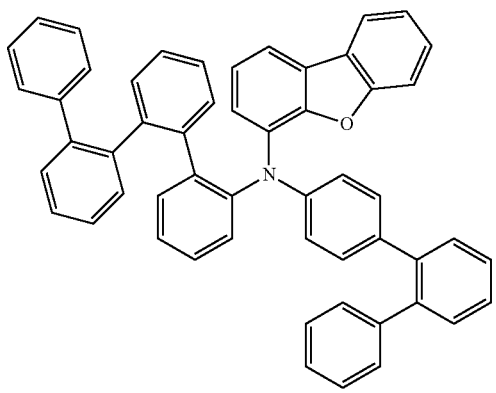
35
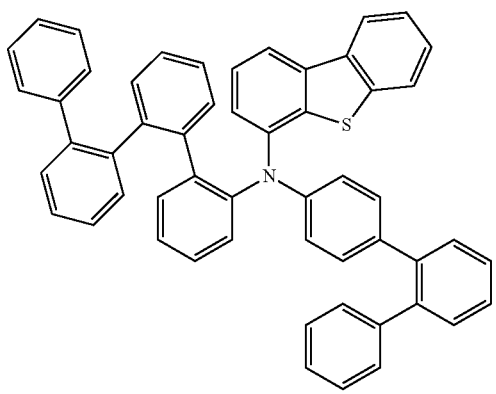
36
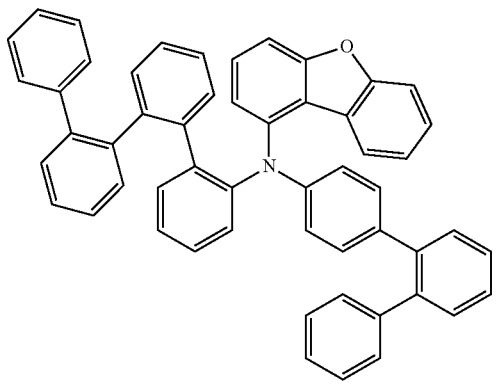
37
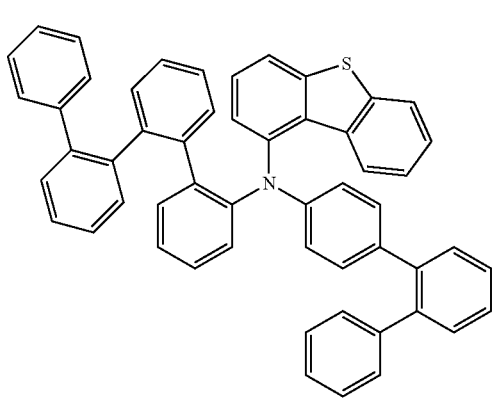
38
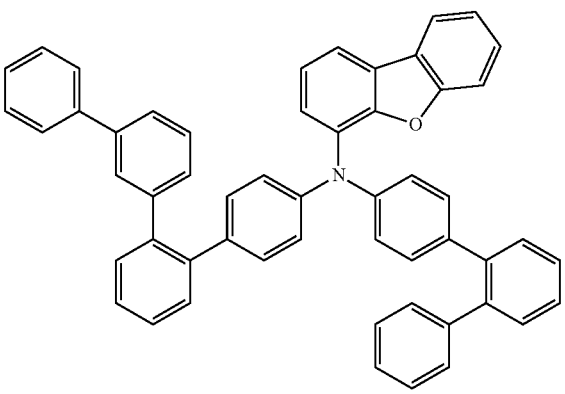
39
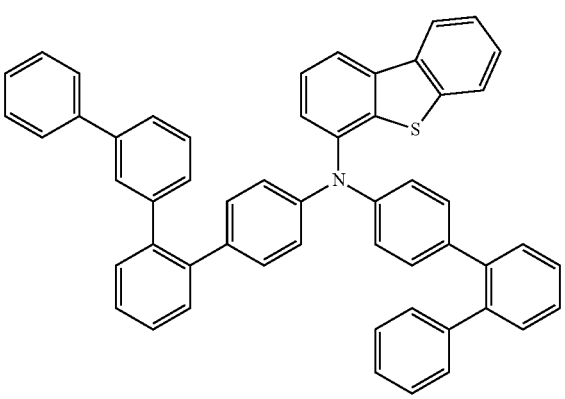
40
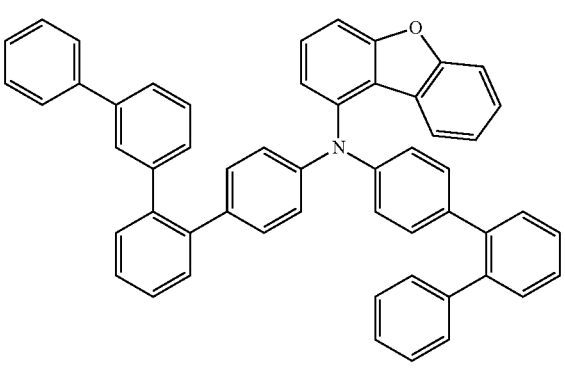
41
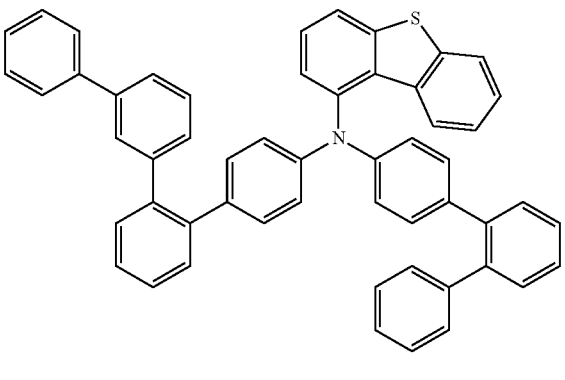

42
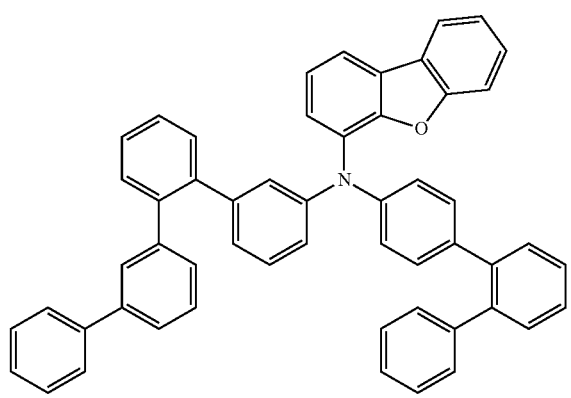
43
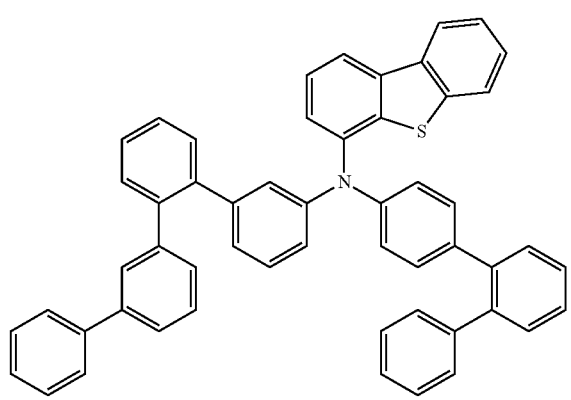
44
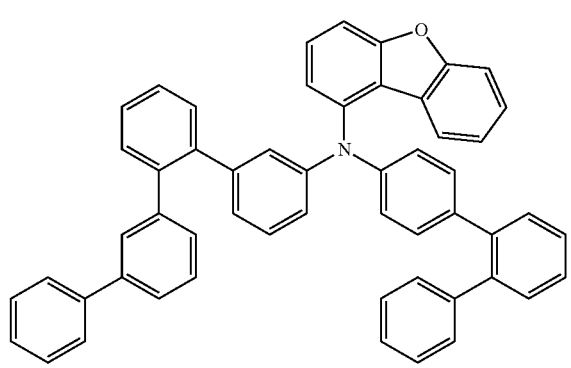
45
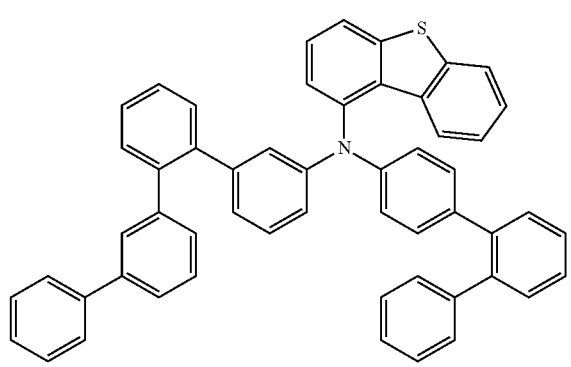
46
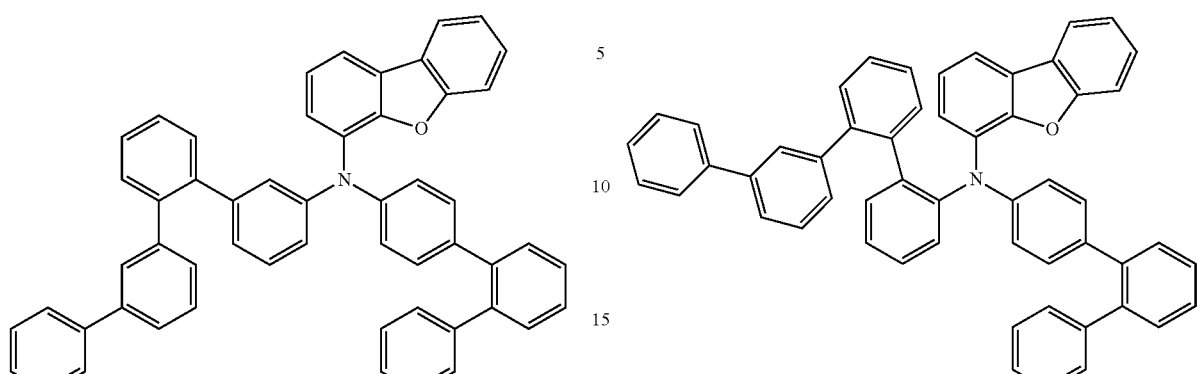
47
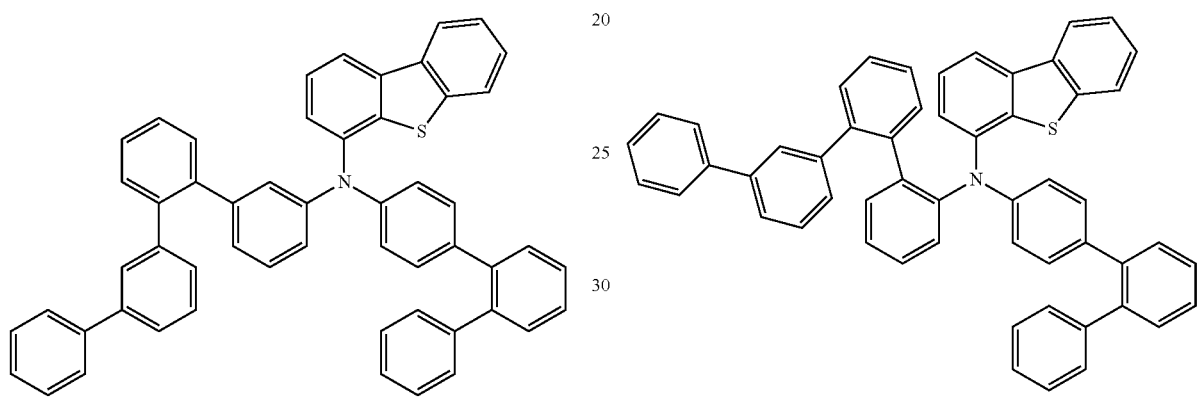
48
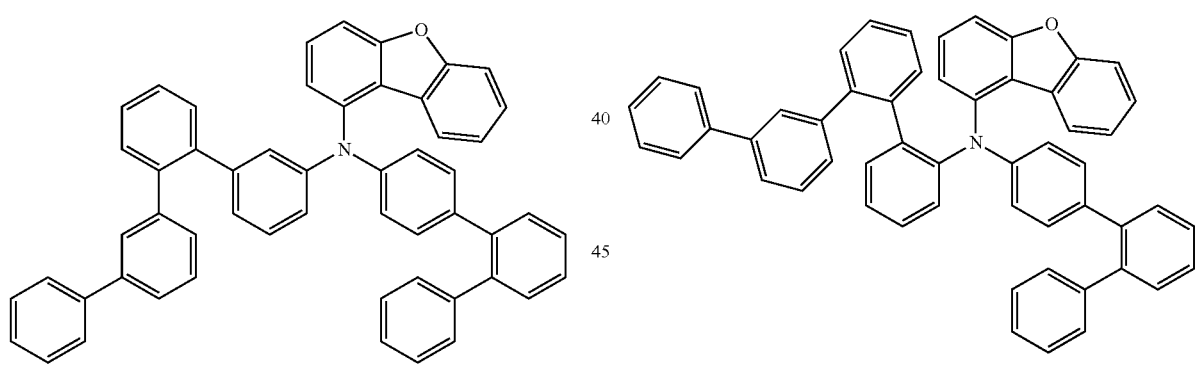
49
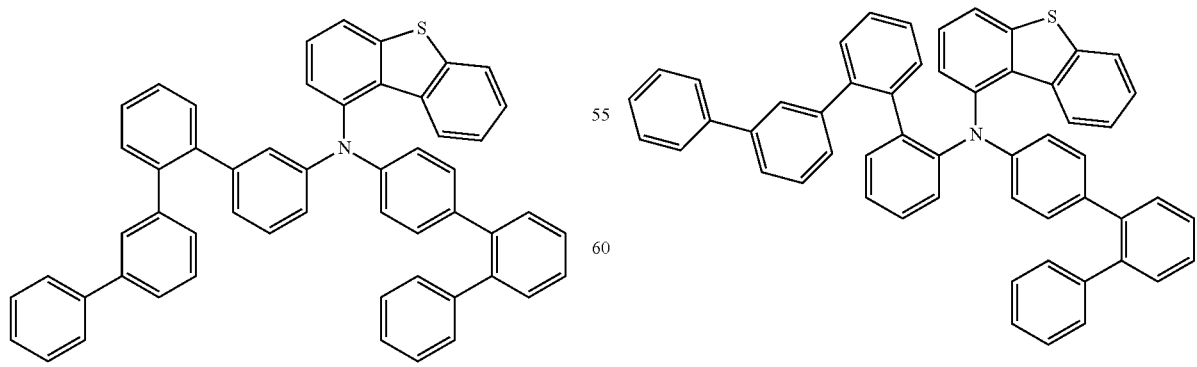

50
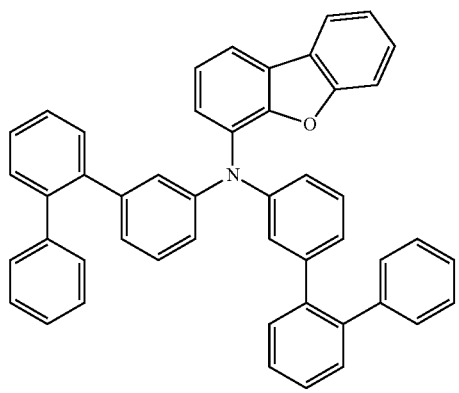
51
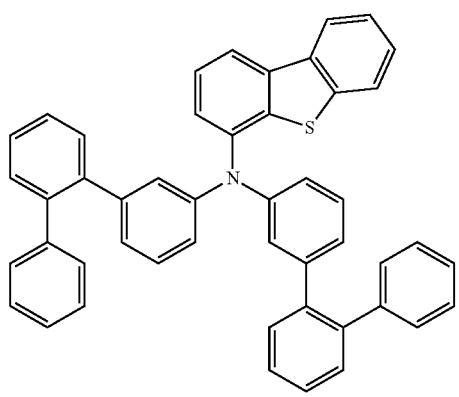
52
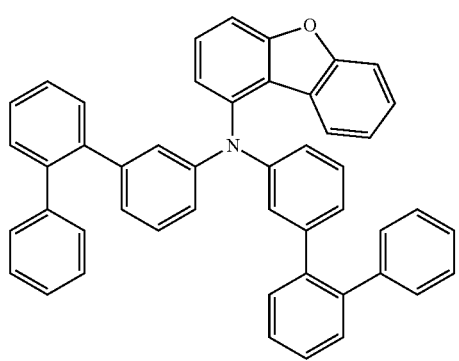
53
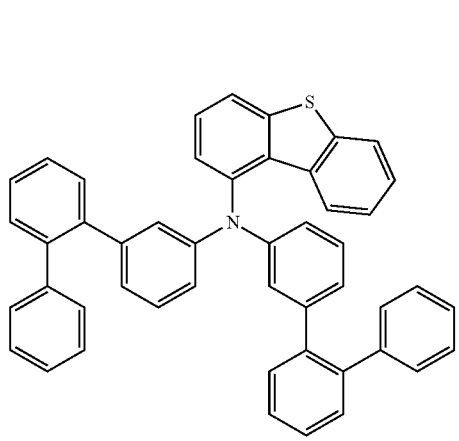
54
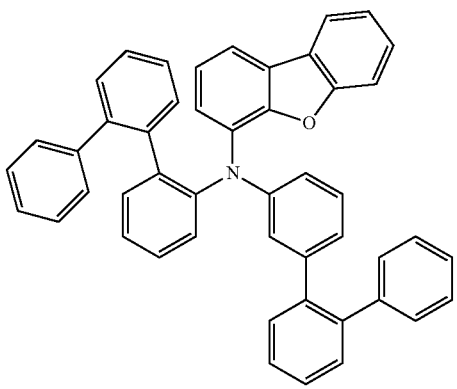
55
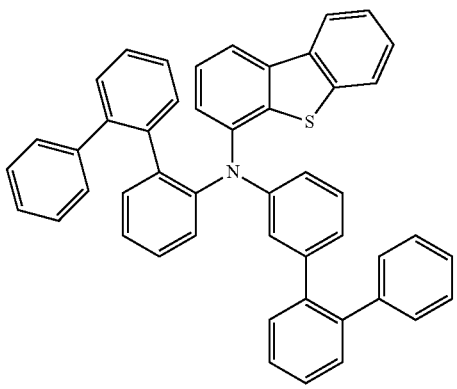
56
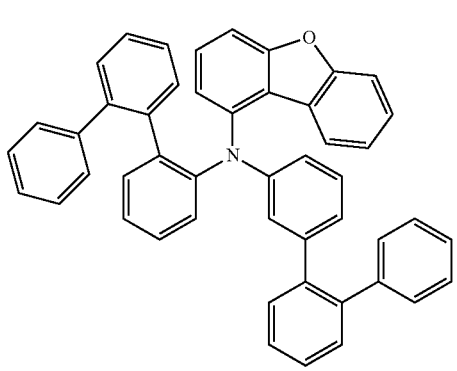
57
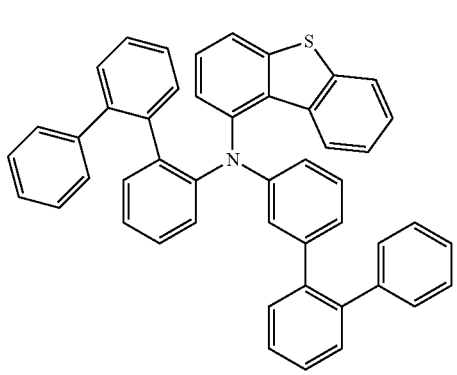

58
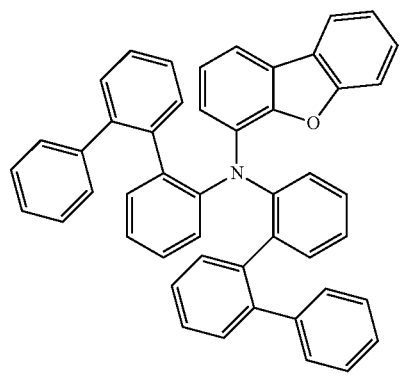
59
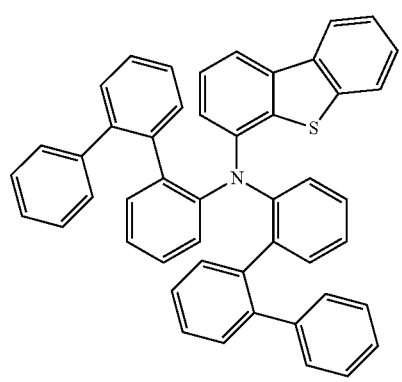
60
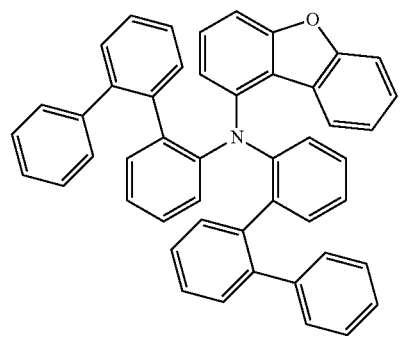
61
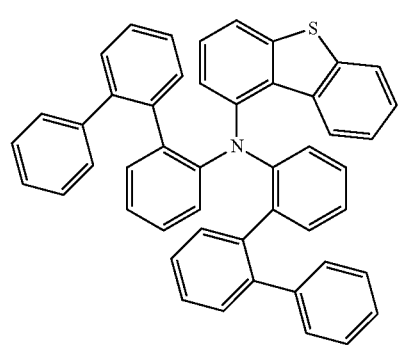
62
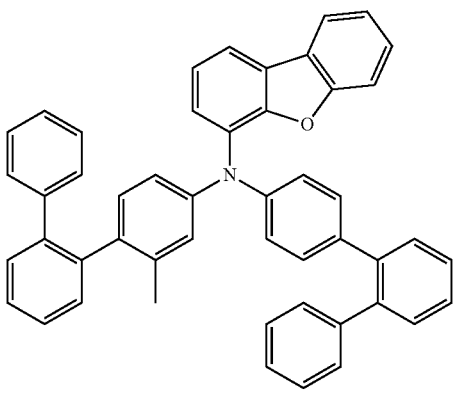
63
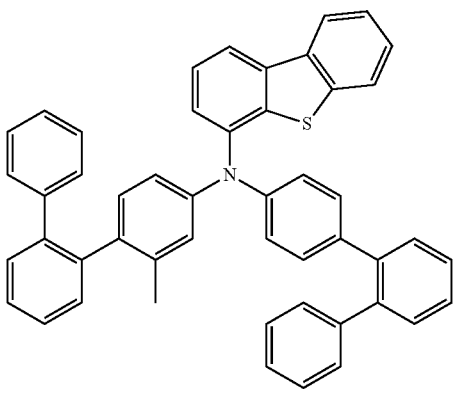
64
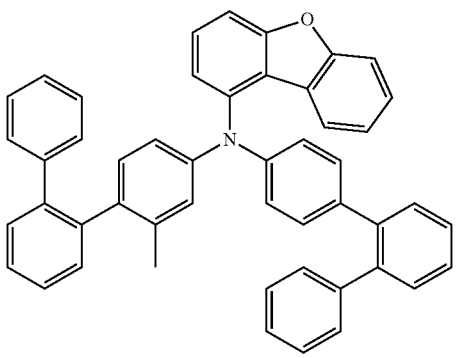
65
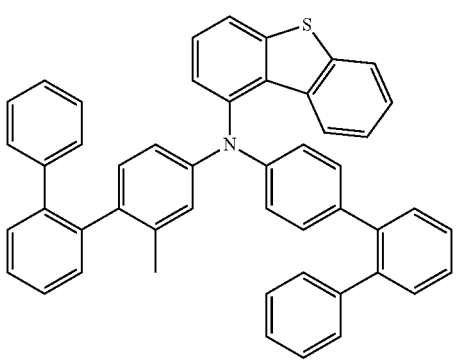

66
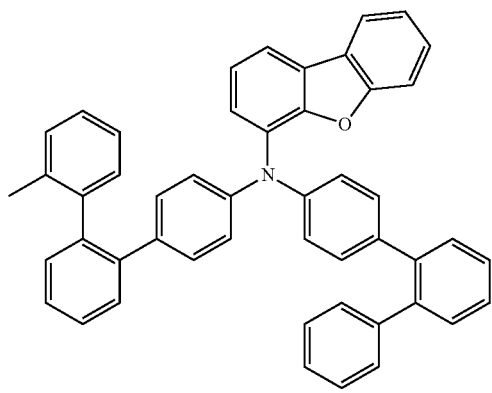
67
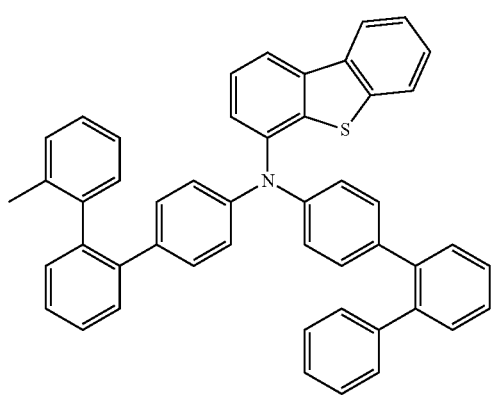
68
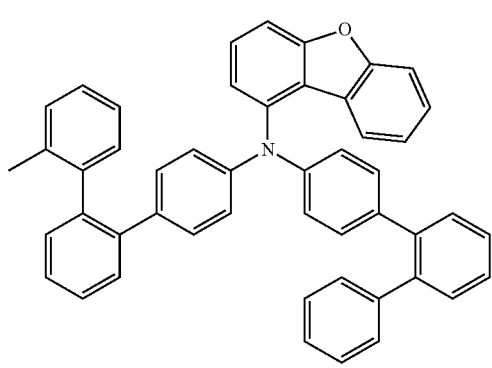
69
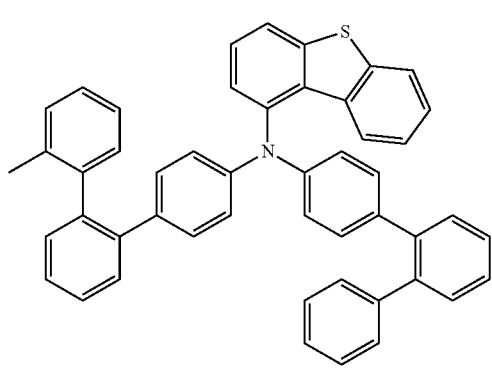
70
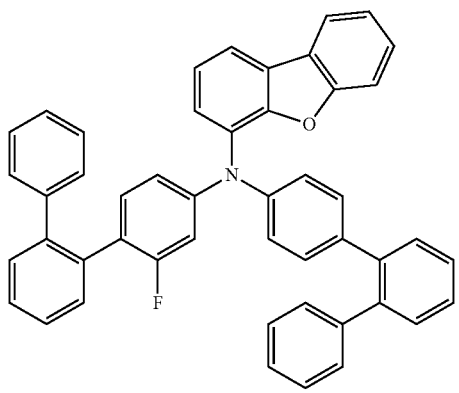
71
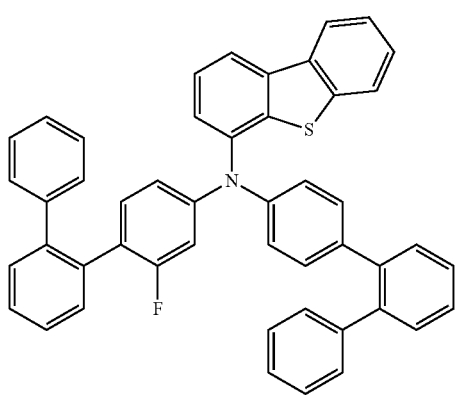
72
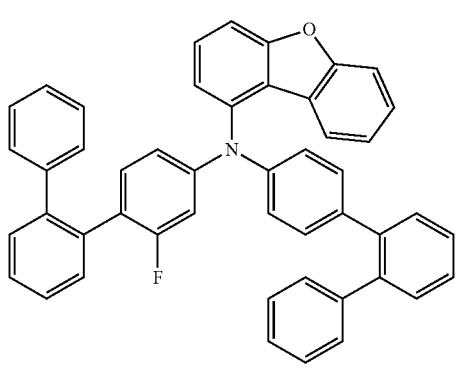
73
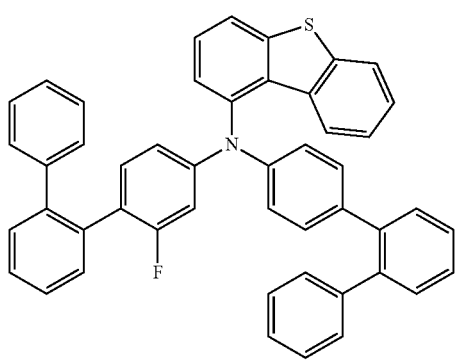

74
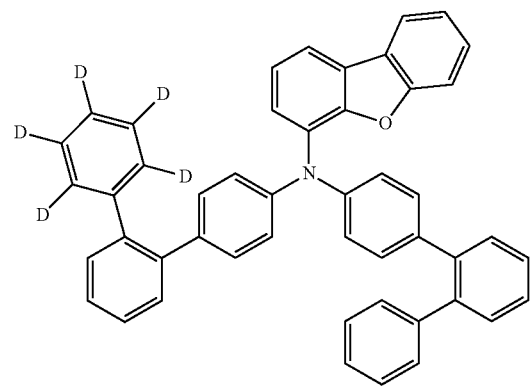
75
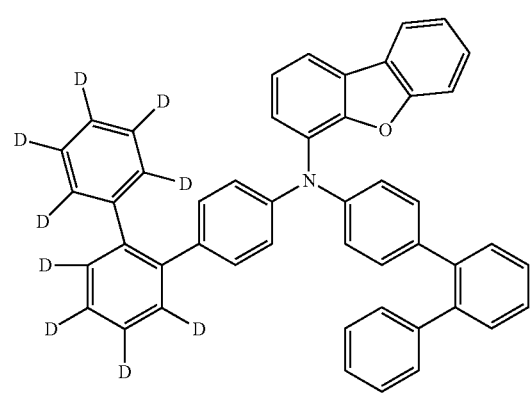
76
77
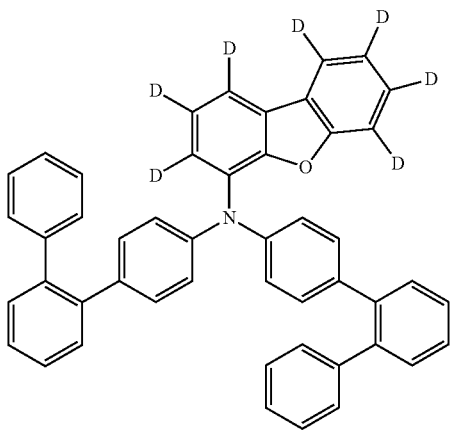
78
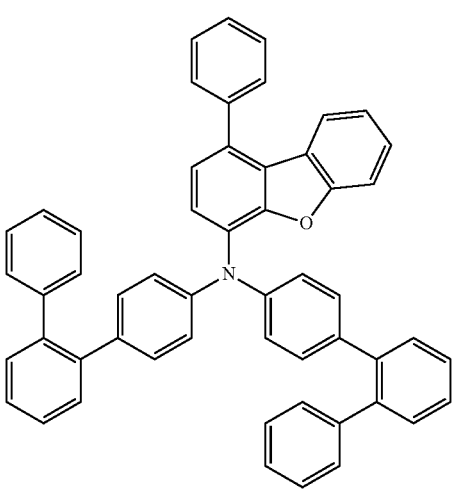
79
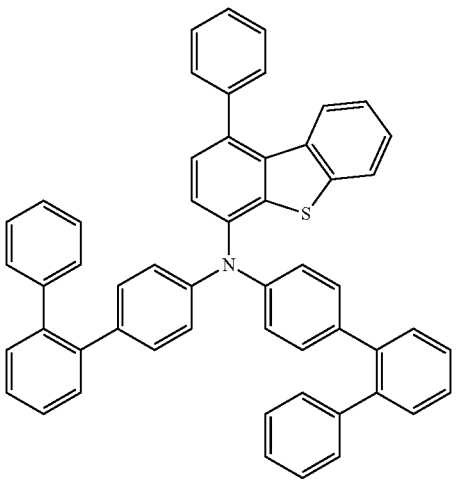

80
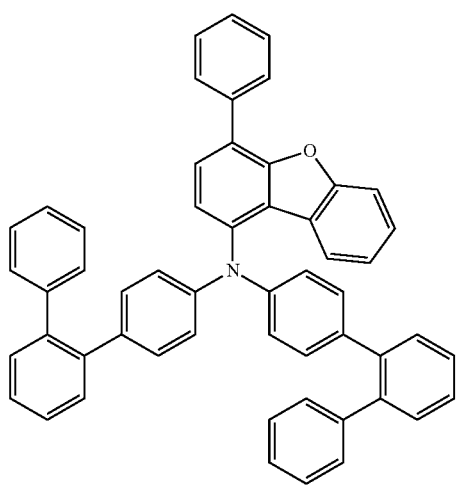
81
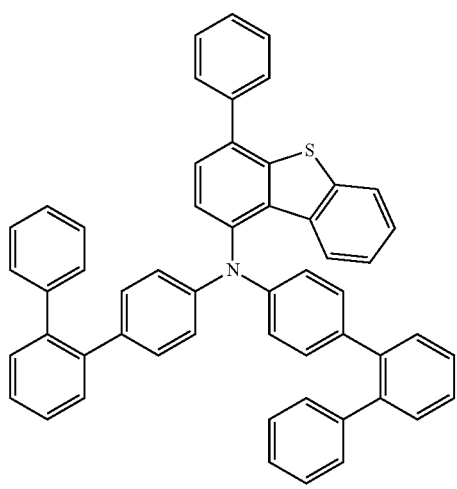
82
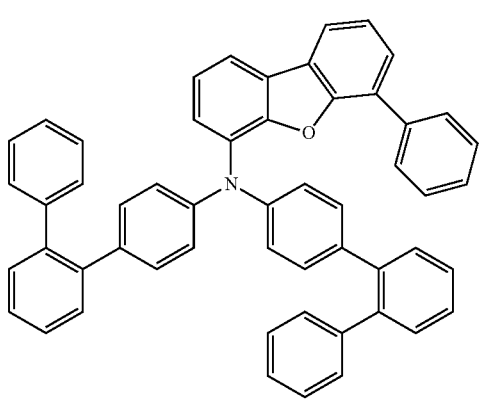
83
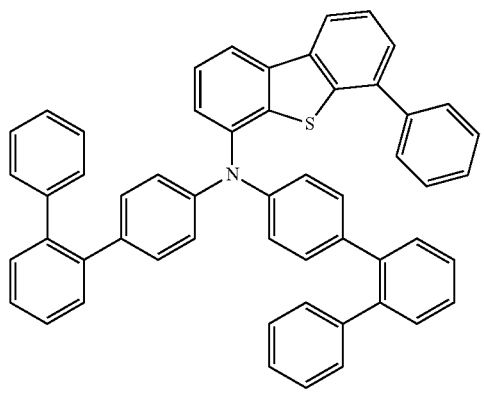
84
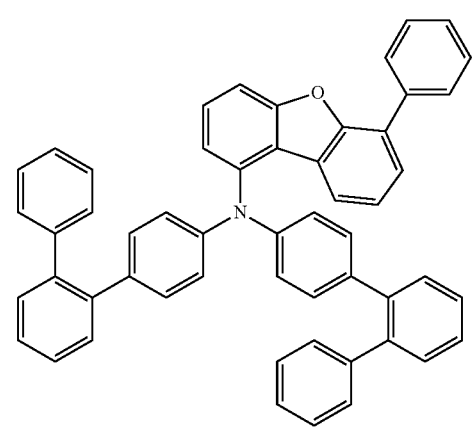
85
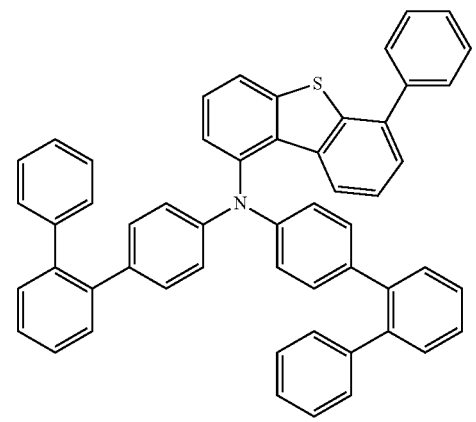

86
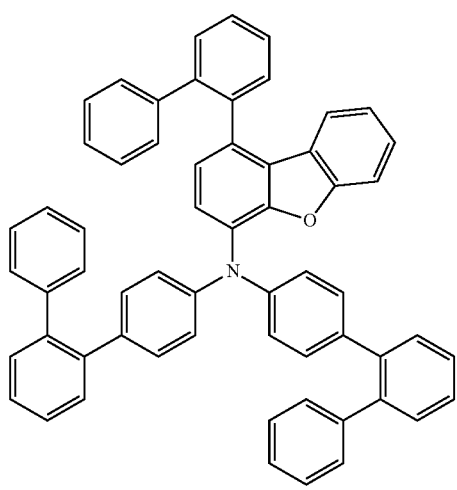
87
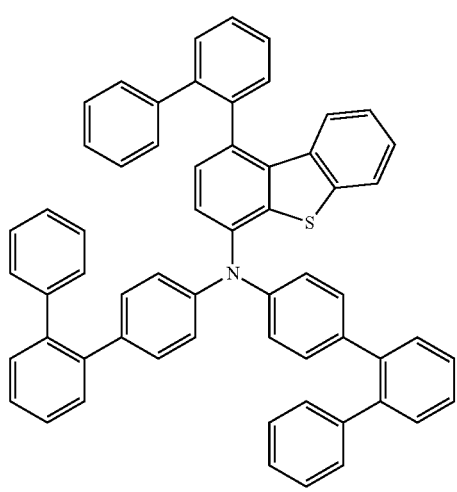
88
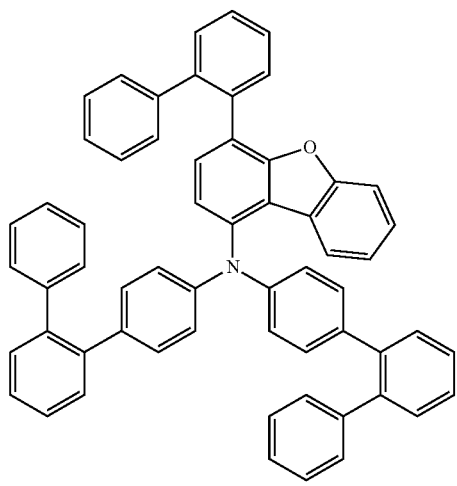
89
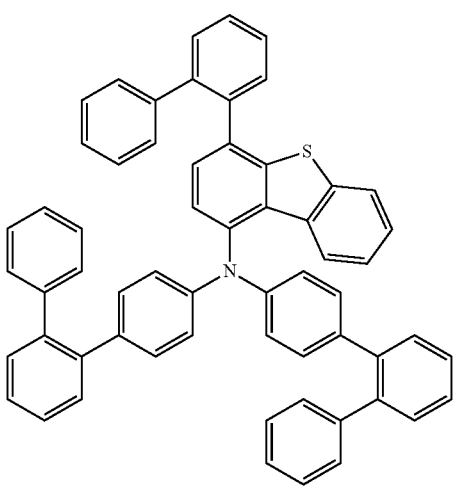
90
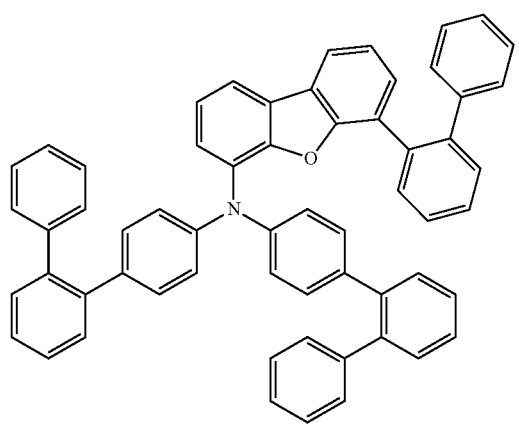
91
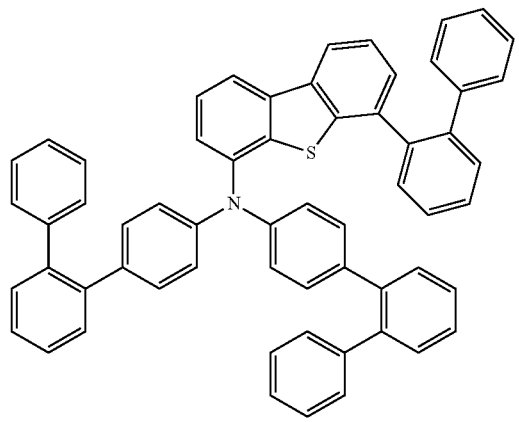

92
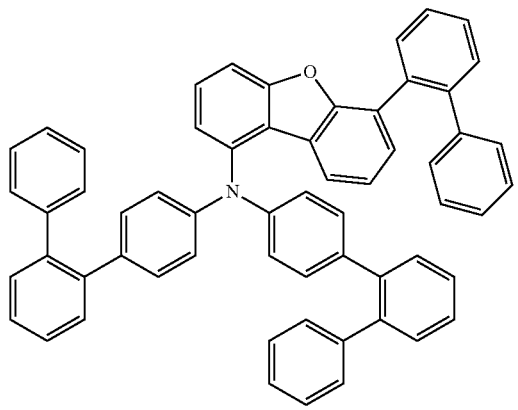
93
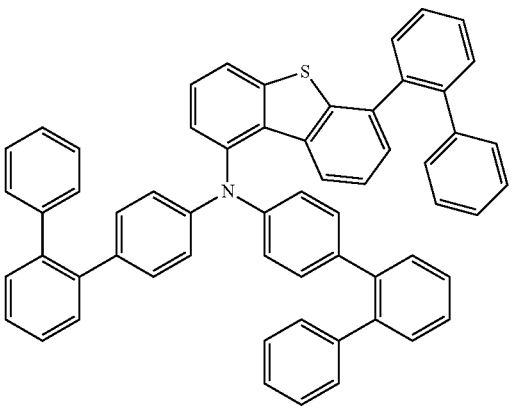
wherein in Compound Group 1, D is a deuterium atom.
* * * * *